US006808973B2

United States Patent
Ootsu et al.

(10) Patent No.: US 6,808,973 B2
(45) Date of Patent: Oct. 26, 2004

(54) MANUFACTURING METHOD OF SEMICONDUCTOR DEVICE

(75) Inventors: Yoshitaka Ootsu, Hyogo (JP); Takayuki Igarashi, Tokyo (JP)

(73) Assignees: Renesas Technology Corp., Tokyo (JP); Ryoden Semiconductor System Engineering Corporation, Itami (JP)

( * ) Notice: Subject to any disclaimer, the term of this patent is extended or adjusted under 35 U.S.C. 154(b) by 0 days.

(21) Appl. No.: 10/265,747

(22) Filed: Oct. 8, 2002

(65) Prior Publication Data
US 2003/0143799 A1 Jul. 31, 2003

(30) Foreign Application Priority Data
Jan. 31, 2002 (JP) ....................... 2002-023372

(51) Int. Cl.[7] ................. H01L 21/8242; H01L 21/8238; H01L 21/8249; H01L 21/8222
(52) U.S. Cl. ................. 438/210; 438/234; 438/239; 438/241; 438/250; 438/253; 438/329; 438/393; 438/396
(58) Field of Search ................. 438/210, 234, 438/238, 239, 241, 250, 253, 329, 381, 393, 396

(56) References Cited

U.S. PATENT DOCUMENTS

| 4,419,812 A | * | 12/1983 | Topich | 438/238 |
| 4,577,390 A | * | 3/1986 | Haken | 438/396 |
| 5,633,181 A | * | 5/1997 | Hayashi | 438/234 |
| 5,726,084 A | * | 3/1998 | Boyd et al. | 438/239 |
| 6,015,732 A | * | 1/2000 | Williamson et al. | 438/253 |
| 6,204,104 B1 | * | 3/2001 | Fujii | 438/234 |
| 6,271,068 B1 | * | 8/2001 | Hsu et al. | 438/203 |

FOREIGN PATENT DOCUMENTS

| JP | 5-90492 | 4/1993 |
| JP | 10-50941 | 2/1998 |
| JP | 2001-185628 | 7/2001 |

* cited by examiner

Primary Examiner—Mary Wilczewski
Assistant Examiner—Toniae M. Thomas
(74) Attorney, Agent, or Firm—Oblon, Spivak, McClelland, Maier & Neustadt, P.C.

(57) ABSTRACT

In a capacitor formation area A1, a capacitor C1 is formed. The capacitor is constituted by a lower-layer electrode-use polysilicon layer 105 (lower-layer electrode) formed on a LOCOS separation film 101, a nitride film 106 (dielectric film) and an upper-layer electrode-use polysilicon layer 107 (upper-layer electrode). In this case, the lower-layer electrode-use polysilicon layer 105 and the nitride film 106 are formed as the same plane pattern. In CMOS formation area A2, an NMOS transistor Q11 is formed on a P-well region 102 and a PMOS transistor Q12 is formed in an N-well region 103. Both of the gate electrodes of NMOS transistor Q11 and NMOS transistor Q21 are formed by the upper-layer electrode-use polysilicon layer 107.

7 Claims, 84 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device having a CMOS structure or a BiCMOS (Bipolar-CMOS) structure in which a capacitor is formed.

2. Description of the Background Art

In manufacturing processes of a semiconductor device having a CMOS or a BiMCOS structure, capacitative elements are often formed therein, and nitride film capacitors and MOS capacitors, which have a nitride film such as an ONO film and an ON film formed into a capacitative structure, are usually used.

However, since the MOS capacitor has the following characteristics, it is difficult to increase its capacitance value per unit area and to improve its voltage dependency.

(1) Since a gate oxide film is used as a dielectric film of a capacitor, the electrical characteristics such as a capacitance value per unit area is determined by the gate oxide film.

(2) The gate oxide film forming a dielectric film is generally made from a thermal oxide film, with the result that its capacitance value per unit area is smaller than that of a nitride film capacitor.

(3) Since a depletion layer extends from a source-drain region, the voltage dependency of the capacitor is extremely strong, and in order to prevent this, a diffusion region having a high concentration of impurities needs to be preliminarily formed, and when the concentration of impurities in the well region becomes too high, it is oxidized at higher speeds, and the capacitance value per unit area becomes smaller.

On the other hand, in the case of the application of a nitride film capacitor, since it is necessary to fabricate a formation layer exclusively used for the capacitor, the number of masks to be used increases, causing an increase in the manufacturing period and manufacturing costs.

SUMMARY OF THE INVENTION

It is an object of the present invention to provide a semiconductor device which makes it possible to increase a capacitance value per unit area while reducing the manufacturing costs to the minimum required and which has a capacitor that is free from voltage dependency, and a manufacturing method thereof.

The present invention is intended for a manufacturing method of a semiconductor device including a capacitor and insulating gate-type transistors formed in a predetermined base substrate. According to the third aspect of the present invention, the method includes the following steps (a) to (e). The step (a) is prepare a predetermined base substrate having a first area for forming a capacitor and a second area for forming an insulating gate type transistor. The step (b) is to successively deposit a lower-layer electrode-use conductive layer and a dielectric-use insulating film on the predetermined base substrate. The step (c) is to pattern the lower-layer electrode-use conductive layer and the dielectric-use insulating film to form a lower-layer electrode and a dielectric film of the capacitor by using a lower-layer electrode-use mask. The step (d), which is performed after the step (c), is to form an upper-layer electrode-use conductive layer on the predetermined substrate including the first and second areas. The step (e) is to perform a patterning process on the upper-layer electrode-use conductive layer by using an upper-layer electrode-use mask to form an upper-layer electrode of the capacitor in the first area and a gate electrode of the insulating gate type transistor in the second area.

Since, at the step (c), the lower-layer electrode-use conductive layer and the dielectric-use insulating film are patterned to form a lower-layer electrode and a dielectric film of the capacitor by using a lower-layer electrode-use mask, it is only necessary to add one sheet of mask of step (c) so as to pattern the lower-layer electrode and the dielectric film in comparison with conventional manufacturing methods of insulating gate-type transistors.

In addition, at step (e) that is independent of step (c), the upper-layer electrode and the gate electrode of the insulating gate-type transistor are simultaneously formed so that, at this step (e), the gate insulating film below the gate electrode is also formed; thus, the dielectric film of the capacitor and the gate insulating film of the insulating gate-type transistor are respectively formed in an independent manner at step (c) and step (e).

Therefore, since the film thickness, film quality and material of the dielectric film can be altered freely, it is possible to set the capacitance value per unit area to a desired value. Moreover, the structure of the above-mentioned capacitor makes it possible to prevent voltage dependency caused in MOS capacitor.

As a result, it becomes possible to obtain a semiconductor device which increases a capacitance value per unit area while reducing the manufacturing costs to the minimum required, and is free from voltage dependency.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Embodiment>

Figure 1:
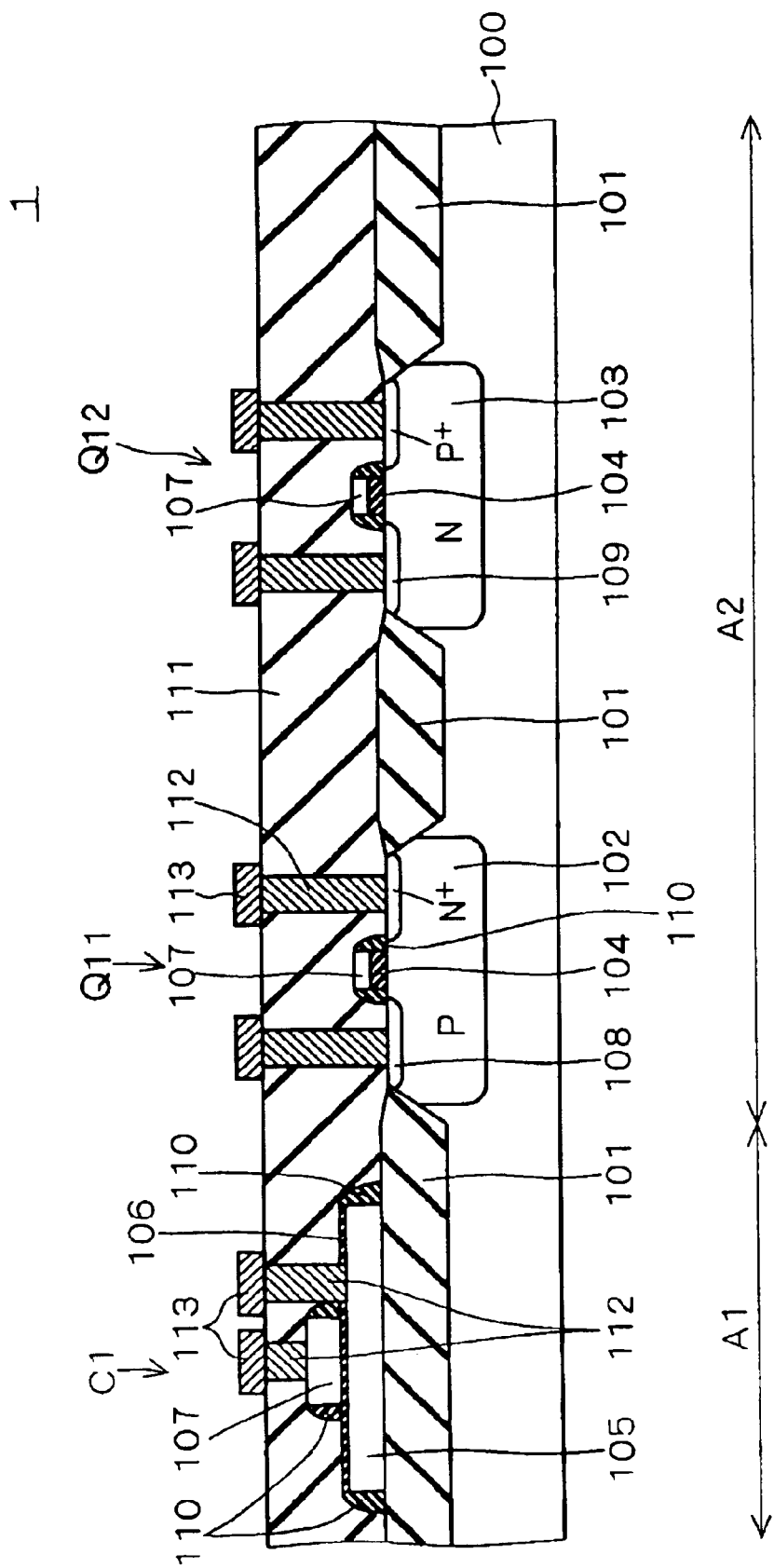
FIG. 1 is a cross-sectional view that shows a structure of a semiconductor device in accordance with a first embodiment of the present invention.

FIG. 1 is a cross-sectional view that shows a structure of a semiconductor device 1 of a CMOS structure having a capacitor formed therein that is the first embodiment of the present invention.

As shown in this Figure, in a semiconductor device 1, a capacitor C1 is fabricated in a capacitor formation area A1, and an NMOS transistor Q11 and a PMOS transistor Q12 are fabricated in a CMOS formation area A2 of a silicon substrate 100(base).

NMOS transistor Q11 and PMOS transistor Q12 are element-separated by a LOCOS separation film 101 formed on an upper layer portion of silicon substrate 100, and capacitor C1, which is formed on LOCOS separation film 101, is element-separated from MOS transistors Q11, Q12 on CMOS formation area A2.

In capacitor formation area A1, capacitor C1 is constituted by a lower-layer electrode-use polysilicon layer 105 (lower layer electrode), a nitride film 106 (dielectric film) and an upper-layer electrode-use polysilicon layer 107 (upper layer electrode) that are formed on LOCOS separation film 101. In this case, lower-layer electrode-use polysilicon layer 105 and nitride film 106 are formed as the same plane pattern. Moreover, a frame-forming TEOS oxide film 110 is formed on side faces of lower-layer electrode-use polysilicon layer 105 and upper-layer electrode-use polysilicon layer 107.

In CMOS formation area A2, NMOS transistor Q11 is formed on a P-well region 102, and PMOS transistor Q12 is formed on an N-well region 103.

An $N^+$ source-drain region 108 is selectively formed within the surface of P-well region 102, and a gate oxide film 104 and upper-layer electrode-use polysilicon layer 107 are formed on the surface of P-well region 102 between $N^+$ source-drain regions 108. Therefore, NMOS transistor Q11, constituted by P-well region 102, $N^+$ source-drain regions 108 and gate oxide film 104, is formed with upper-layer electrode-use polysilicon layer 107 serving as a gate electrode.

Here, $P^+$ source-drain regions 109 are selectively formed within the surface of N-well region 103, and gate oxide film 104 and upper-layer electrode-use polysilicon layer 107 are formed on the surface of N-well region 103 between $P^+$ source-drain regions 109. Therefore, PMOS transistor Q12, constituted by N-well region 103, $P^+$ source-drain regions 109 and gate oxide film 104, is formed with upper-layer electrode-use polysilicon layer 107 serving as a gate electrode.

A contact interlayer insulating film 111 is formed so as to cover the entire surface of silicon substrate 100 including capacitor C1, NMOS transistor Q11 and PMOS transistor Q12.

Here, a tungsten plug 112 is formed in a penetrating manner through contact interlayer insulating film 111 so as to electrically connect to one portion of the surface of upper-layer electrode-use polysilicon layer 107, one portion of the surface of $N^+$ source-drain regions 108 and one portion of the surface of $P^+$ source-drain regions 109 of capacitor C1.

Moreover, tungsten plug 112 is formed in a penetrating manner through contact interlayer insulating film 111 and nitride film 106 so as to electrically connect to one portion of the surface of lower-layer electrode-use polysilicon layer 105 of capacitor C1. Furthermore, aluminum wiring 113 is formed on contact interlayer insulating film 111 in a manner so as to electrically connect to tungsten plug 112.

FIGS. 2 to 10 are cross-sectional views showing a manufacturing method of semiconductor device 1 in accordance with the first embodiment. Referring to these Figures, the following description will discuss the manufacturing method of the first embodiment.

Figure 2:
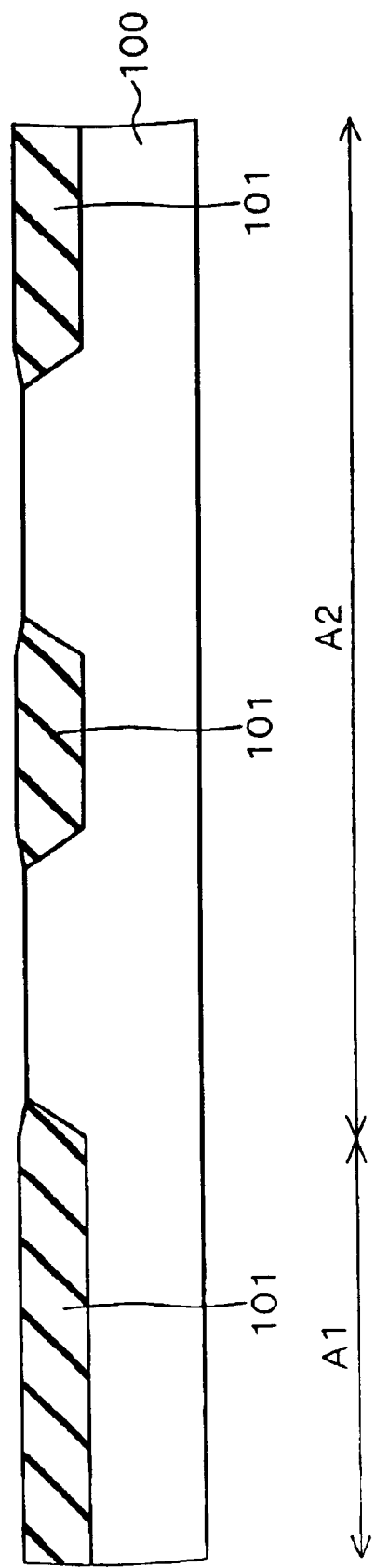
FIGS. 2 to 10 are cross-sectional views that show a manufacturing method of the semiconductor device in accordance with the first embodiment.

First, as shown in FIG. 2, LOCOS separation film 101 is selectively formed on an upper-layer portion of silicon substrate 100.

Figure 3:
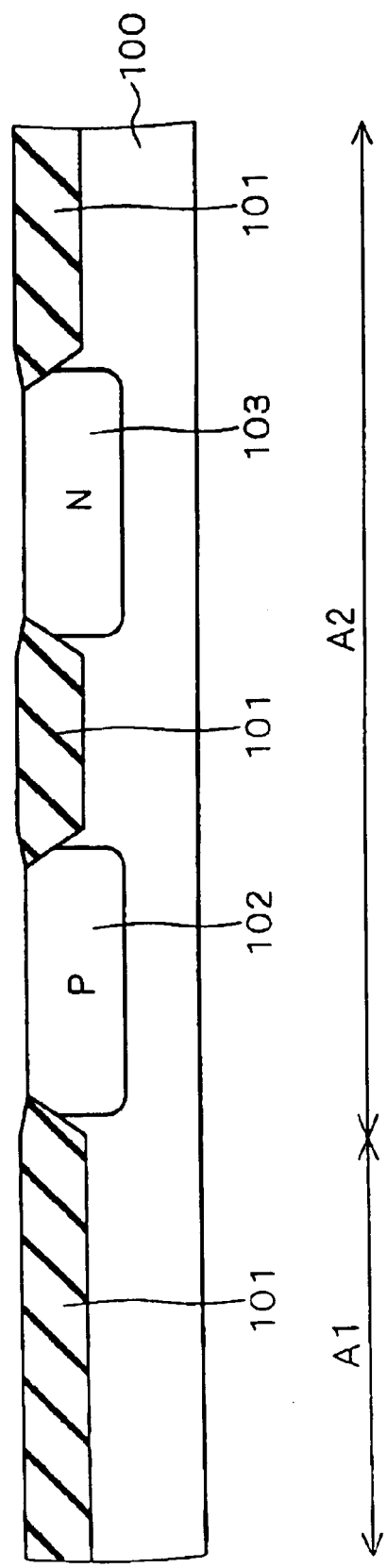

Next, as shown in FIG. 3, P-well region 102 and N-well region 103 are selectively formed on an upper-layer portion of CMOS formation area A2 in silicon substrate 100. In this case, P-well region 102 and N-well region 103 are electrically separated from each other by LOCOS separation film 101 located in between.

Figure 4:
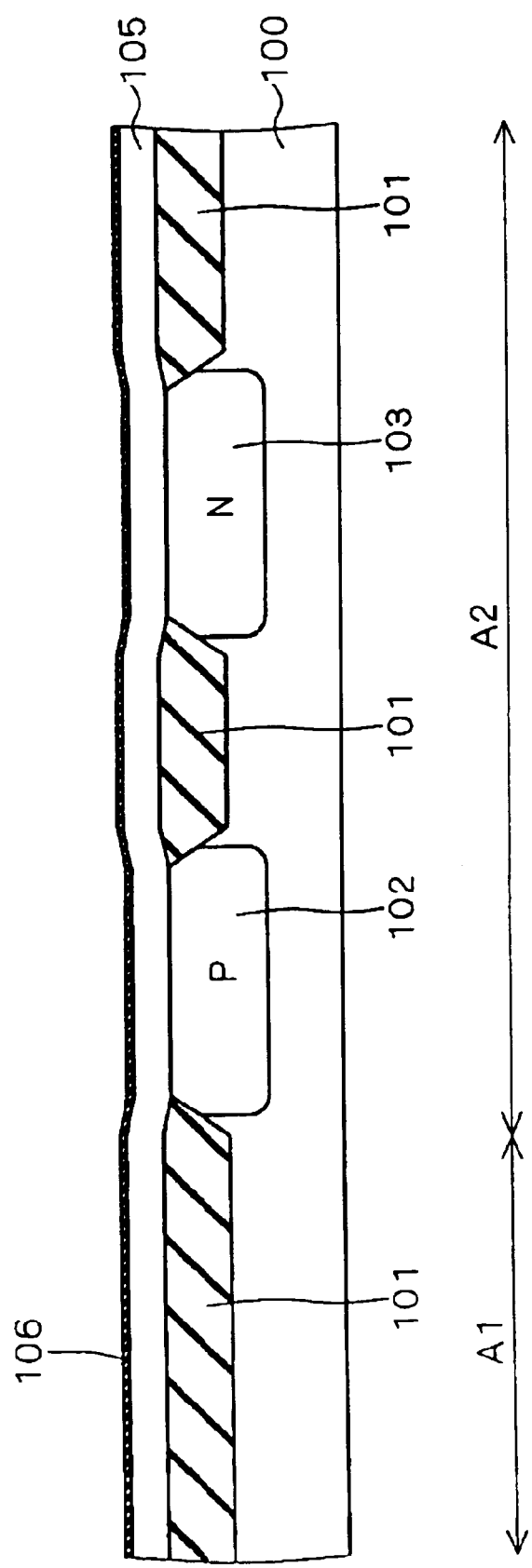

Then, as shown in FIG. 4, lower-layer electrode-use polysilicon layer 105, which has doped polysilicon, is deposited on the entire surface thereof by a CVD method or the like, and nitride film 106, which forms a single-layer dielectric film, is formed on lower-layer electrode-use polysilicon layer 105. Here, lower-layer electrode-use polysilicon layer 105 may be doped through ion injection, or this may be formed by using amorphous silicon in place of doped polysilicon.

Figure 5:
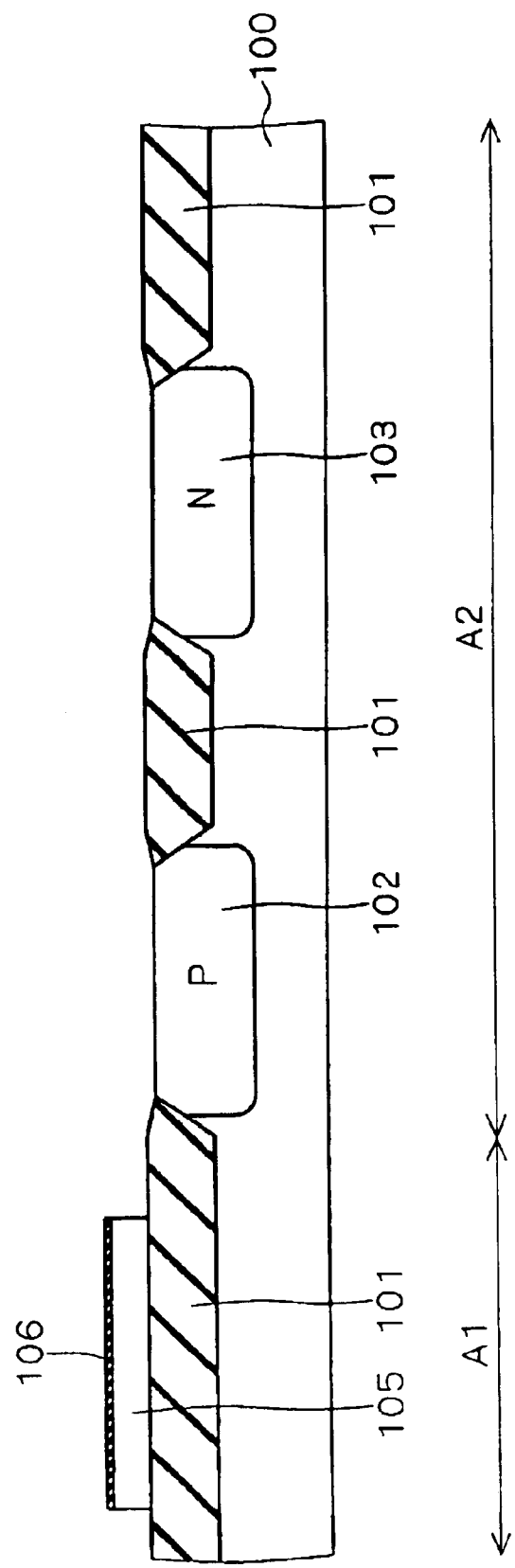

Next, as shown in FIG. 5, lower-layer electrode-use polysilicon layer 105 and nitride film 106 are selectively etched by using a lower-layer electrode-use mask, not shown, so that lower-layer electrode-use polysilicon layer 105 and nitride film 106 are allowed to selectively remain on only the capacitor formation area A1. Consequently, lower-layer electrode-use polysilicon layer 105 and nitride film 106 are formed as the same plane pattern. Lower-layer electrode-use polysilicon layer 105 and nitride film 106, thus patterned, respectively form a lower-layer electrode and a dielectric film of capacitor C1.

Figure 6:
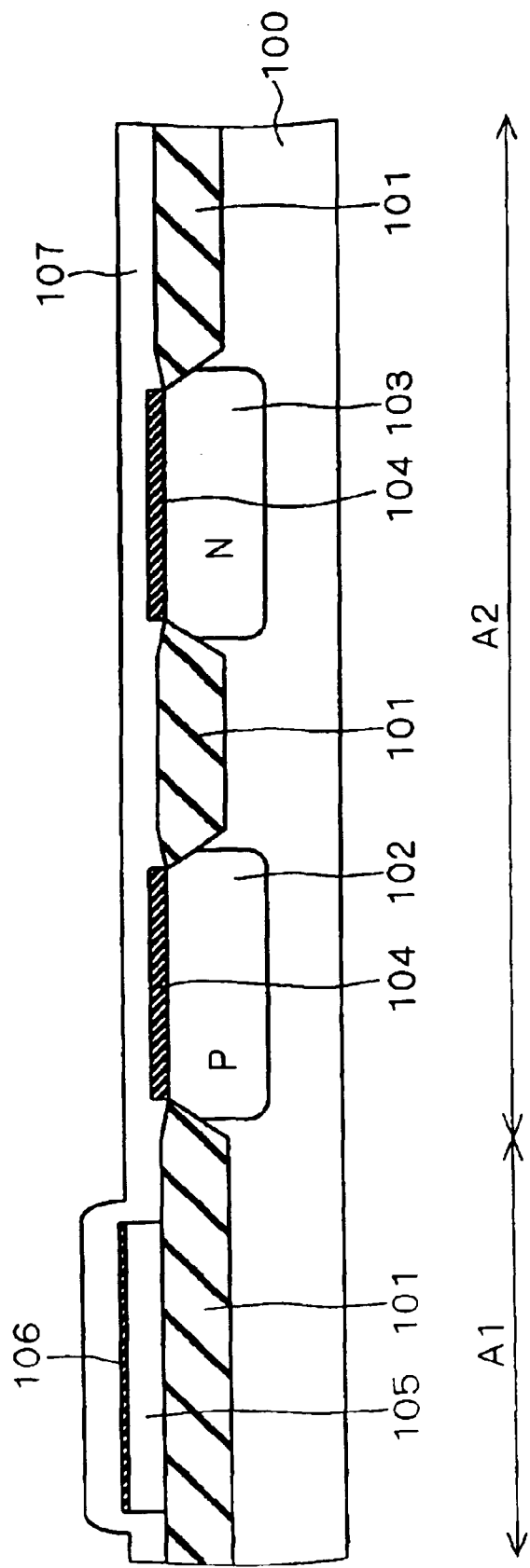

Successively, as shown in FIG. 6, gate oxide films 104 are respectively formed on P-well region 102 and N-well region 103, and upper-layer electrode-use polysilicon layer 107 having doped polysilicon is then deposited on the entire surface thereof by a CVD method or the like. Here, upper-layer electrode-use polysilicon layer 107 may be doped through ion injection, or this may be formed by using amorphous silicon in place of doped polysilicon.

Figure 7:
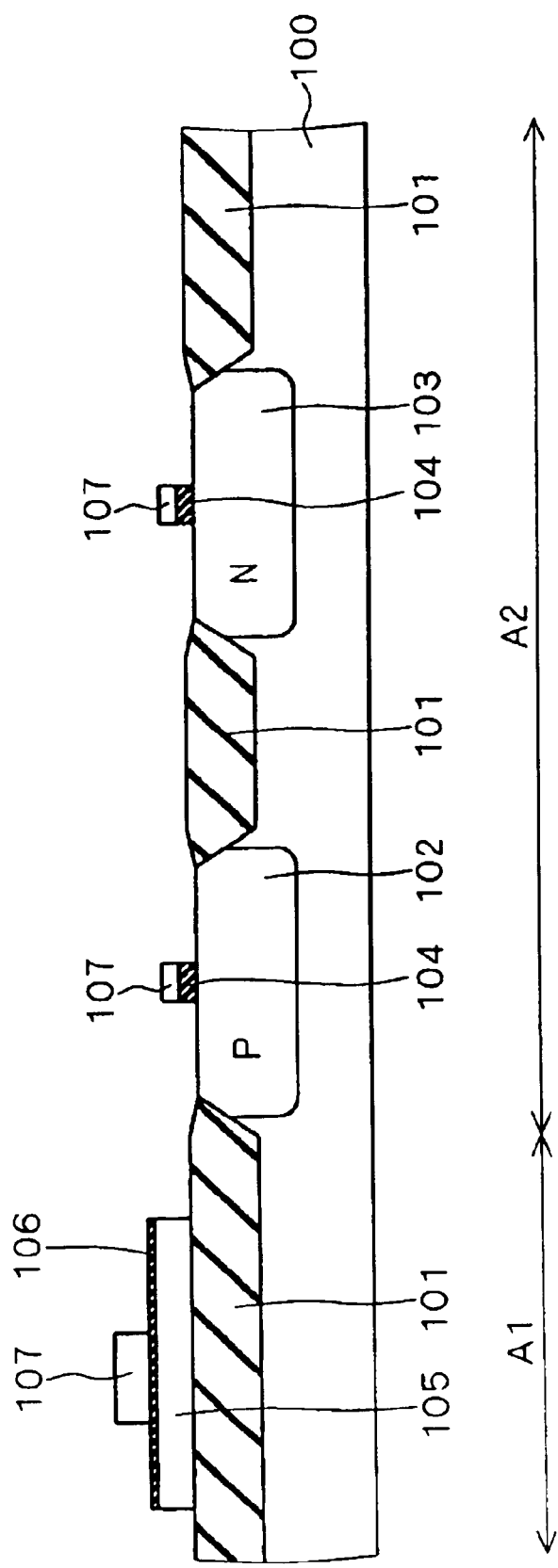

Further, as shown in FIG. 7, by using a mask used for commonly forming an upper-layer electrode and a gate electrode, not shown, upper-layer electrode-use polysilicon layer 107 and gate oxide film 104 (formed on only CMOS formation area A2) are selectively etched so that upper-layer electrode-use polysilicon 107 is patterned on one portion of nitride film 106 of capacitor formation area A1 and a gate oxide film and upper-layer electrode-use polysilicon layer 107 of CMOS formation area A2 are patterned.

As a result, an upper-layer electrode of capacitor C1 consisting of upper-layer electrode-use polysilicon layer 107 and gate electrodes of NMOS transistor Q11 and PMOS transistor Q12 consisting of upper-layer electrode-use polysilicon layer 107 are simultaneously obtained.

Figure 8:
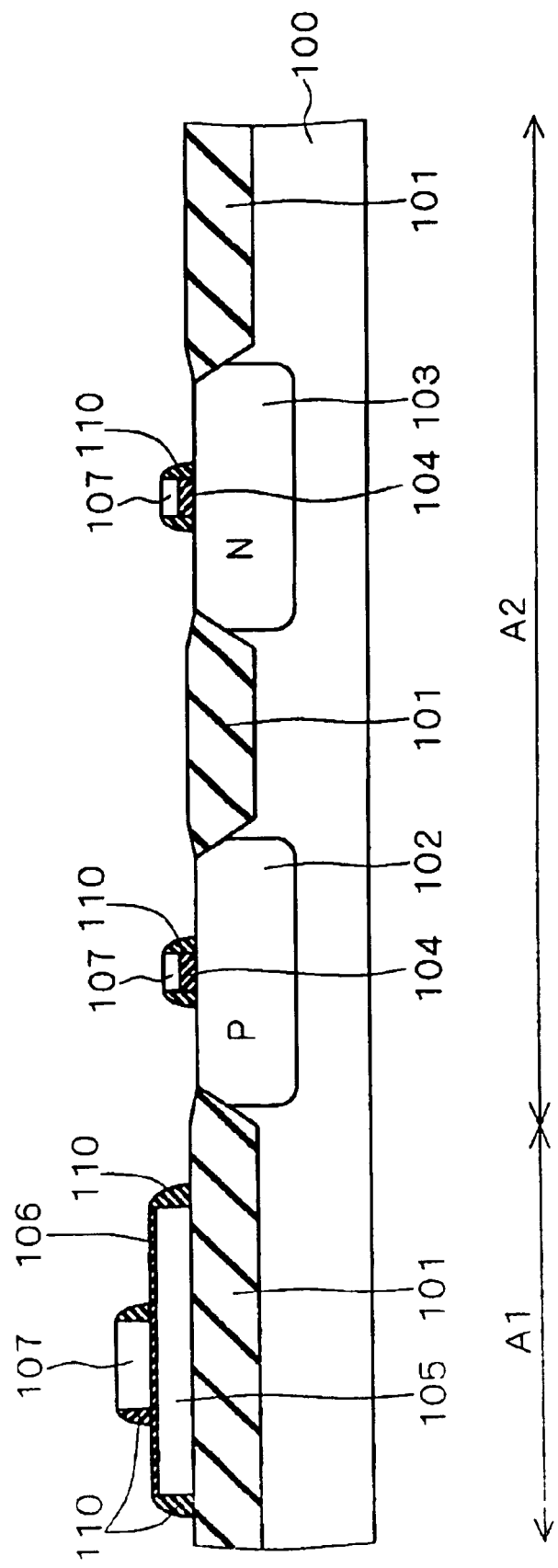

Next, as shown in FIG. 8, after depositing frame-forming TEOS oxide film 110 on the entire surface, the entire surface is subjected to an etch back process so that frame-forming TEOS oxide film 110 are allowed to remain as side walls on side faces of lower-layer electrode-use polysilicon layer 105 and upper-layer electrode-use polysilicon layer 107 of capacitor formation area A1 and side faces of gate oxide film 104 and upper-layer electrode-use polysilicon layer 107 of CMOS formation area A2. Here, before the formation of the side walls, a diffusion region for source-drain regions may be formed.

Figure 9:
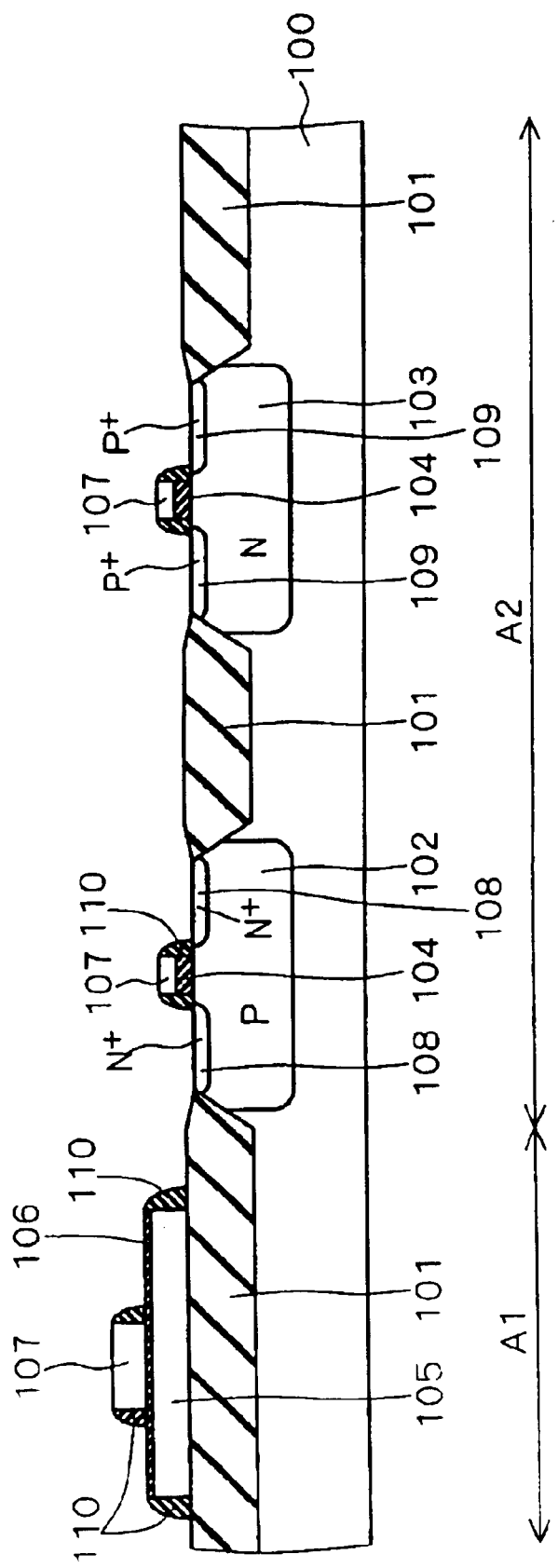

Successively, as shown in FIG. 9, impurities of N-type and P-type are injected to the respective P-well region 102 and N-well region 103 by using upper-layer electrode-use polysilicon layer 107 and frame-forming TEOS oxide film 110 formed on the side faces thereof as masks so that $N^+$ source-drain regions 108 and $P^+$ source-drain region 109 are respectively formed within the surfaces of P-well region 102 and N-well region 103.

Figure 10:
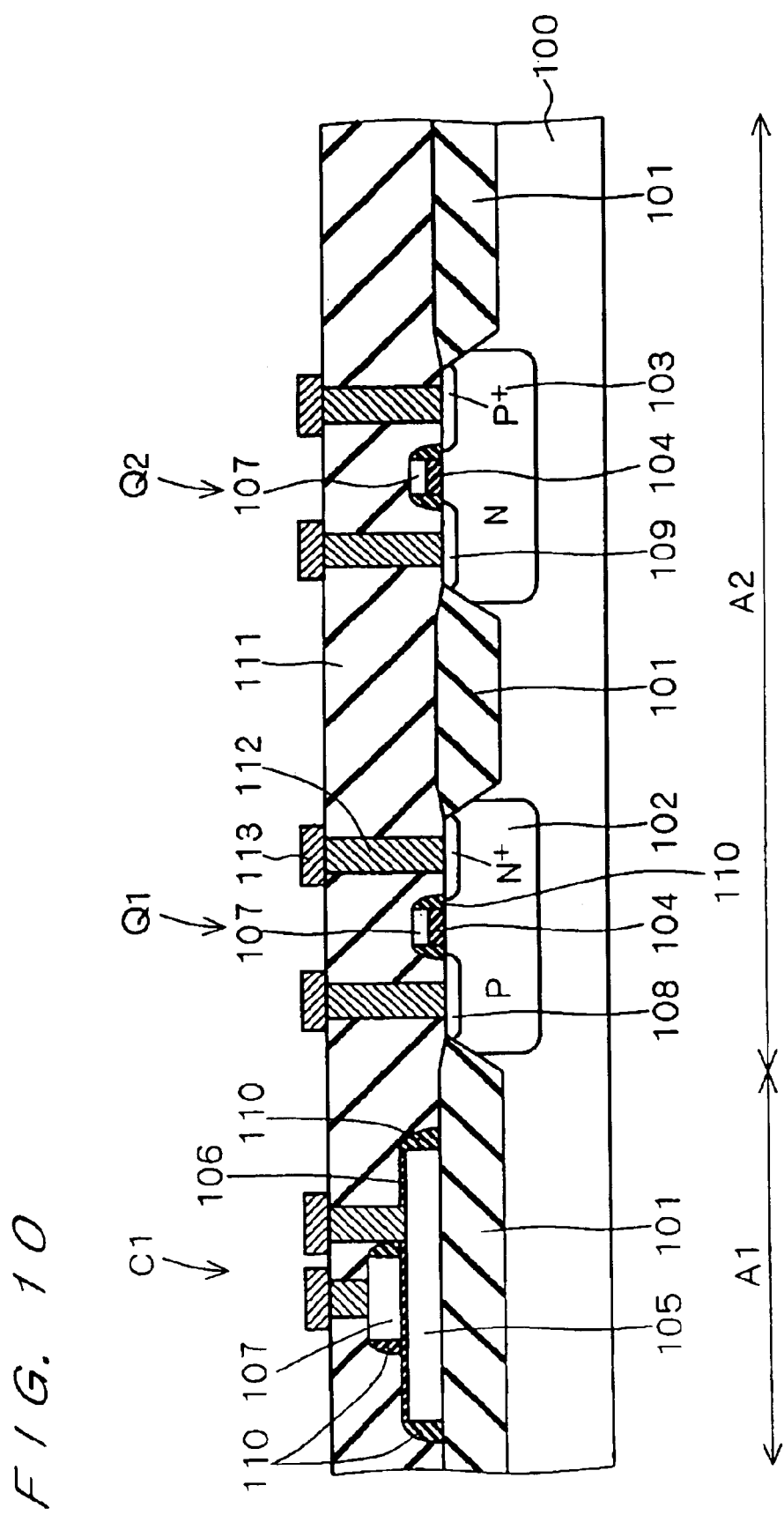

As shown in FIG. 10, contact interlayer insulating film 111 is formed on the entire surface thereof, and after contact holes are opened on one portion of upper-layer electrode-use polysilicon layer 107 and lower-layer electrode-use polysilicon 105 of capacitor formation area A1 as well as on one portion of $N^+$ source-drain regions 108 and $P^+$ source-drain regions 109 of CMOS formation area A2, these are embedded by tungsten plugs 112, and further electrically connected to tungsten plugs 112 so that aluminum wiring 113 is formed on contact interlayer insulating film 111; thus, a semiconductor device 1, shown in FIG. 1, is obtained. Here, a contact hole that also penetrates nitride film 106 is formed on one portion of lower-layer electrode-use polysilicon layer 105.

In this manner, in comparison with normal CMOS processes, semiconductor device 1 of the first embodiment makes it possible to fabricate capacitor C1 in a CMOS structure by adding only the lower-layer electrode-use mask for providing the lower-layer electrode structure shown in FIG. 5 thereto.

Moreover, since the dielectric film is formed independent of gate oxide film 104, it is possible to increase a capacitance value per unit area by using nitride film 106. In other words, since the film thickness, film property and film material of the dielectric film can be freely changed, it becomes possible to set the capacitance value per unit area to a desired value. In this case, of course, a structure which is free from voltage dependency that raises a problem in MOS capacitor can be provided.

As described above, semiconductor device 1 of the first embodiment makes it possible to provide a CMOS structure which increases a capacitance value per unit area while reducing the manufacturing costs to the minimum required, and is free from voltage dependency.

Polysilicon, which is free from degradation in the characteristics such as deformation even when processed at a high temperature of not less than 500° C., is used as the composition material of upper-layer electrode-use polysilicon layer 107; therefore, even when upper-layer electrode-use polysilicon layer 107 is used as gate electrodes of NMOS transistor Q11 and PMOS transistor Q12, it is possible to maintain superior electrical properties in MOS transistors Q11, Q21.

Here, in the first embodiment, although nitride film 106 is used as the dielectric film, any material may be used, as long as it is a dielectric material having a dielectric constant higher than that of the oxide film.

Moreover, a dielectric film having a laminated structure such as a double layer structure of $SiO_2/SiN$ or a triple layer structure of $SiO_2/SiN/SiO_2$ may be formed. When the dielectric film is formed in a laminated structure, it becomes possible to obtain improved reliability such as longer service life of the capacitor.

<Second Embodiment>

Figure 11:
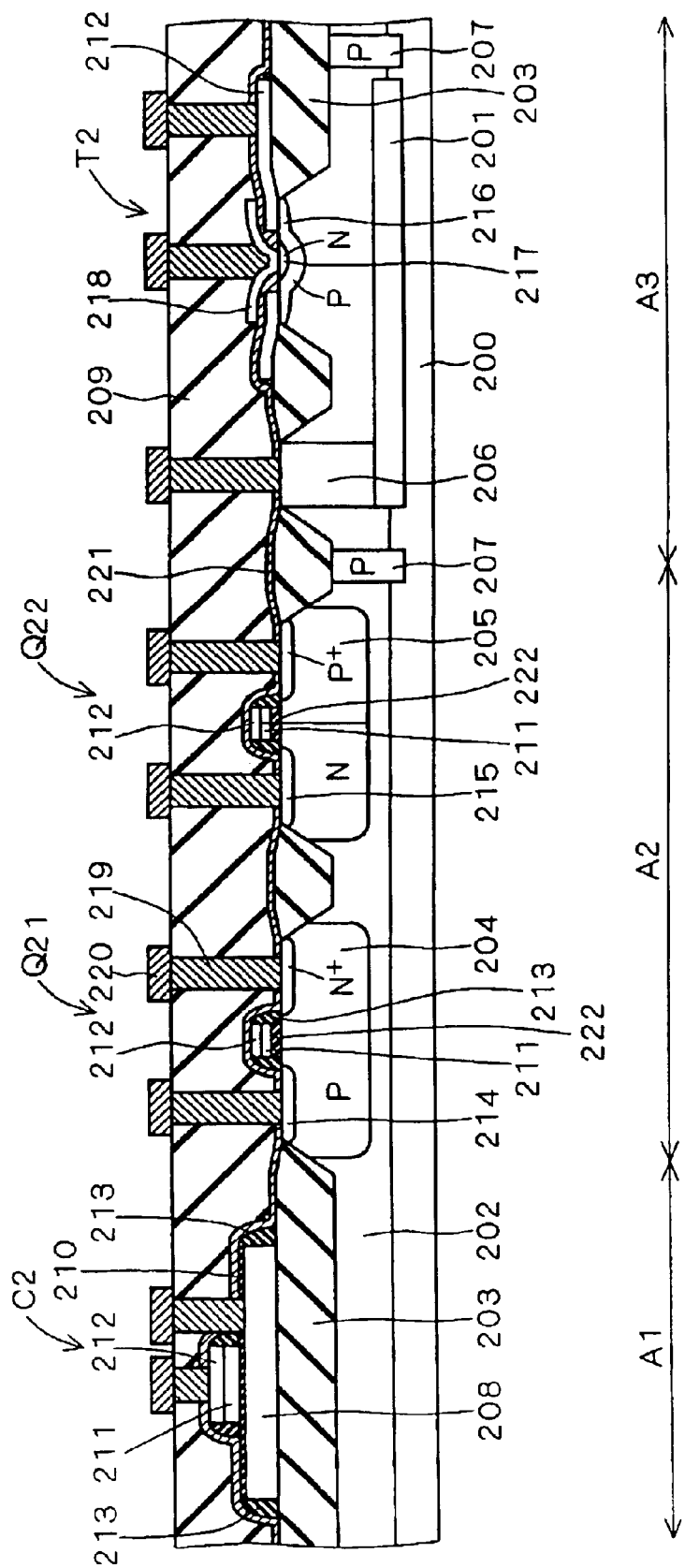
FIG. 11 is a cross-sectional view that shows a structure of a semiconductor device in accordance with a second embodiment of the present invention.

FIG. 11 is a cross-sectional view showing a structure of a semiconductor device 2 of a BiCMOS structure having a capacitor formed therein that is the second embodiment of the present invention.

As shown in this Figure, in a semiconductor device 2, a capacitor C2 is fabricated in a capacitor formation area A1, an NMOS transistor Q21 and a PMOS transistor Q22 are fabricated in a CMOS formation area A2 of an N-type epitaxial layer 202 formed on a silicon substrate 200, and a bipolar transistor T2 is fabricated in a bipolar transistor formation area A3. Silicon substrate 200 and N-type epitaxial layer 202 constitute a base having a BiCMOS structure.

NMOS transistor Q21 and PMOS transistor Q22 are element-separated by a LOCOS separation film 203 formed on an upper layer portion of N-type epitaxial layer 202, and capacitor C2, which is formed on LOCOS separation film 203, is element-separated from MOS transistors Q21, Q22 on CMOS formation area A2, and PMOS transistor Q22 and bipolar transistor T2 are element-separated from each other by LOCOS separation film 203 and a P-type separation-well region 207 located below this.

In capacitor formation area A1, capacitor C2 is constituted by a lower-layer electrode-use polysilicon layer 208 (lower layer electrode), a nitride film 210 (dielectric film), an upper-layer electrode-use first polysilicon layer 211 and an upper-layer electrode-use second polysilicon layer 212 (upper layer electrodes) that are formed on LOCOS separation film 203. In this case, lower-layer electrode-use polysilicon layer 208 and nitride film 210 are formed as the same plane pattern. Moreover, a frame-forming TEOS oxide film 213 is formed on side faces of lower-layer electrode-use polysilicon layer 208 as well as upper-layer electrode-use first polysilicon layer 211 and upper-layer electrode-use second polysilicon layer 212.

In CMOS formation area A2, NMOS transistor Q21 is formed on a P-well region 204, and PMOS transistor Q22 is formed on an N-well region 205.

An $N^+$ source-drain region 214 is selectively formed within the surface of P-well region 204, and gate oxide film 222, upper-layer electrode-use first polysilicon layer 211 and upper-layer electrode-use second polysilicon layer 212 are formed on the surface of P-well region 204 between $N^+$ source-drain regions 214. Therefore, NMOS transistor Q21, constituted by P-well region 204, $N^+$ source-drain regions 214 and gate oxide film 222, is formed with upper-layer electrode-use first polysilicon layer 211 and upper-layer electrode-use second polysilicon layer 212 serving as a gate electrode.

Here, $P^+$ source-drain regions 215 are selectively formed within the surface of N-well region 205, and gate oxide film 222 as well as upper-layer electrode-use first polysilicon layer 211 and upper-layer electrode-use second polysilicon layer 212 are formed on the surface of N-well region 205 between $P^+$ source-drain regions 215. Therefore, PMOS transistor Q22, constituted by N-well region 205, $P^+$ source-drain regions 215 and gate oxide film 222, is formed with upper-layer electrode-use first polysilicon layer 211 and upper-layer electrode-use second polysilicon layer 212 serving as a gate electrode.

In bipolar transistor formation area A3, a floating collector region 201 is formed in a manner so as to be embedded in an interface between silicon substrate 200 and N-type epitaxial layer 202, and a collector wall 206 is formed from one portion of floating collector region 201 to the surface of N-type epitaxial layer 202.

Here, a P-type base diffusion layer 216 is formed on an upper layer portion of N-type epitaxial layer 202 within bipolar transistor formation area A3, and an emitter diffusion layer 217 is formed within the surface of the center portion of base diffusion layer 216.

Moreover, upper-layer electrode-use second polysilicon layer 212 is formed as a base electrode in contact with one portion of the surface of base diffusion layer 216, and a polysilicon emitter electrode 218 is formed in a manner so as to contact one portion of the surface of emitter diffusion layer 217. Here, upper-layer electrode-use second polysilicon layer 212 and polysilicon emitter electrode 218 are insulated from each other with TEOS oxide film 221 being formed in between.

In this manner, in bipolar transistor formation area A3, a bipolar transistor T2 is constituted by collector wall 206, base diffusion layer 216, emitter diffusion layer 217, upper-layer electrode-use second polysilicon layer 212 (base electrode) and polysilicon emitter electrode 218.

A contact interlayer-insulating film 209 is formed in a manner so as to cover the entire surface of N-type epitaxial layer 202 including capacitor C2, NMOS transistor Q21, PMOS transistor Q22 and bipolar transistor T2.

Here, a tungsten plug 219 is formed in a penetrating manner through contact interlayer insulating film 209 so as to electrically connect to one portion of the surface of upper-layer electrode-use first polysilicon layer 211 of capacitor C2, one portion of the surface of $N^+$ source-drain regions 214, 214, one portion of the surface of $P^+$ source-drain regions 215, 215, one portion of upper-layer electrode-use second polysilicon layer 212 of bipolar transistor formation area A3, one portion of the surface of collector wall 206, and one portion of polysilicon emitter electrode 218.

Moreover, tungsten plug 219 is formed in a penetrating manner through contact interlayer insulating film 209 and nitride film 210 so as to electrically connect to one portion of the surface of lower-layer electrode-use polysilicon layer 208 of capacitor C2. Furthermore, aluminum wiring 220 is formed on contact interlayer insulating film 209 in a manner so as to electrically connect to tungsten plug 219.

FIGS. 12 to 24 are cross-sectional views showing a manufacturing method of semiconductor device 2 in accordance with the second embodiment. Referring to these figures, the following description will discuss the manufacturing method of the second embodiment.

Figure 12:
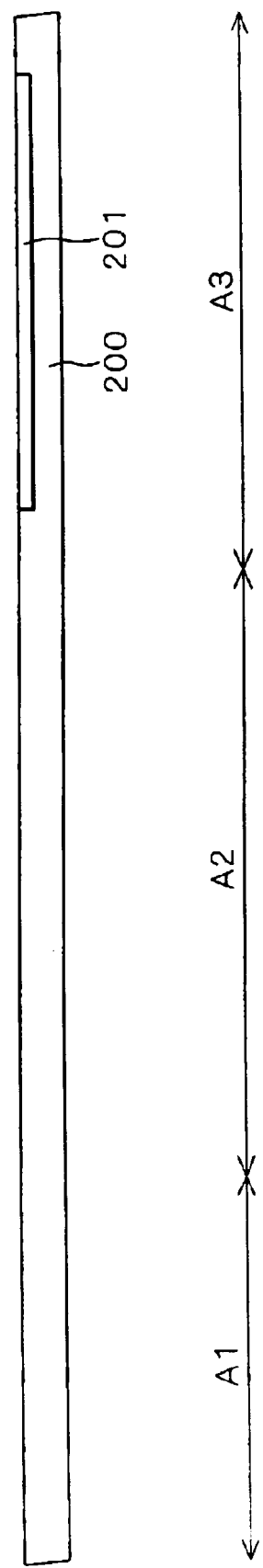
FIGS. 12 to 24 are cross-sectional views that show the manufacturing method of the semiconductor device in accordance with the second embodiment.

First, as shown in FIG. 12, antimony (Sb) is injected into a silicon substrate 200 to form an N-type floating collector region 201.

Figure 13:
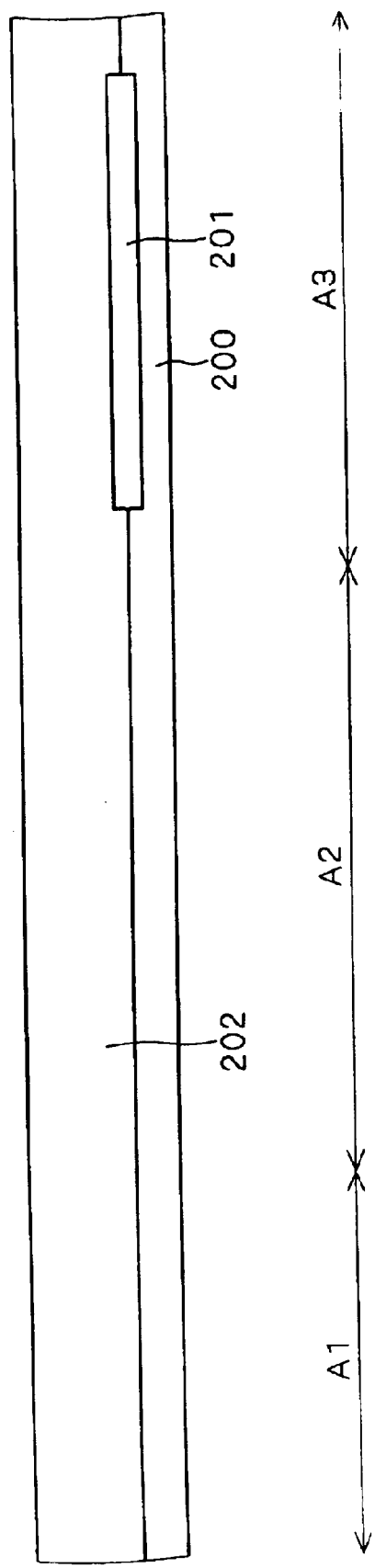

Next, as shown in FIG. 13, an N-type epitaxial layer 202 is formed on silicon substrate 200 including a floating collector region 201 by using an epitaxial growth method. At this time, since N-type impurities of floating collector region 201 are diffused so that one portion of floating collector region 201 is formed also inside N-type epitaxial layer 202.

Figure 14:
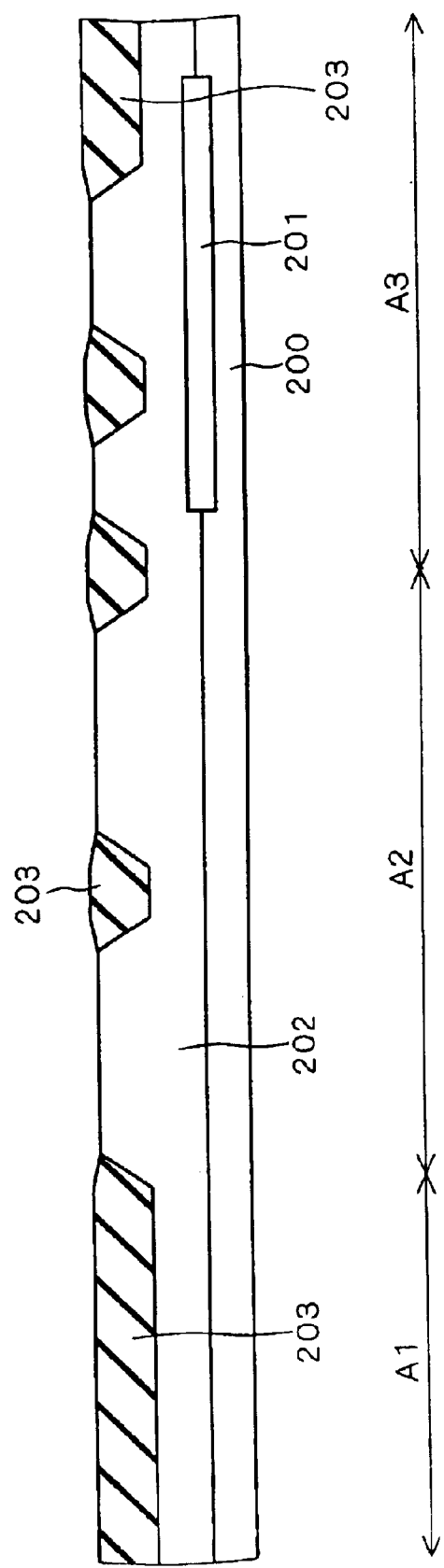

Then, as shown in FIG. 14, LOCOS separation film 203 is selectively formed on an upper-layer portion of N-type epitaxial layer 202.

Figure 15:
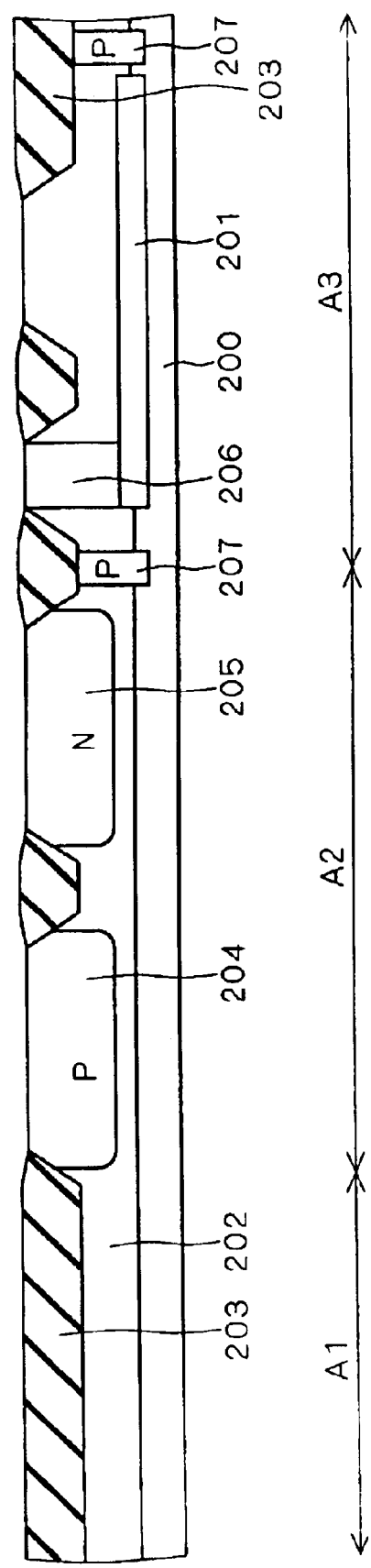

Next, as shown in FIG. 15, P-well region 204 and N-well region 205 are selectively formed on the upper-layer portion of CMOS formation area A2 in N-type epitaxial layer 202.

Moreover, as shown in FIG. 15, a P-type separation well region 207 is formed under LOCOS separation film 203 in an area close to the border of CMOS formation area A2 and bipolar transistor formation area A3 through ion injection, etc. penetrating LOCOS separation film 203 so that a collector wall 206 extending from the surface of N-type epitaxial layer 202 to floating collector region 201 is formed.

Figure 16:
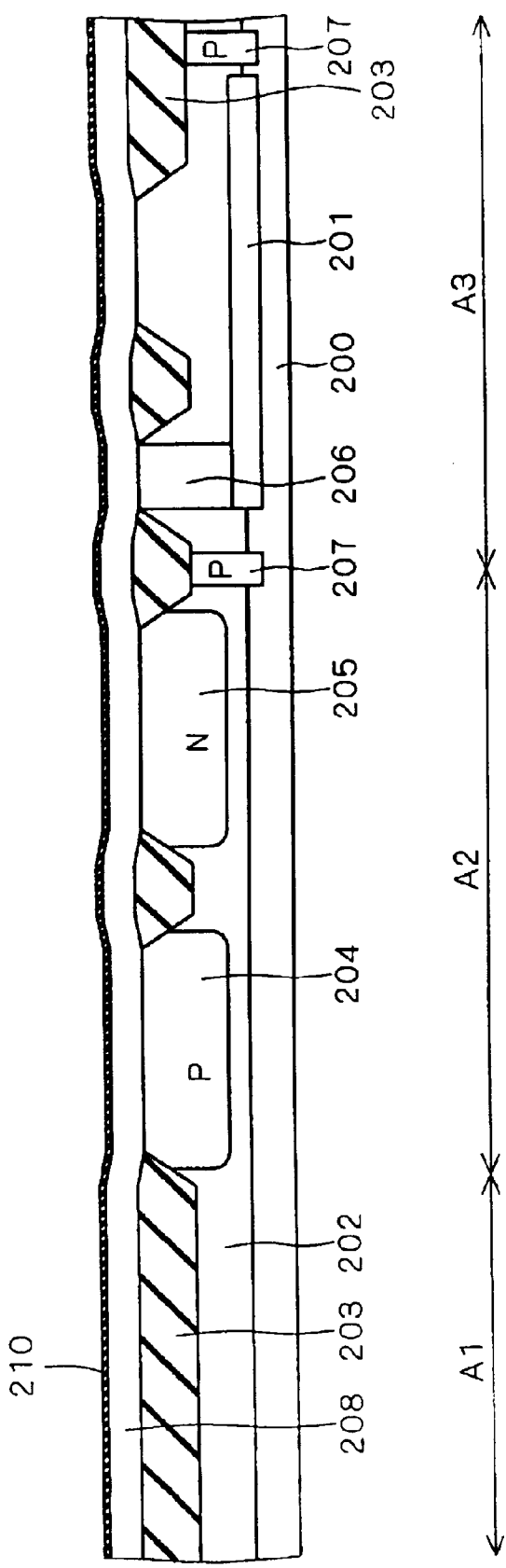

Then, as shown in FIG. 16, a lower-layer electrode-use polysilicon layer 208 having doped polysilicon is deposited on the entire surface through a CVD method or the like, and a nitride film 210, serving as a single-layer dielectric film, is formed on lower-layer electrode-use polysilicon layer 208. Here, lower-layer electrode-use polysilicon layer 208 may be doped by ion injection or amorphous silicon may be formed in place of doped silicon.

Figure 17:
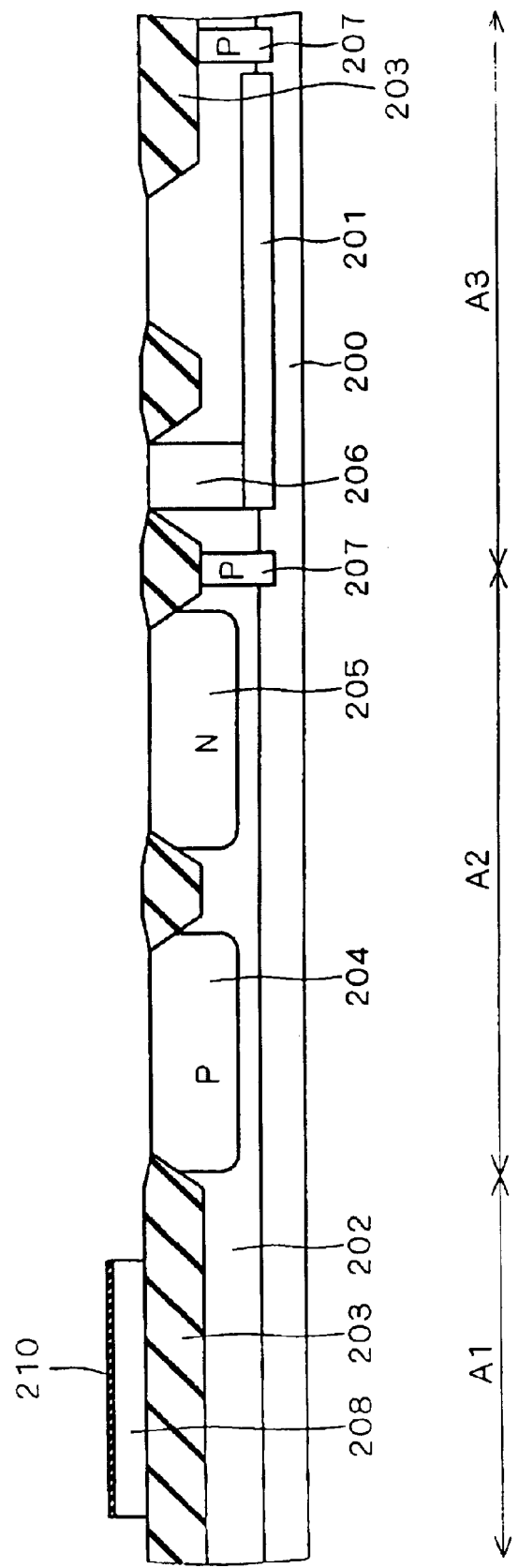

Next, as shown in FIG. 17, by selectively etching lower-layer electrode-use polysilicon layer 208 and nitride film 210 using a lower-layer electrode-use mask, not shown, lower-layer electrode-use polysilicon layer 208 and nitride film 210 are selectively allowed to remain on only capacitor formation area A1. Consequently, lower-layer electrode-use polysilicon layer 208 and nitride film 210 are formed as the same plane pattern. Lower-layer electrode-use polysilicon layer 208 and nitride film 210, thus patterned, are respectively allowed to form a lower-layer electrode and a dielectric film of capacitor C2.

Figure 18:
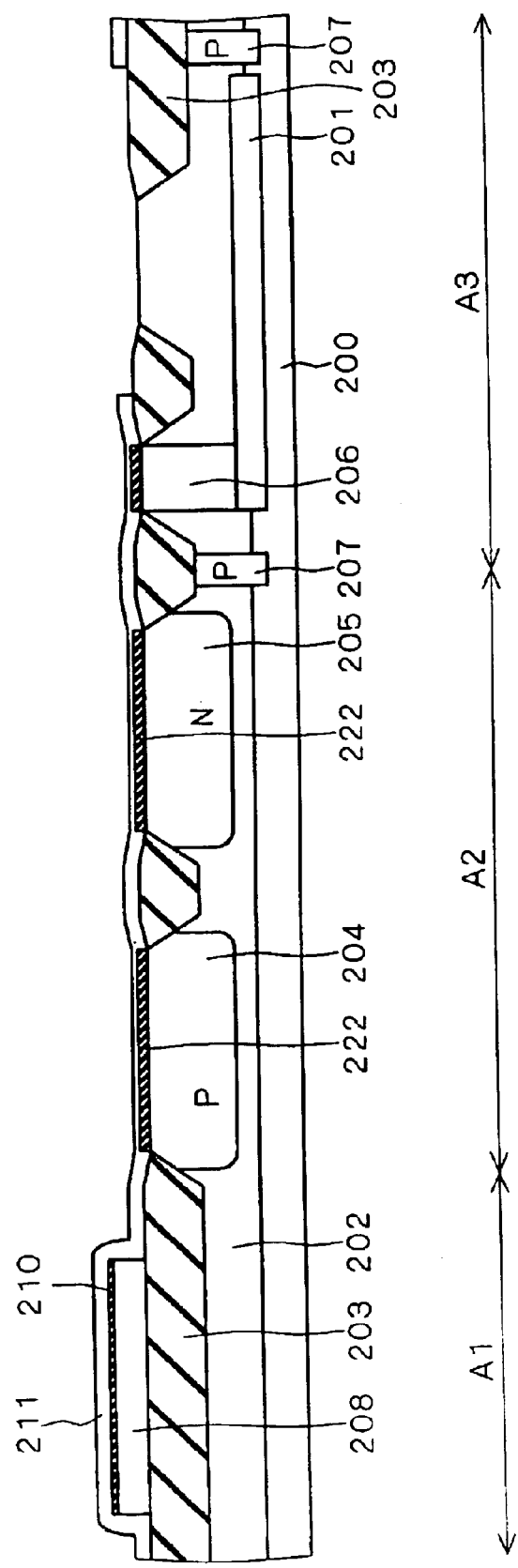

Successively, as shown in FIG. 18, after gate oxide films 222 have been respectively formed on P-well region 204, N-well region 205 and collector wall 206, upper-layer electrode-use first polysilicon layer 211 having doped polysilicon is deposited on the entire surface by a CVD method or the like, and lower-layer electrode-use first polysilicon layer 211 and gate oxide film 222 are etched and removed from most of areas including the surface of N-type epitaxial layer 202 within bipolar transistor formation area A3. Here, upper-layer electrode-use first polysilicon layer 211 may be doped through ion injection, or amorphous silicon may be formed in place of doped silicon.

Figure 19:
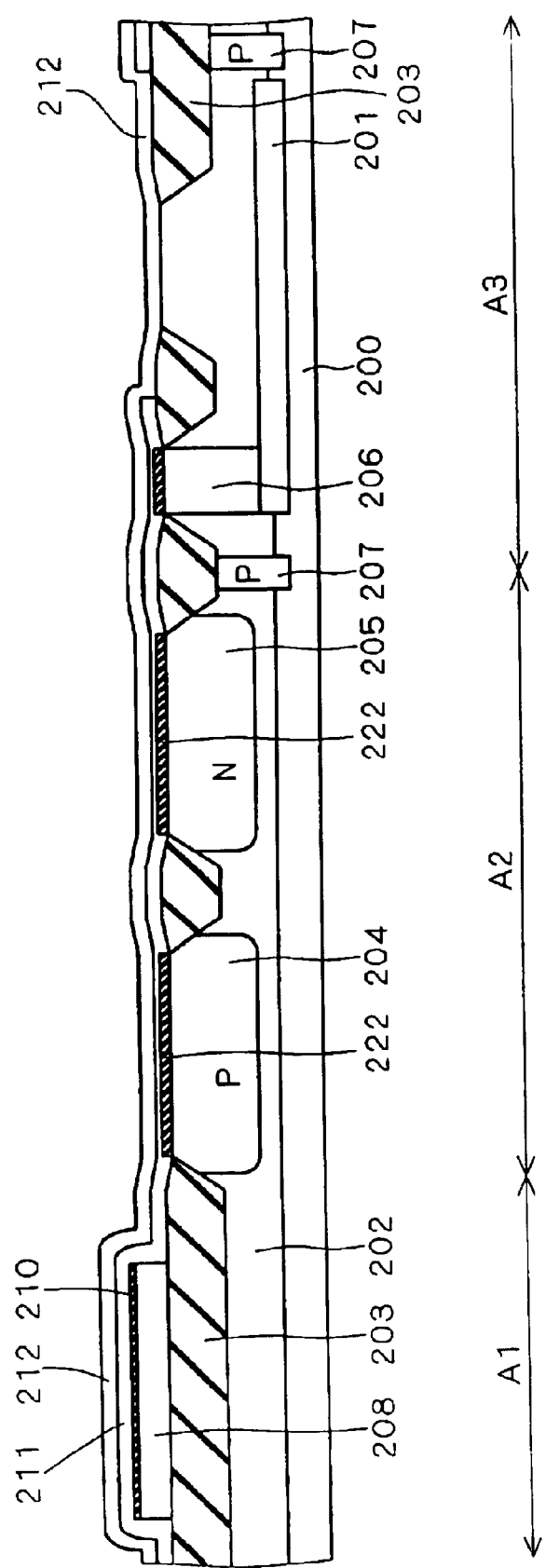

Moreover, as shown in FIG. 19, upper-layer electrode-use second polysilicon layer 212 made of non-doped polysilicon is deposited on the entire surface. Here, amorphous silicon may be formed in place of non-doped polysilicon.

Figure 20:
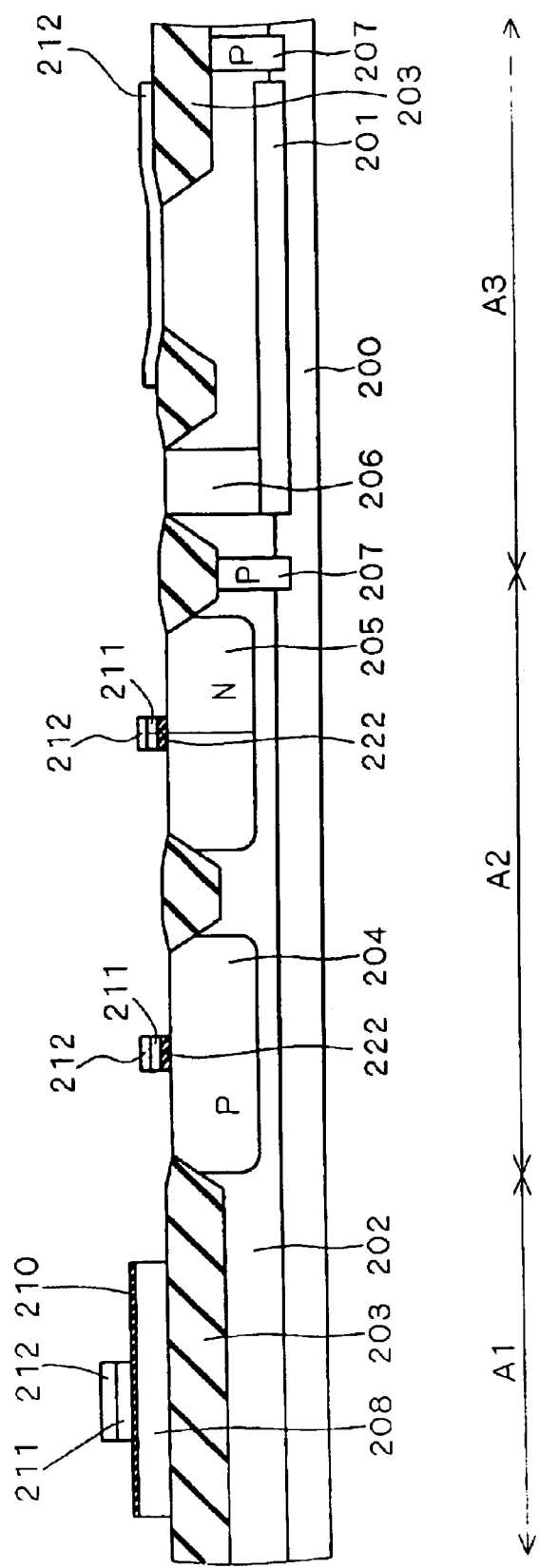

Then, as shown in FIG. 20, upper-layer electrode-use first polysilicon layer 211 (only in capacitor formation area A1 and CMOS formation area A2) and upper-layer electrode-use second polysilicon layer 212 as well as gate oxide film 222 (only in CMOS formation area A2 and bipolar transistor formation area A3) are selectively etched by using an upper-layer electrode, not shown, and a mask used for commonly forming gate electrode and base electrode.

Then, upper-layer electrode-use first polysilicon layer 211 and upper-layer electrode-use second polysilicon layer 212 are patterned on one portion of nitride film 210 of capacitor formation area A1, gate oxide film 222 of CMOS formation area A2 as well as upper-layer electrode-use first polysilicon layer 211 and upper-layer electrode-use second polysilicon layer 212 are patterned, and upper-layer electrode-use second polysilicon layer 212 on bipolar transistor formation area A3 is patterned.

Consequently, it becomes possible to simultaneously form the upper-layer electrode of capacitor C2 derived from upper-layer electrode-use first polysilicon layer 211 and gate electrodes of NMOS transistor Q21 and PMOS transistor Q22 derived from upper-layer electrode-use first polysilicon layer 211 and upper-layer electrode-use second polysilicon layer 212.

Figure 21:
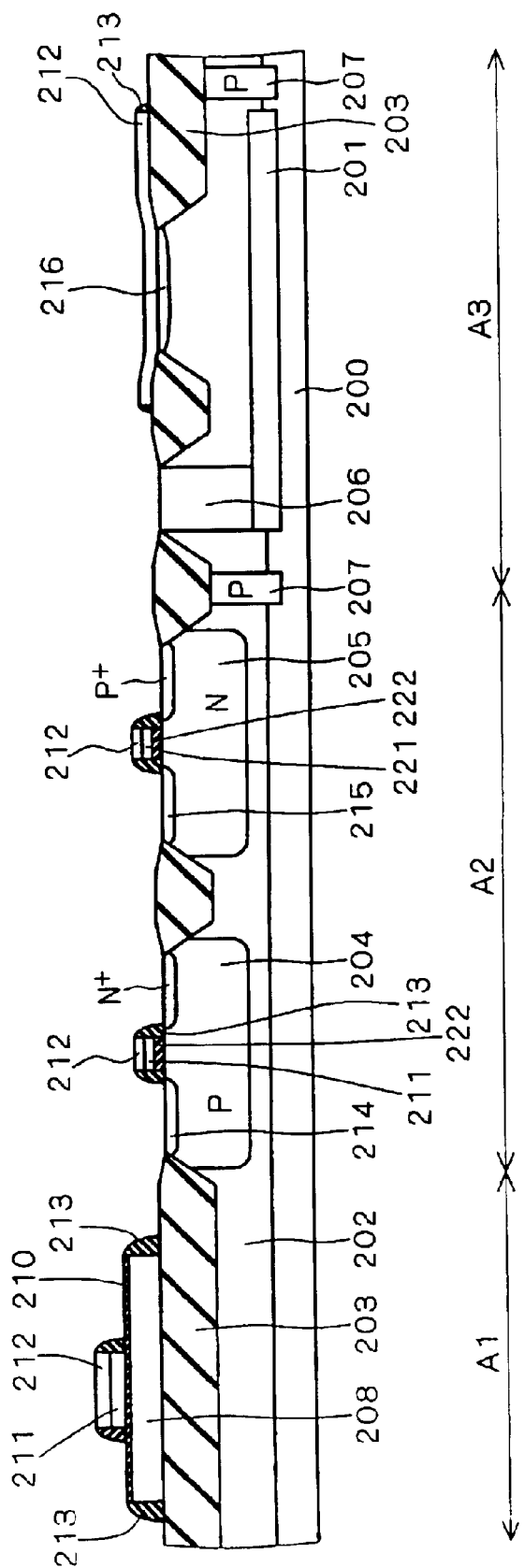

Next, as shown in FIG. 21, after having deposited frame-forming TEOS oxide film 213 over the entire surface, the entire surface is subjected to an etch back process so that frame-forming TEOS oxide film 213 is allowed to remain as side walls on lower-layer electrode-use polysilicon layer 208 and upper-layer electrode-use first polysilicon layer 211 of capacitor formation area A1, the side face of upper-layer electrode-use second polysilicon layer 212, gate oxide film 222 and upper-layer electrode-use first polysilicon layer 211 of CMOS formation area A2, the side face of upper-layer electrode-use second polysilicon layer 212, and the side face of upper-layer electrode-use second polysilicon layer 212 of bipolar transistor formation area A3.

Moreover, as shown in FIG. 21, with respect to the respective P-well region 204 and N-well region 205, impurities of N-type and P-type are injected therein by using frame-forming TBOS oxide films 213 formed on upper-electrode-use first polysilicon layer 211 and the side faces thereof as masks so that $N^+$ source-drain regions 214, 214 and $P^+$ source-drain regions 215 are respectively formed within the surface of P-well region 204 and N-well region 205.

As shown in FIG. 21, in bipolar transistor formation area A3, a diffusion process is carried out by using upper-layer electrode-use second polysilicon layer 212 as a diffusion source so that base diffusion layer 216 is formed through an injection process into the surface of N-type epitaxial layer 202. Here, base diffusion layer 216 may be formed by injecting ions through upper-layer electrode-use second polysilicon layer 212.

Figure 22:
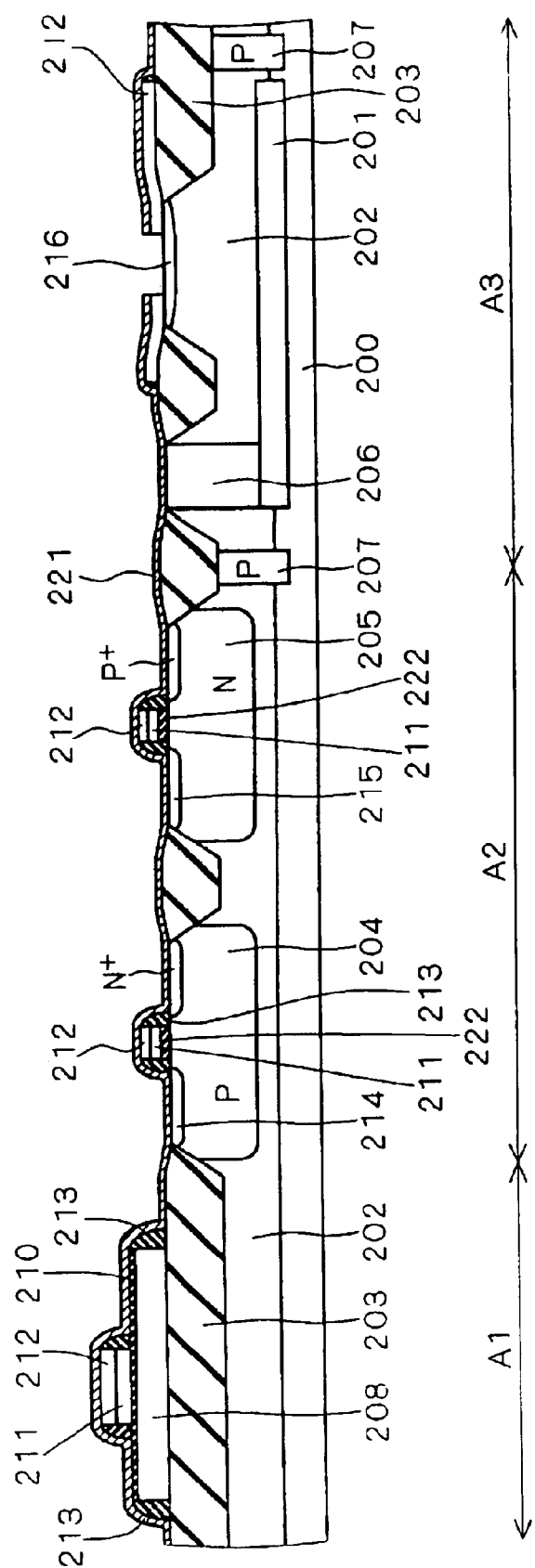

Next, as shown in FIG. 22, after TEOS oxide film 221 has been deposited over the entire surface, the TEOS oxide film 221 and upper-layer electrode-use second polysilicon layer 212, located on the center portion of base diffusion layer 216 of bipolar transistor formation area A3, are selectively removed. The residual upper-layer electrode-use second polysilicon layer 212 forms a base electrode.

Figure 23:
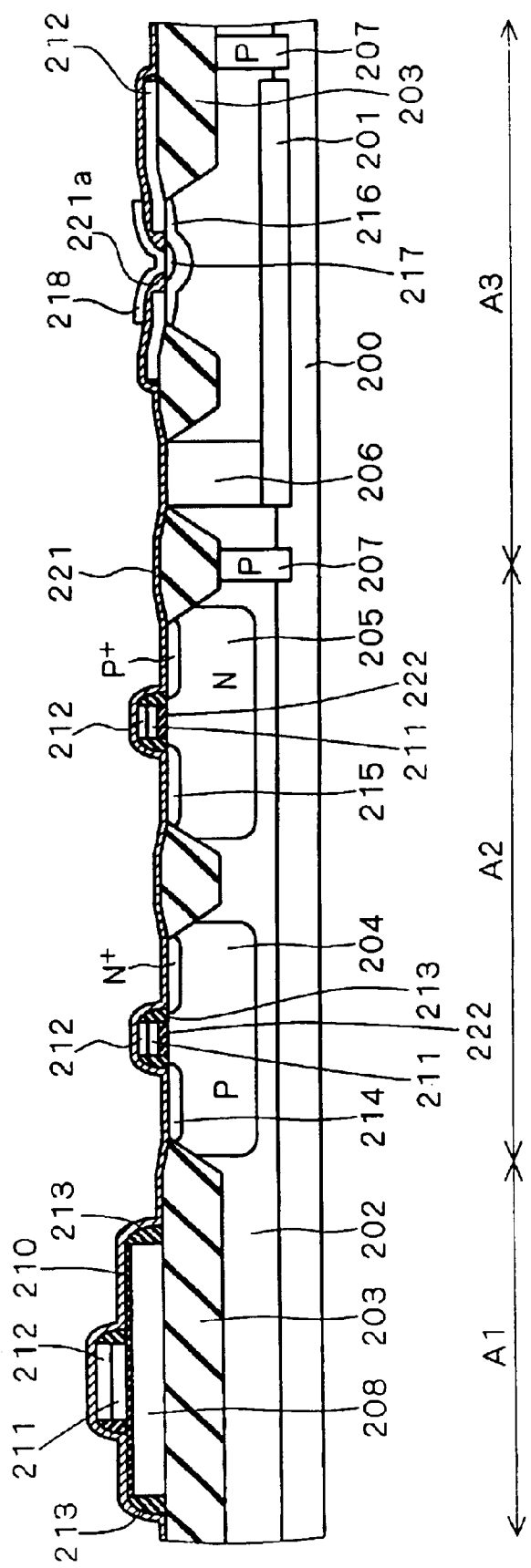

Successively, as shown in FIG. 23, a polysilicon emitter electrode 218 having doped N-type impurities is formed on the surface of base diffusion layer 216 in bipolar transistor formation area A3. In this case, prior to the formation of polysilicon emitter electrode 218, an insulating film 221a, such as a TEOS oxide film, is formed so that an insulating property between polysilicon emitter electrode 218 and upper-layer electrode-use second polysilicon layer 212 is maintained. Moreover, a diffusion process, which uses polysilicon emitter electrode 218 as a diffusion source, is carried out so that emitter diffusion layer 217 is formed on the surface of base diffusion layer 216 right under polysilicon emitter electrode 218. At this time, base diffusion layer 216 is also diffused.

Figure 24:
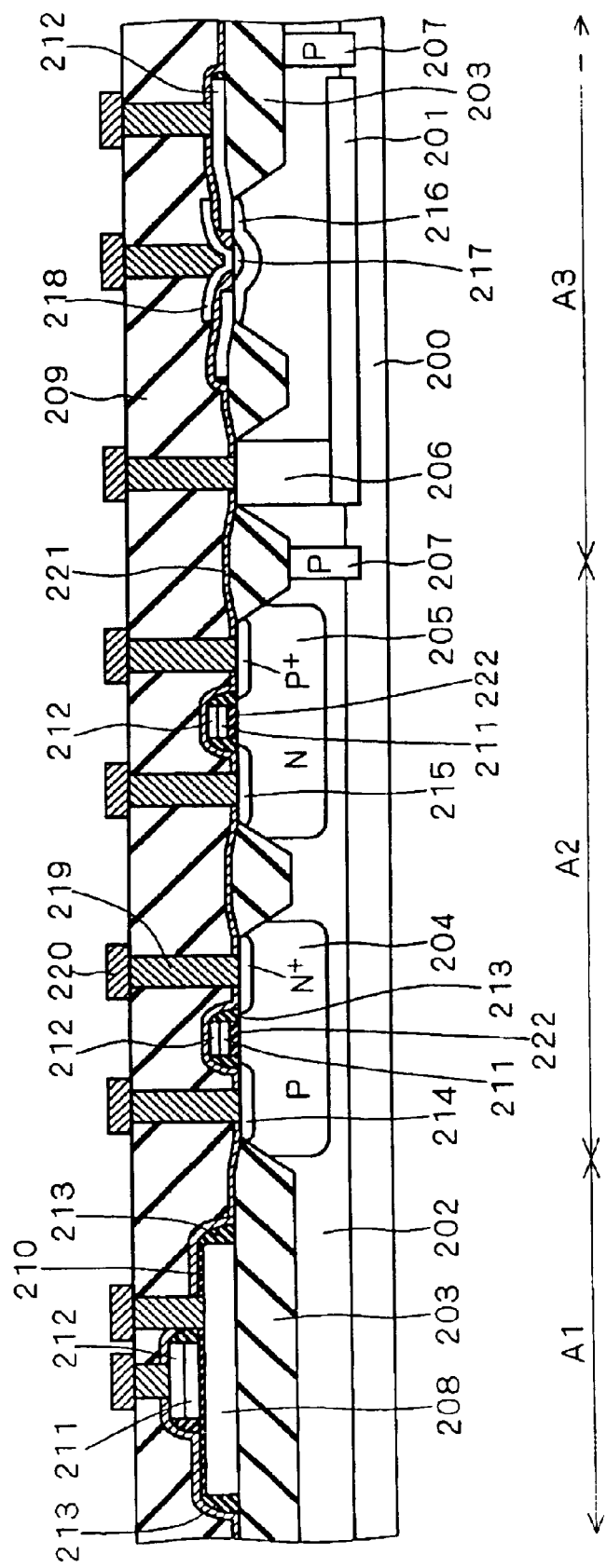

As shown in FIG. 24, contact interlayer insulating film 209 is formed on the entire surface, and after contact holes have been formed on one portion of upper-layer electrode-use second polysilicon layer 212 and lower-layer electrode-use polysilicon layer 208 of capacitor formation area A1, one portion of $N^+$ source-drain regions 214, 214 and $P^+$ source-drain regions 215, 215 of CMOS formation area A2, one portion of upper-layer electrode-use second polysilicon layer 212 of bipolar transistor formation area A3, one portion of collector wall 206 and one portion of polysilicon emitter electrode 218, these holes are sealed with tungsten plugs 219, and aluminum wiring 220 is formed on contact interlayer insulating film 209 in a manner so as to electrically connect to tungsten plugs 219; thus, it is possible to obtain a semiconductor device 2 shown in FIG. 11. Here, a contact hole that also penetrates nitride film 210 is formed on one portion of lower-layer electrode-use polysilicon layer 208.

In this manner, when compared with normal BiCMOS processes, the semiconductor device 2 of the second embodiment makes it possible to fabricate capacitor C2 in a BiCMOS structure by adding only the lower-layer electrode-use mask for providing the lower-layer electrode structure shown in FIG. 17 thereto.

Moreover, in the same manner as semiconductor device 1 of the first embodiment, the semiconductor device 2 of the second embodiment, the application of nitride film 210 as a dielectric film makes it possible to increase a capacitance value per unit area, and consequently to provide a structure that is free from voltage dependency.

As described above, semiconductor device 2 of the second embodiment makes it possible to provide a BiCMOS structure which increases a capacitance value per unit area while reducing the manufacturing costs to the minimum required, and is free from voltage dependency.

Moreover, polysilicon, which is free from degradation in the characteristics such as deformation even when processed at a high temperature of not less than 500° C., is used as the composition material of upper-layer electrode-use first polysilicon layer 211 and upper-layer electrode-use second polysilicon 212; therefore, even when upper-layer electrode-use first polysilicon layer 211 and upper-layer electrode-use second polysilicon 212 are used as gate electrodes of NMOS transistor Q21 and PMOS transistor Q22, it is possible to maintain superior electrical properties in MOS transistors Q21, Q22. In the same manner, when upper-layer electrode-use second polysilicon layer 212 is used as the base electrode of bipolar transistor T2, it is possible to maintain superior electrical properties in bipolar transistor T2.

Here, in the second embodiment, although nitride film 210 is used as the dielectric film, any material may be used, as long as it is a dielectric material having a dielectric constant higher than that of the oxide film.

Moreover, a dielectric film having a laminated structure such as a double layer structure of $SiO_2/SiN$ or a triple layer structure of $SiO_2/SiN/SiO_2$ may be formed. When the dielectric film is formed in a laminated structure, it becomes possible to obtain improved reliability such as longer service life of the capacitor.

<Third Embodiment>

Figure 25:
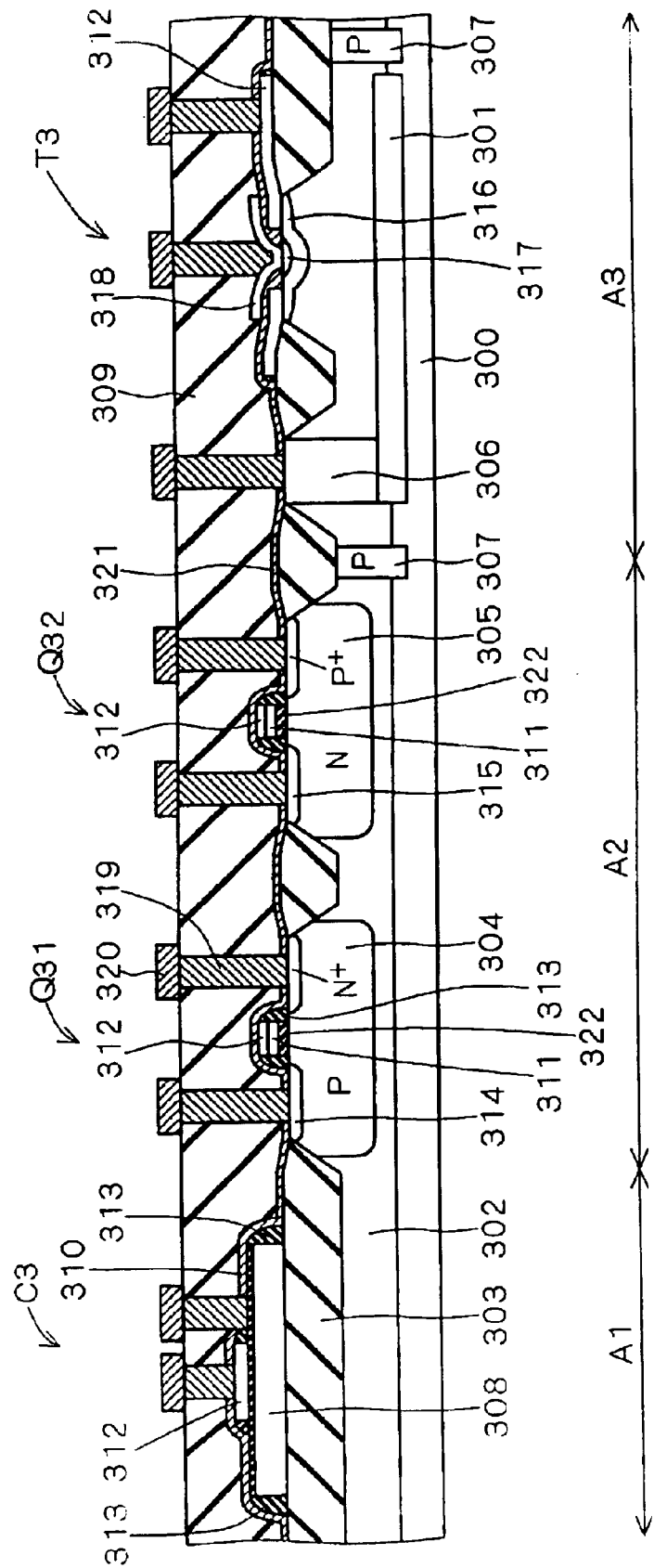
FIG. 25 is a cross-sectional view that shows a structure of a semiconductor device in accordance with a third embodiment of the present invention.

FIG. 25 is a cross-sectional view showing a structure of a semiconductor device 3 of a BiCMOS structure having a capacitor formed therein that is the third embodiment of the present invention.

As shown in this figure, in a semiconductor device 3, a capacitor C3 is fabricated in a capacitor formation area A1, an NMOS transistor Q31 and a PMOS transistor Q32 are fabricated in a CMOS formation area A2 in an N-type epitaxial layer 302 formed on a silicon substrate 300, and a bipolar transistor T3 is fabricated in a bipolar transistor formation area A3.

NMOS transistor Q31 and PMOS transistor Q32 are element-separated by a LOCOS oxide film 303 formed on an upper layer portion of N-type epitaxial layer 302, and capacitor C3, which is formed on LOCOS oxide film 303, is element-separated from MOS transistors Q31, Q32 on CMOS formation area A2, and PMOS transistor Q32 and bipolar transistor T3 are element-separated from each other by LOCOS oxide film 303 and a P-type separation-well region 307 located below this.

In capacitor formation area A1, capacitor C3 is constituted by a lower-layer electrode-use polysilicon layer 308 (lower layer electrode), a nitride film 310 (dielectric film) and an upper-layer electrode-use polysilicon layer 312 (upper layer electrode) that are formed on LOCOS oxide film 303. In this case, lower-layer electrode-use polysilicon layer 308 and nitride film 310 are formed as the same plane pattern. Moreover, a frame-forming TEOS oxide film 213 is formed on side faces of lower-layer electrode-use polysilicon layer 308 and upper-layer electrode-use second polysilicon layer 312.

In CMOS formation area A2, NMOS transistor Q31 is formed on a P-well region 304, and PMOS transistor Q32 is formed on an N-well region 305.

An N$^+$ source-drain region 314 is selectively formed within the surface of P-well region 304, and gate oxide film 322 as well as a gate electrode-use polysilicon layer 311 and upper-layer electrode-use polysilicon layer 312 are formed on the surface of P-well region 304 between N$^+$ source-drain regions 314, 314. Therefore, NMOS transistor Q31, constituted by P-well region 304, N$^+$ source-drain regions 314, 314 and gate oxide film 322, is formed with gate-electrode-use polysilicon layer 311 and upper-layer electrode-use polysilicon layer 312 serving as a gate electrode.

Here, P$^+$ source-drain regions 315, 315 are selectively formed within the surface of N-well region 305, and gate oxide film 322 as well as gate-electrode-use polysilicon layer 311 and upper-layer electrode-use polysilicon layer 312 are formed on the surface of N-well region 305 between P$^+$ source-drain regions 315, 315. Therefore, PMOS transistor Q32, constituted by N-well region 305, P$^+$ source-drain regions 315, 315 and gate oxide film 322, is formed with gate-electrode-use polysilicon layer 311 and upper-layer electrode-use polysilicon layer 312 serving as a gate electrode.

In bipolar transistor formation area A3, a floating collector region 301 is formed in a manner so as to be embedded in an interface between silicon substrate 300 and N-type epitaxial layer 302, and a collector wall 306 is formed from one portion of floating collector region 301 to the surface of N-type epitaxial layer 302.

Here, a P-type base diffusion layer 316 is formed on an upper layer portion of N-type epitaxial layer 302 within a bipolar transistor formation area A3, and an emitter diffusion layer 317 is formed within the surface of the center portion of base diffusion layer 316.

Moreover, upper-layer electrode-use second polysilicon layer 312 is formed as a base electrode in contact with one portion of the surface of base diffusion layer 316, and a polysilicon emitter electrode 318 is formed in a manner so as to contact one portion of the surface of emitter diffusion layer 317. Here, upper-layer electrode-use polysilicon layer 312 and polysilicon emitter electrode 318 are insulated from each other with TEOS oxide film 321 being formed in between.

In this manner, in bipolar transistor formation area A3, a bipolar transistor T3 is constituted by collector wall 306, base diffusion layer 316, emitter diffusion layer 317, upper-layer electrode-use polysilicon layer 312 (base electrode) and polysilicon emitter electrode 318.

A contact interlayer-insulating film 309 is formed in a manner so as to cover the entire surface of N-type epitaxial layer 302 including capacitor C3, NMOS transistor Q31, PMOS transistor Q32 and bipolar transistor T3.

Here, a tungsten plug 319 is formed in a penetrating manner through contact interlayer insulating film 309 so as to electrically connect to one portion of the surface of upper-layer electrode-use polysilicon layer 312 of capacitor C3, one portion of the surface of N$^+$ source-drain regions 314, 314, one portion of the surface of P$^+$ source-drain regions 315, 315, one portion of upper-layer electrode-use polysilicon layer 312 of bipolar transistor formation area A3, one portion of the surface of collector wall 306, and one portion of polysilicon emitter electrode 318.

Moreover, tungsten plug 319 is formed in a penetrating manner through contact interlayer insulating film 309 and nitride film 310 so as to electrically connect to one portion of the surface of lower-layer electrode-use polysilicon layer 308 of capacitor C3. Furthermore, aluminum wiring 320 is formed in a manner so as to electrically connect to tungsten plug 319 on contact interlayer insulating film 309.

FIGS. 26 to 38 are cross-sectional views showing a manufacturing method of semiconductor device 3 in accordance with the third embodiment. Referring to these figures, the following description will discuss the manufacturing method of the third embodiment.

Figure 26:
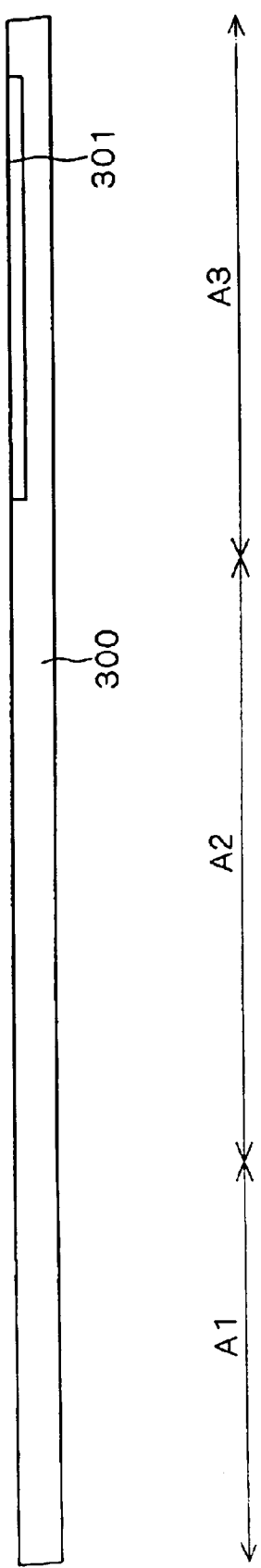
FIGS. 26 to 38 are cross-sectional views that show the manufacturing method of the semiconductor device in accordance with the third embodiment.

First, as shown in FIG. 26, antimony (Sb) is injected into a silicon substrate 300 to form an N-type floating collector region 301.

Figure 27:
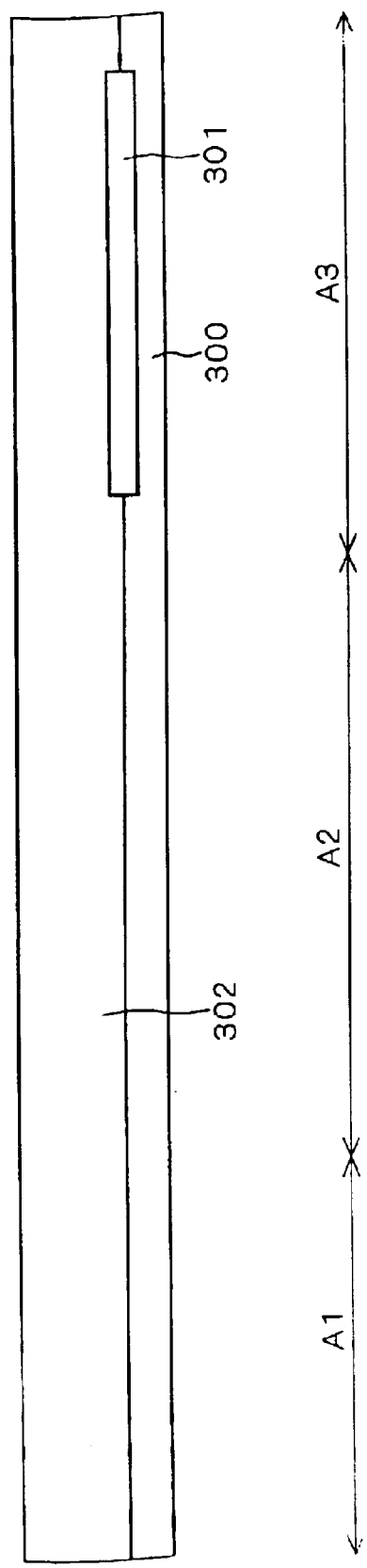

Next, as shown in FIG. 27, an N-type epitaxial layer 302 is formed on silicon substrate 300 including a floating collector region 301 by using an epitaxial growth method. At this time, since N-type impurities of floating collector region 301 are diffused so that one portion of floating collector region 301 is formed also inside N-type epitaxial layer 302.

Figure 28:
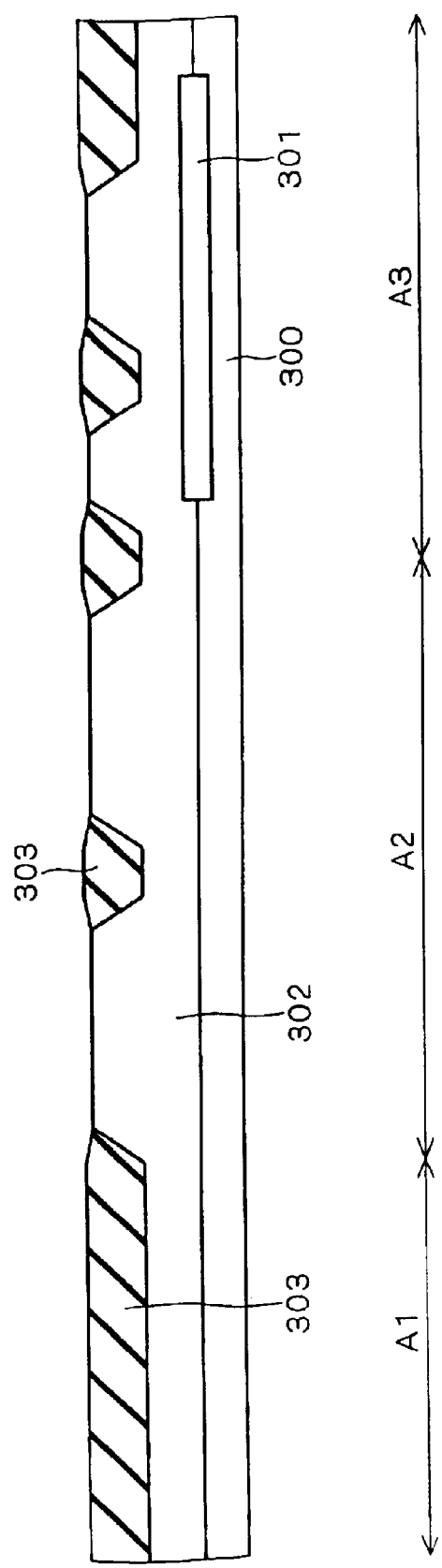

Then, as shown in FIG. 28, LOCOS oxide film 303 is selectively formed on an upper-layer portion of N-type epitaxial layer 302.

Figure 29:
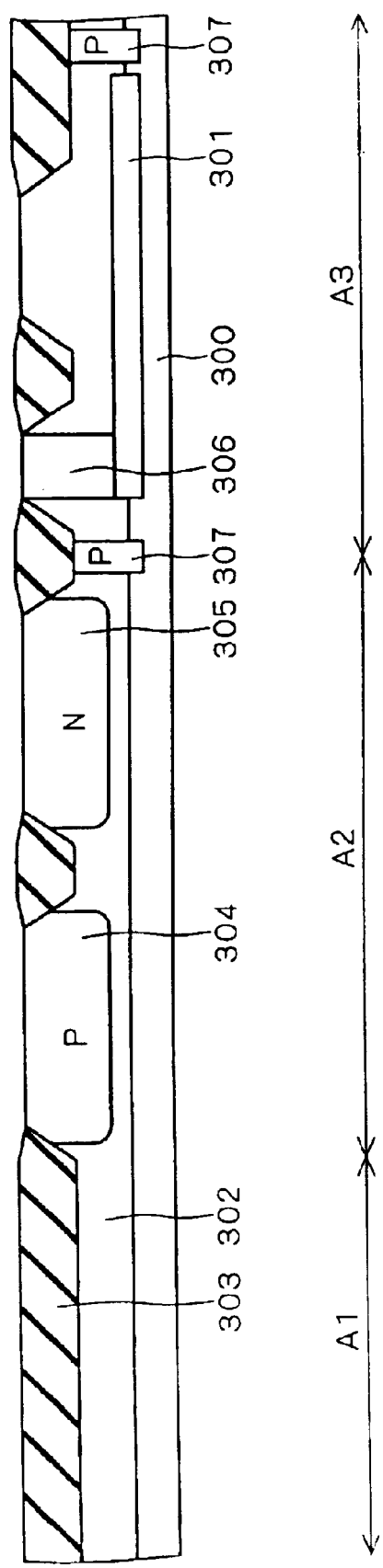

Next, as shown in FIG. 29, P-well region 304 and N-well region 305 are selectively formed on the upper-layer portion of CMOS formation area A2 in N-type epitaxial layer 302.

Moreover, as shown in FIG. 29, a P-type separation well region 307 is formed under LOCOS oxide film 303 in an area close to the border of CMOS formation area A2 and bipolar transistor formation area A3 through ion injection penetrating LOCOS oxide film 303 so that a collector wall 306 extending from the surface of N-type epitaxial layer 302 to floating collector region 301 is formed.

Figure 30:
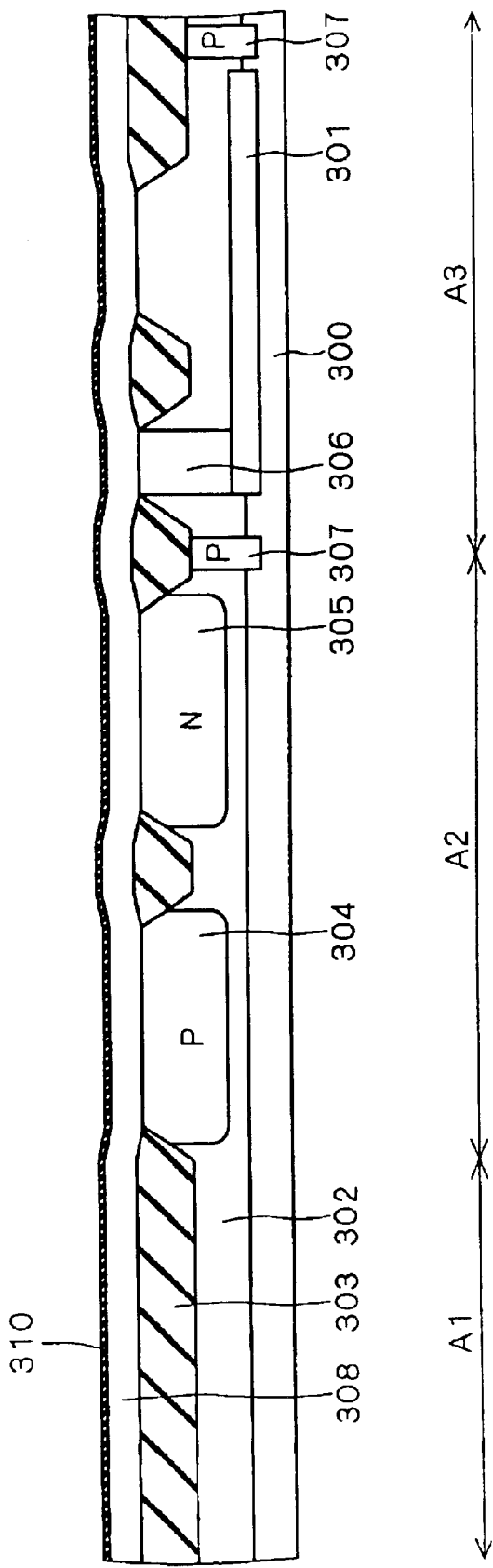

Then, as shown in FIG. 30, a lower-layer electrode-use polysilicon layer 308 made of doped polysilicon is deposited on the entire surface through a CVD method or the like, and a nitride film 310, serving as a single-layer dielectric film, is formed on lower-layer electrode-use polysilicon layer 308. Here, lower-layer electrode-use polysilicon layer 308 may be doped by ion injection or amorphous silicon may be formed in place of doped silicon.

Figure 31:
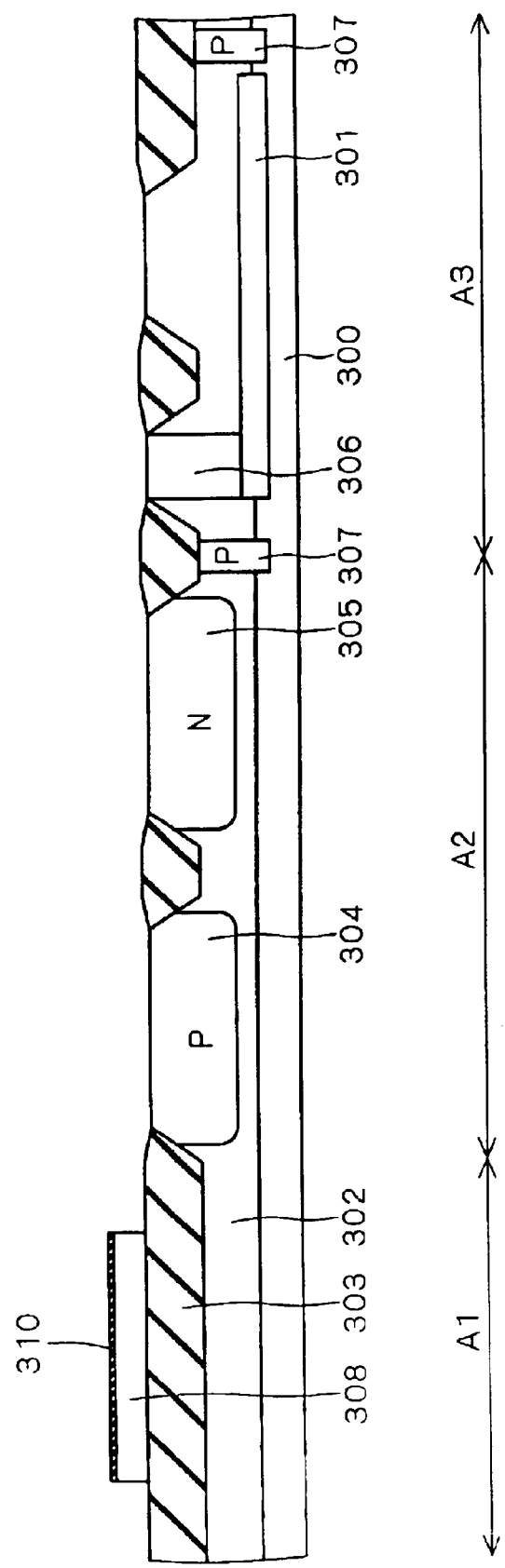

Next, as shown in FIG. 31, by selectively etching lower-layer electrode-use polysilicon layer 308 and nitride film 310 using a lower-layer electrode-use mask, not shown, lower-layer electrode-use polysilicon layer 308 and nitride film 310 are selectively allowed to remain on only capacitor formation area A1. Consequently, lower-layer electrode-use polysilicon layer 308 and nitride film 310 are formed as the same plane pattern. Lower-layer electrode-use polysilicon layer 308 and nitride film 310, thus patterned, are respectively allowed to form a lower-layer electrode and a dielectric film of capacitor C3.

Figure 32:
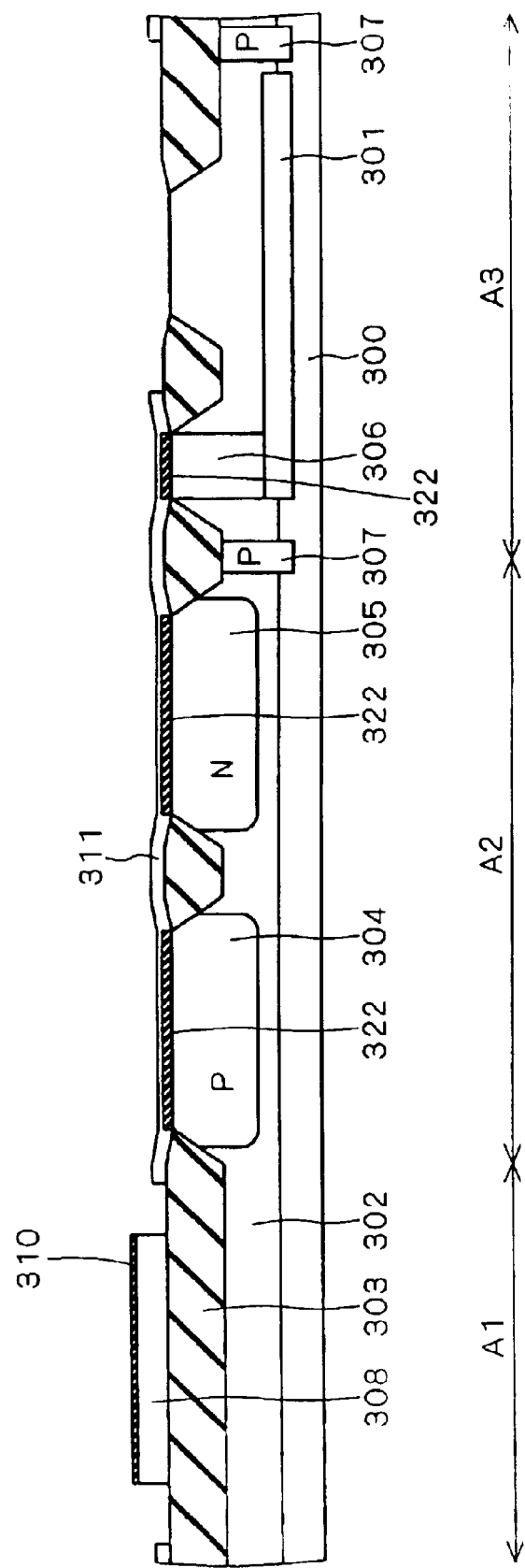

Successively, as shown in FIG. 32, after gate oxide films 322 have been respectively formed on P-well region 304, N-well region 305 and collector wall 306, upper-layer electrode-use first polysilicon layer 311 made of doped polysilicon is deposited on the entire surface by a CVD method or the like, and upper-layer electrode-use polysilicon layer 312 and gate oxide film 322 are etched and removed from most of areas including the surface of N-type epitaxial layer 302 of capacitor formation area A1 and N-type epitaxial layer 302 of bipolar transistor formation area A3. Here, upper-layer electrode-use polysilicon layer 312 may be doped through ion injection, or amorphous silicon may be formed in place of doped silicon.

Figure 33:
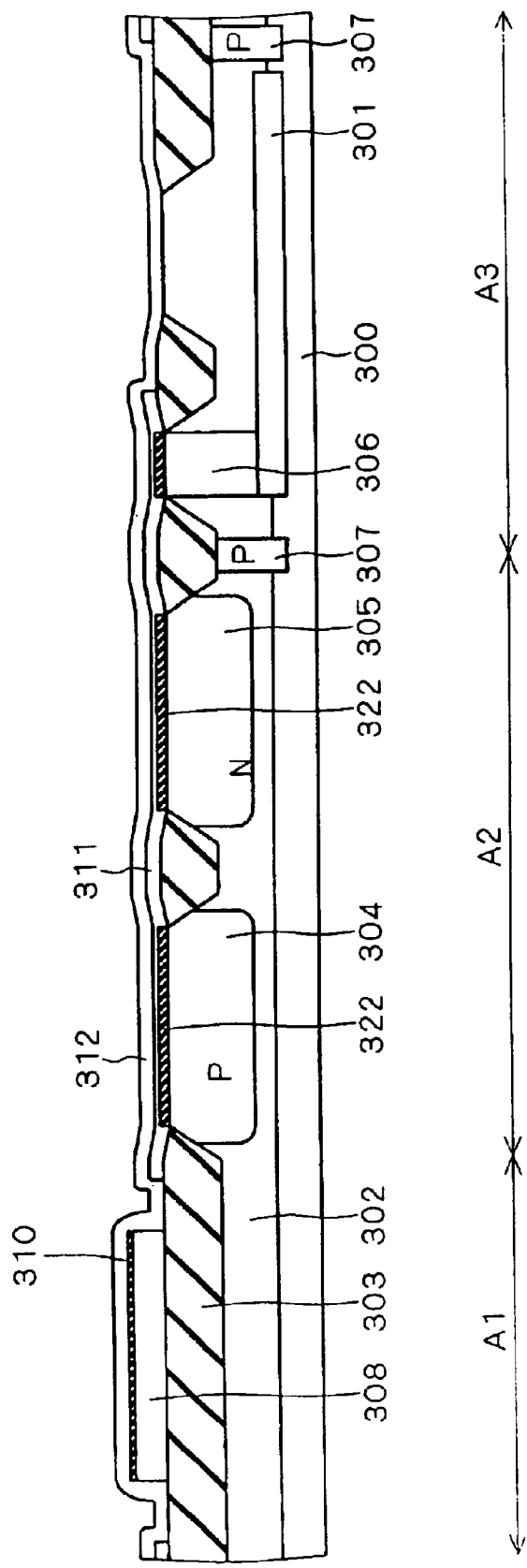

Moreover, as shown in FIG. 33, upper-layer electrode-use polysilicon layer 312 made of non-doped polysilicon is deposited on the entire surface. Here, amorphous silicon may be formed in place of non-doped polysilicon.

Figure 34:
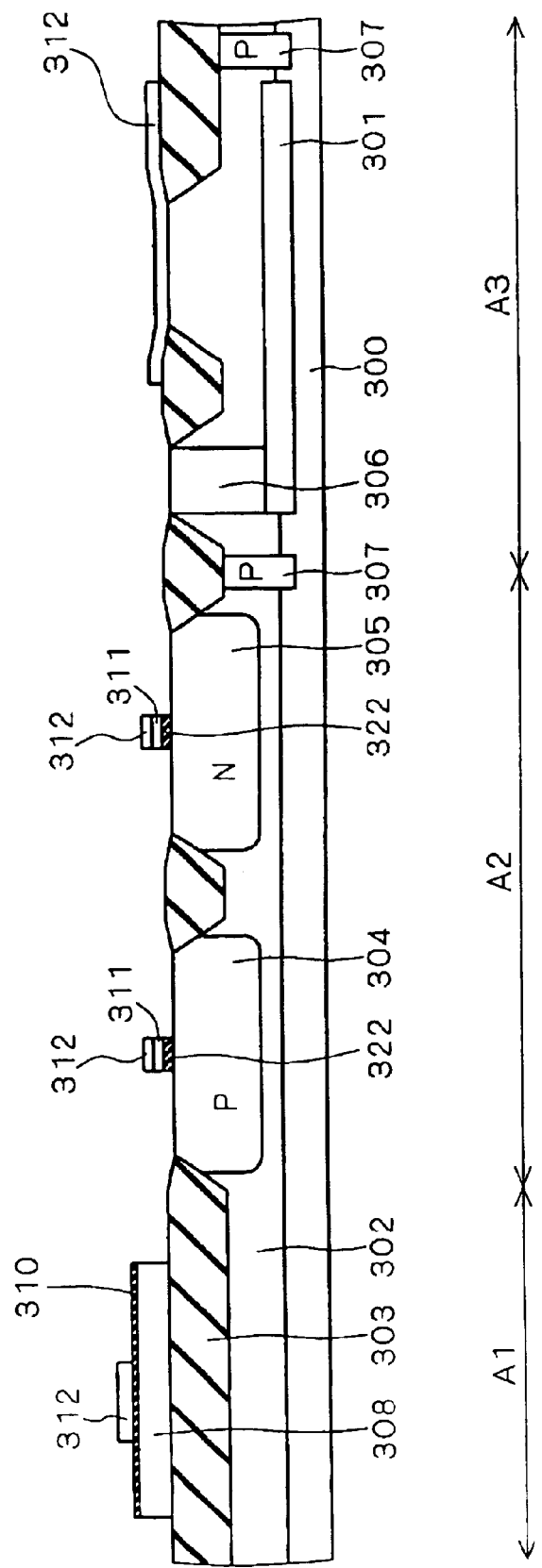

Then, as shown in FIG. 34, gate-electrode-use polysilicon layer 311 (only in CMOS formation area A2) and upper-layer electrode-use polysilicon layer 312 as well as gate oxide film 322 (only in CMOS formation area A2 and bipolar transistor formation area A3) are selectively etched by using an upper-layer electrode, not shown, and a mask used for commonly forming gate electrode and base electrode.

Then, upper-layer electrode-use polysilicon layer 312 is patterned on one portion of nitride film 310 of capacitor formation area A1, gate oxide film 322 of CMOS formation area A2 as well as gate-electrode-use polysilicon layer 311 and upper-layer electrode-use polysilicon layer 312 are patterned, and upper-layer electrode-use polysilicon layer 312 on bipolar transistor formation area A3 is patterned.

Consequently, it becomes possible to simultaneously form the upper-layer electrode of capacitor C3 derived from upper-layer electrode-use polysilicon layer 312 and gate electrodes of NMOS transistor Q31 and PMOS transistor Q32 derived from gate-electrode-use polysilicon layer 311 and upper-layer electrode-use polysilicon layer 312.

Figure 35:
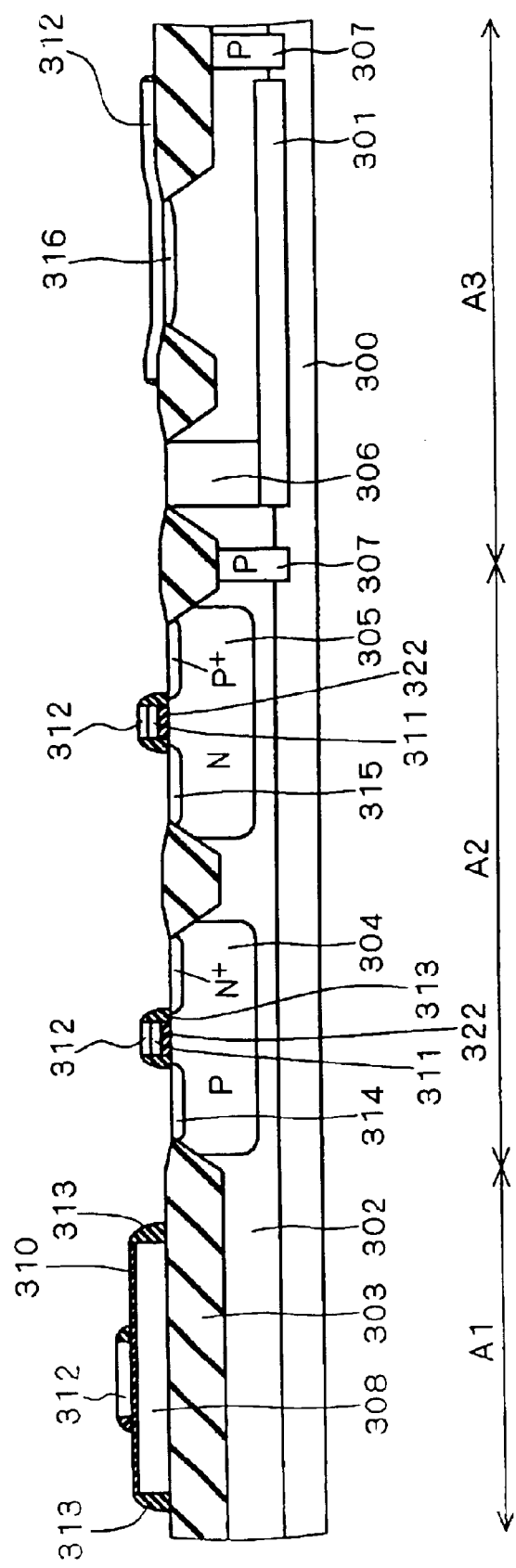

Next, as shown in FIG. 35, after having deposited frame-forming TEOS oxide film 213 over the entire surface, the entire surface is subjected to an etch back process so that frame-forming TEOS oxide film 213 is allowed to remain as side walls on the side face of lower-layer electrode-use polysilicon layer 308 and upper-layer electrode-use polysilicon layer 312 of capacitor formation area A1, the side face of gate oxide film 322, gate-electrode-use polysilicon layer 311 and upper-layer electrode-use polysilicon layer 312 of CMOS formation area A2, and the side face of upper-layer electrode-use polysilicon layer 312 of bipolar transistor formation area A3.

Moreover, as shown in FIG. 35, with respect to the respective P-well region 304 and N-well region 305, impurities of N-type and P-type are injected therein by using frame-forming TEOS oxide films 213 formed on upper-electrode-use polysilicon layer 312 and the side faces thereof as masks; thus, $N^+$ source-drain regions 314 and $P^+$ source-drain regions 315 are respectively formed within the surfaces of P-well region 304 and N-well region 305.

As shown in FIG. 35, in bipolar transistor formation area A3, a diffusion process is carried out by using upper-layer electrode-use polysilicon layer 312 as a diffusion source so that base diffusion layer 316 is formed on the surface of N-type epitaxial layer 302. Here, base diffusion layer 316 may be formed by injecting P-type impurities into the surface of N-type epitaxial layer 302 through upper-layer electrode-use polysilicon layer 312.

Figure 36:
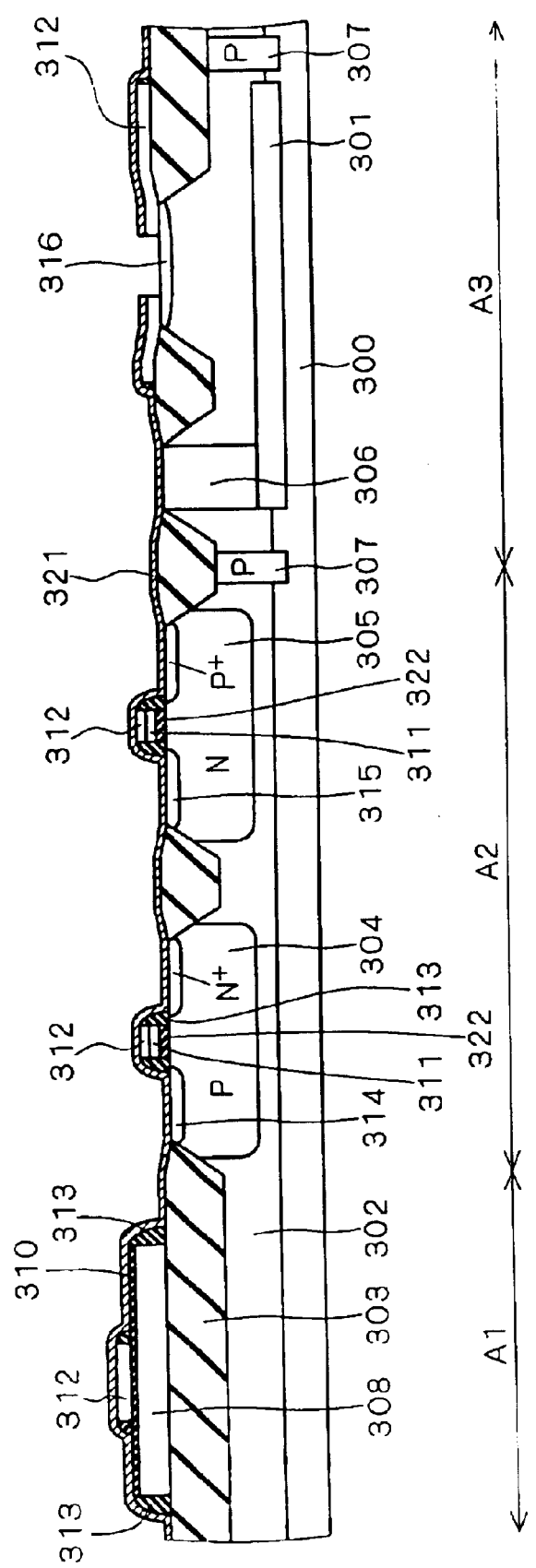

Next, as shown in FIG. 36, after TEOS oxide film 321 has been deposited over the entire surface, the TEOS oxide film 321 and upper-layer electrode-use polysilicon layer 312, located on the center portion of base diffusion layer 316 of bipolar transistor formation area A3, are selectively removed. The residual upper-layer electrode-use polysilicon layer 312 forms a base electrode.

Figure 37:
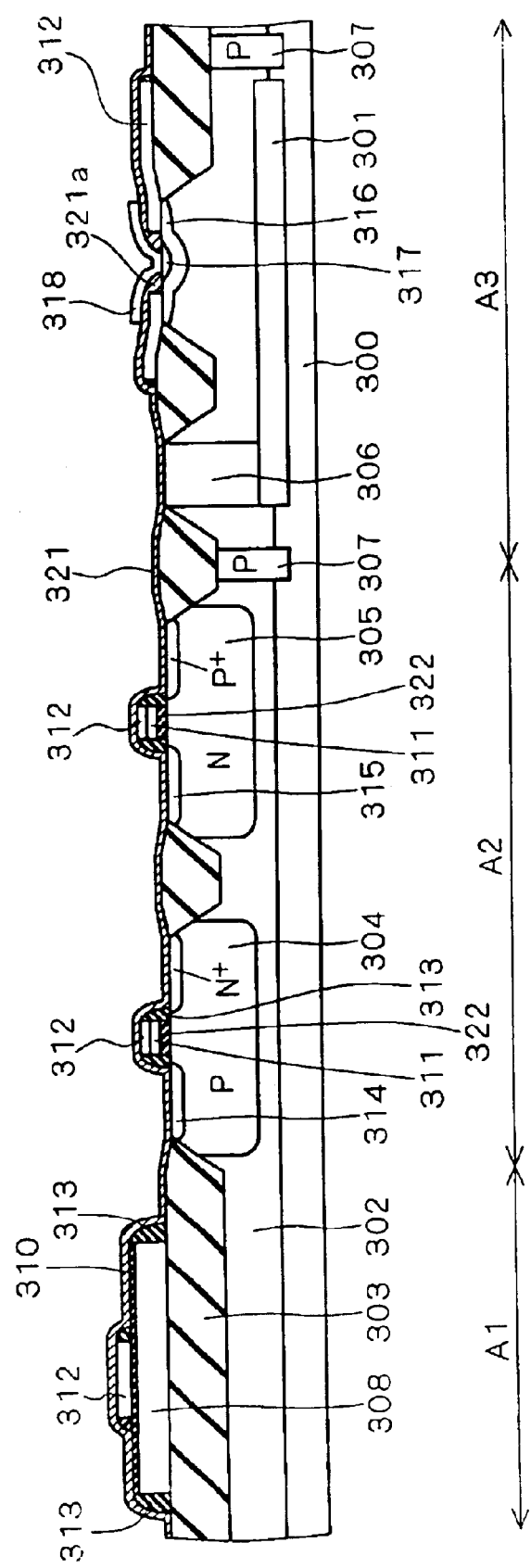

Successively, as shown in FIG. 37, in bipolar transistor formation area A3, a polysilicon emitter electrode 318 having doped N-type impurities is formed on the surface of base diffusion layer 316. In this case, prior to the formation of polysilicon emitter electrode 318, an insulating film 321a, such as a TEOS oxide film, is formed so that an insulating property between polysilicon emitter electrode 318 and upper-layer electrode-use polysilicon layer 312 is maintained. Moreover, a diffusion process, which uses polysilicon emitter electrode 318 as a diffusion source, is carried out so that emitter diffusion layer 317 is formed on the surface of base diffusion layer 316 right under polysilicon emitter electrode 318. At this time, base diffusion layer 316 is also diffused.

Figure 38:
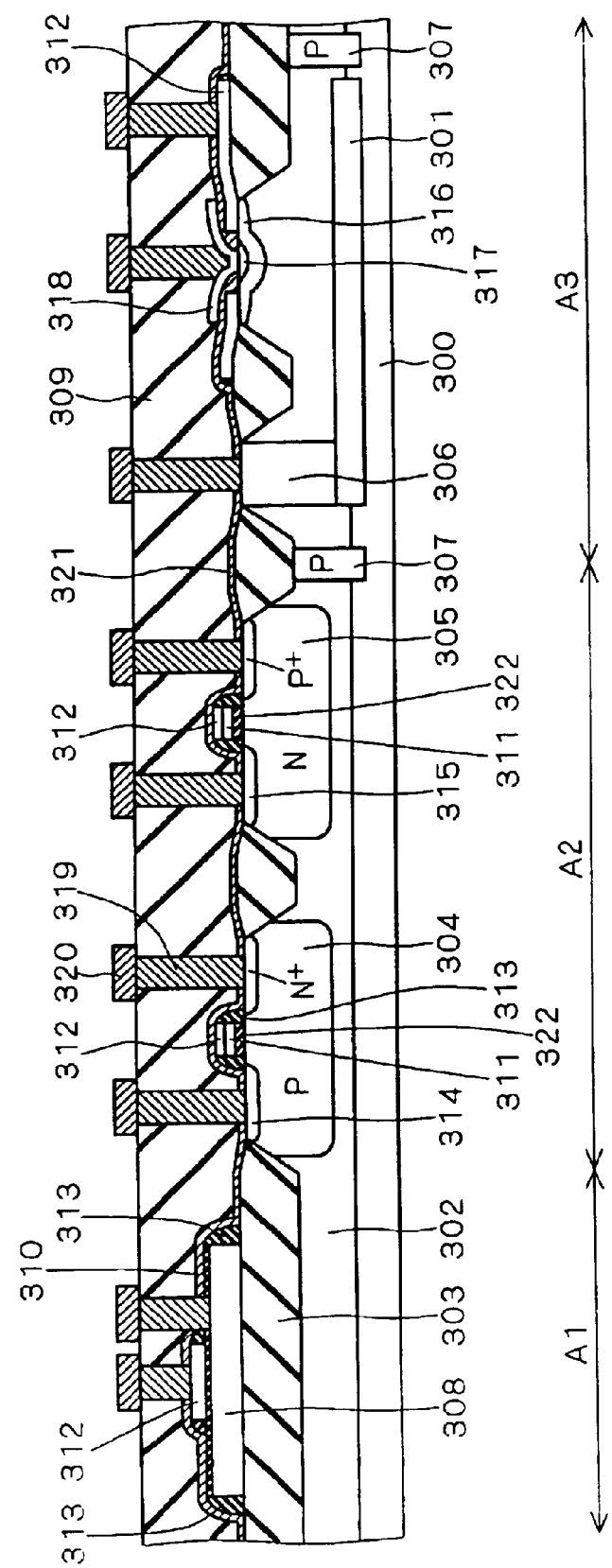

As shown in FIG. 38, contact interlayer insulating film 309 is formed on the entire surface, and after contact holes have been formed on one portion of upper-layer electrode-use polysilicon layer 312 and lower-layer electrode-use polysilicon layer 308 of capacitor formation area A1, one portion of $N^+$ source-drain regions 314 and $P^+$ source-drain regions 315 of CMOS formation area A2, one portion of upper-layer electrode-use second polysilicon layer 312 of bipolar transistor formation area A3, one portion of collector wall 306 and one portion of polysilicon emitter electrode 318, these holes are sealed with tungsten plugs 319, and aluminum wiring 320 is formed on contact interlayer insulating film 309 in a manner so as to electrically connect to tungsten plugs 319; thus, it is possible to obtain a semiconductor device 3 shown in FIG. 25. Here, a contact hole that also penetrates nitride film 310 is formed on one portion of lower-layer electrode-use polysilicon layer 308.

In this manner, when compared with normal BiCMOS processes, the semiconductor device 3 of the third embodiment makes it possible to fabricate capacitor C3 in a BiCMOS structure by adding only the lower-layer electrode-use mask for providing the lower-layer electrode structure shown in FIG. 31 thereto.

Moreover, in the same manner as semiconductor devices of the first and second embodiments, in semiconductor device 3 of the third embodiment, the application of nitride film 310 as a dielectric film makes it possible to increase a capacitance value per unit area, and consequently to provide a structure that is free from voltage dependency.

As described above, semiconductor device 3 of the third embodiment makes it possible to provide a BiCMOS structure which increases a capacitance value per unit area while reducing the manufacturing costs to the minimum required, and is free from voltage dependency.

Moreover, polysilicon, which is free from degradation in the characteristics such as deformation even when processed at a high temperature of not less than 500° C., is used as the composition material of upper-layer electrode-use first polysilicon layer 312; therefore, even when upper-layer electrode-use polysilicon layer 312 is used as one portion of the gate electrodes of NMOS transistor Q31 and PMOS transistor Q32, it is possible to maintain superior electrical properties in MOS transistors Q31, Q32. In the same manner, when upper-layer electrode-use polysilicon layer 312 is used as the base electrode of bipolar transistor T3, it is possible to maintain superior electrical properties in bipolar transistor T3.

Moreover, in semiconductor device 3 of the third embodiment, since the upper-layer electrode of capacitor C3 can consist of the upper-layer electrode-use polysilicon layer 312 formed in a single layer structure, it is possible to make the step difference between the upper-layer electrode and the lower-layer electrode comparatively smaller, and consequently to make the upper-layer electrode less susceptible to the generation of residues.

In the third embodiment, although nitride film 310 is used as the dielectric film, any material may be used, as long as it is a dielectric material having a dielectric constant higher than that of the oxide film.

Moreover, a dielectric film having a laminated structure such as a double layer structure of $SiO_2/SiN$ or a triple layer structure of $SiO_2/SiN/SiO_2$ may be formed. When the dielectric film is formed in a laminated structure, it becomes possible to obtain improved reliability such as longer service life of the capacitor.

<Fourth Embodiment>

Figure 39:
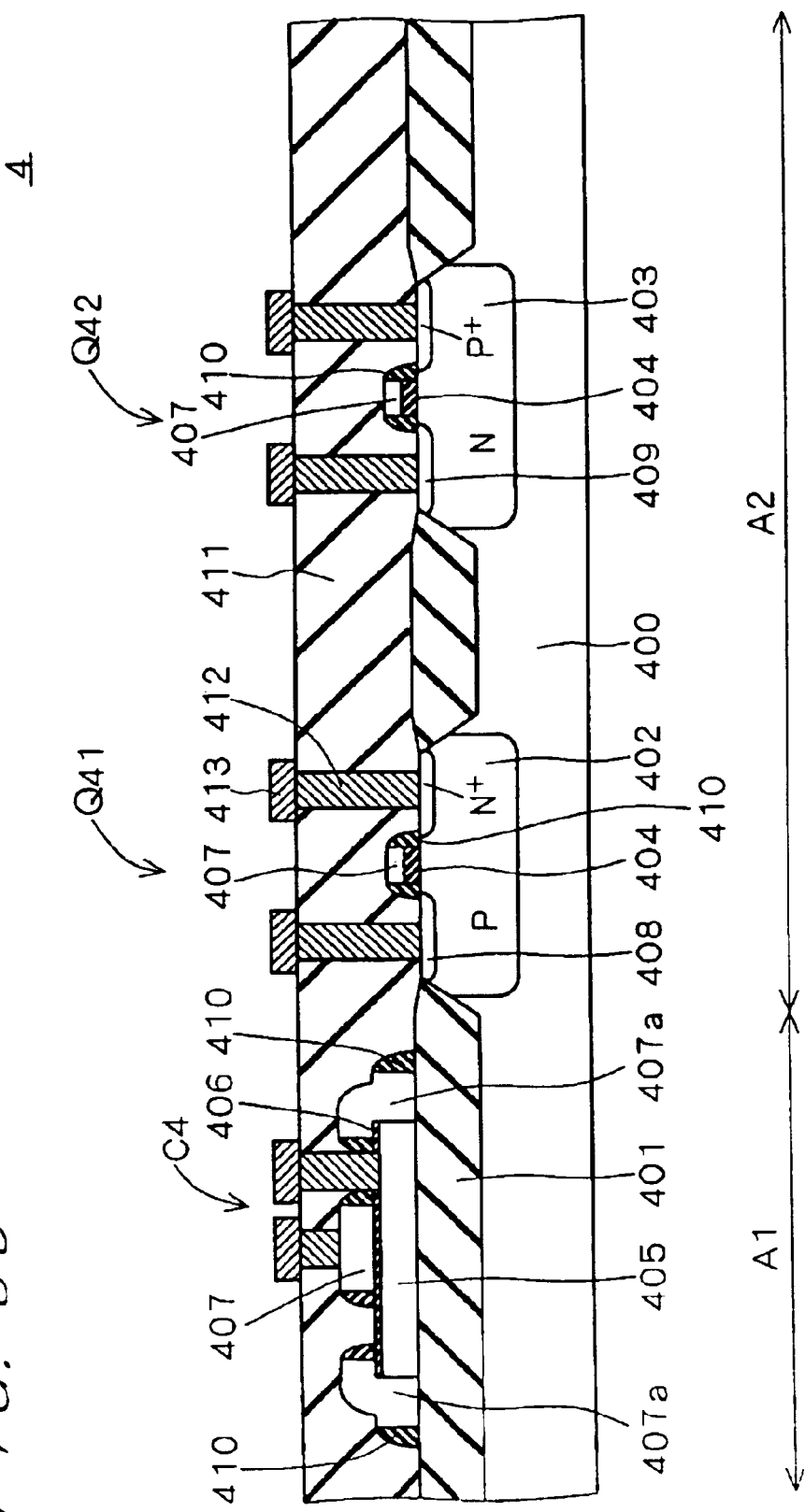
FIG. 39 is a cross-sectional view that shows a structure of a semiconductor device in accordance with a fourth embodiment of the present invention.

FIG. 39 is a cross-sectional view showing a structure of a semiconductor device 4 having a CMOS structure which has a capacitor that is the fourth embodiment of the present invention.

As shown in this Figure, in a semiconductor device 4, a capacitor C4 is fabricated in a capacitor formation area A1, and an NMOS transistor Q41 and a PMOS transistor Q42 are fabricated in a CMOS formation area A2 on a silicon substrate 400.

NMOS transistor Q41 and PMOS transistor Q42 are element-separated by a LOCOS oxide film 401 formed on an upper layer portion of a silicon substrate 400, and capacitor C4, which is formed on LOCOS oxide film 401, is element-separated from MOS transistors Q41, Q42 on CMOS formation area A2.

In capacitor formation area A1, capacitor C4 is constituted by a lower-layer electrode-use polysilicon layer 405 (lower layer electrode), a nitride film 406 (dielectric film) and an upper-layer electrode-use polysilicon layer 407 (upper layer electrode) that are formed on LOCOS oxide film 401. In this case, lower-layer electrode-use polysilicon layer 405 and nitride film 406 are formed as the same plane pattern.

Moreover, an assisting layer 407a, formed by the same composition material as upper-layer electrode-use polysilicon layer 407, is formed from the side face of lower-layer electrode-use polysilicon layer 405 to the end portion of nitride film 406 so as to remove generated residues. Moreover, a frame-forming TEOS oxide film 410 is formed on side faces of lower-layer electrode-use polysilicon layer 405 and upper-layer electrode-use polysilicon layer 407.

In CMOS formation area A2, NMOS transistor Q41 is formed on a P-well region 402, and PMOS transistor Q42 is formed on an N-well region 403.

An $N^+$ source-drain region 408 is selectively formed within the surface of P-well region 402, and gate oxide film 404 and upper-layer electrode-use polysilicon layer 407 are formed on the surface of a P-well region 402 between $N^+$ source-drain regions 408. Therefore, an NMOS transistor Q41, constituted by P-well region 402, $N^+$ source-drain regions 408 and gate oxide film 404, is formed with upper-layer electrode-use polysilicon layer 407 serving as a gate electrode.

Here, $P^+$ source-drain regions 409 are selectively formed within the surface of N-well region 403, and gate oxide film 404 and upper-layer electrode-use polysilicon layer 407 are formed on the surface of N-well region 403 between $P^+$ source-drain regions 409. Therefore, PMOS transistor Q42, constituted by N-well region 403, $P^+$ source-drain regions 409 and gate oxide film 404, is formed with upper-layer electrode-use polysilicon layer 407 serving as a gate electrode.

A contact interlayer-insulating film 411 is formed in a manner so as to cover the entire surface of silicon substrate 400 including capacitor C4, NMOS transistor Q41, PMOS transistor Q42.

Here, a tungsten plug 412 is formed in a penetrating manner through contact interlayer insulating film 411 so as to electrically connect to one portion of the surface of upper-layer electrode-use polysilicon layer 407 of capacitor C4, one portion of the surface of $N^+$ source-drain regions 408, one portion of the surface of $N^+$ source-drain regions 408 and one portion of the surface of $P^+$ source-drain regions 409.

Moreover, tungsten plug 412 is formed in a penetrating manner through contact interlayer insulating film 411 and nitride film 406 so as to electrically connect to one portion of the surface of lower-layer electrode-use polysilicon layer 405 of capacitor C4. Furthermore, aluminum wiring 413 is formed in a manner so as to electrically connect to tungsten plug 412 on contact interlayer insulating film 411.

FIGS. 40 to 48 are cross-sectional views showing a manufacturing method of semiconductor device 4 in accordance with the fourth embodiment. Referring to these Figures, the following description will discuss the manufacturing method of the fourth embodiment.

Figure 40:
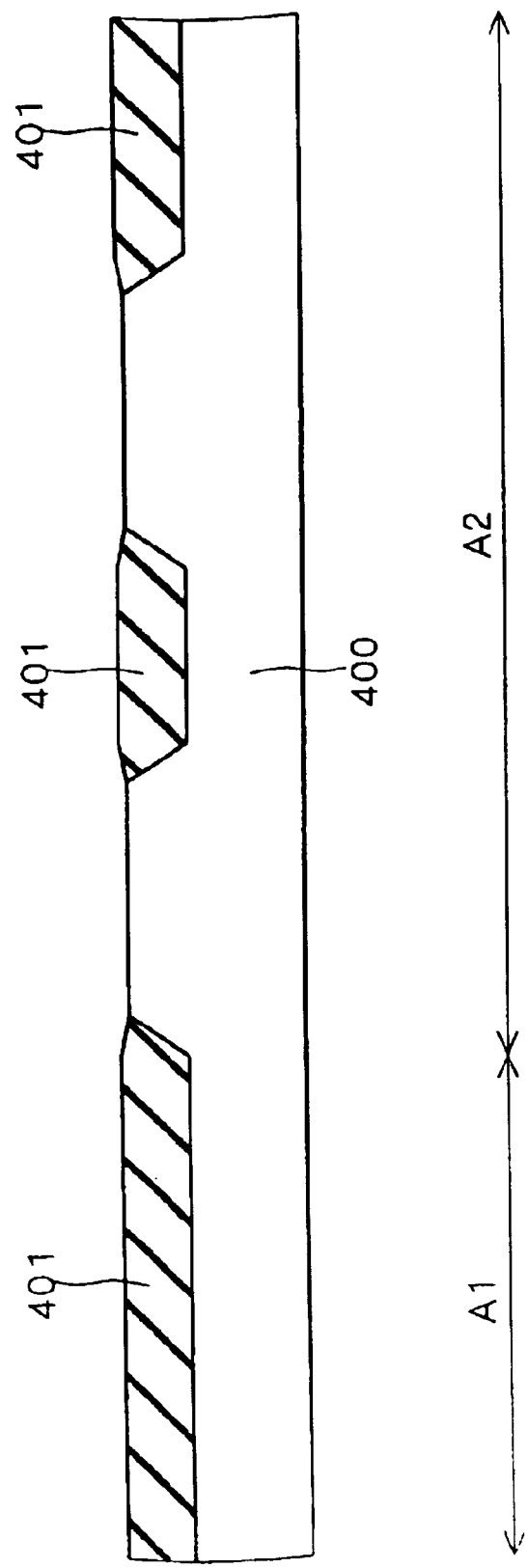
FIGS. 40 to 48 are cross-sectional views that show the manufacturing method of the semiconductor device in accordance with the fourth embodiment.

First, as shown in FIG. 40, LOCOS oxide film 401 is selectively formed on the upper-layer portion of silicon substrate 400.

Figure 41:
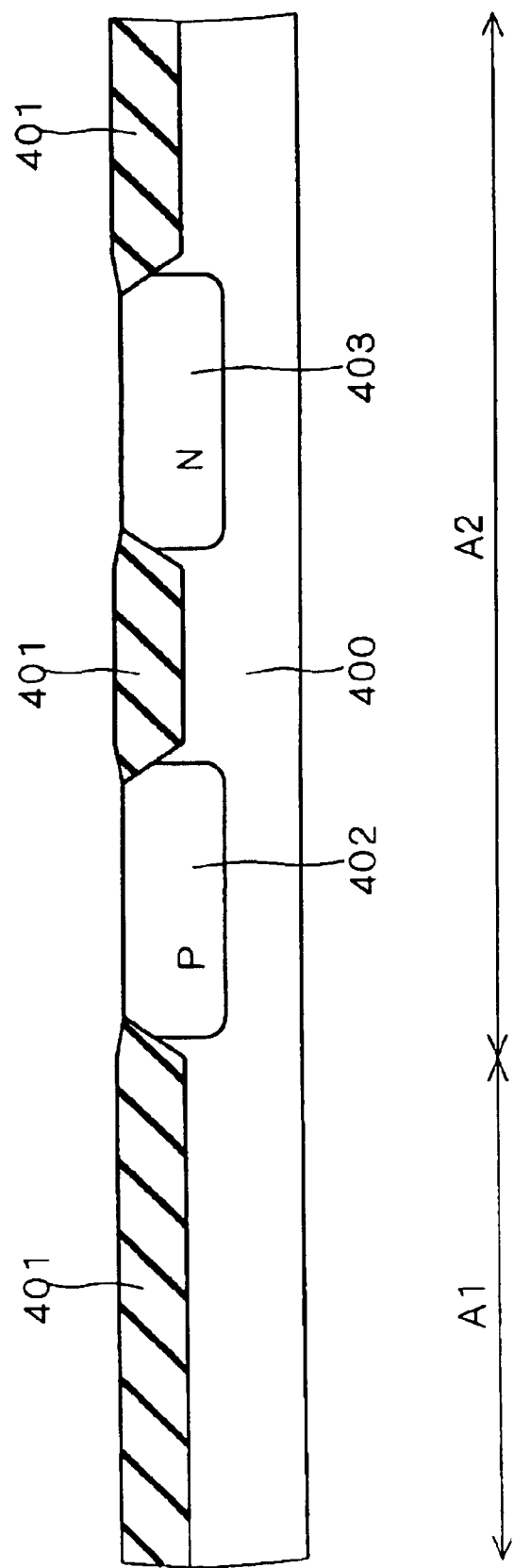

Next, as shown in FIG. 41, P-well region 402 and N-well region 403 are selectively formed on the upper-layer portion of CMOS formation area A2 in silicon substrate 400.

Figure 42:
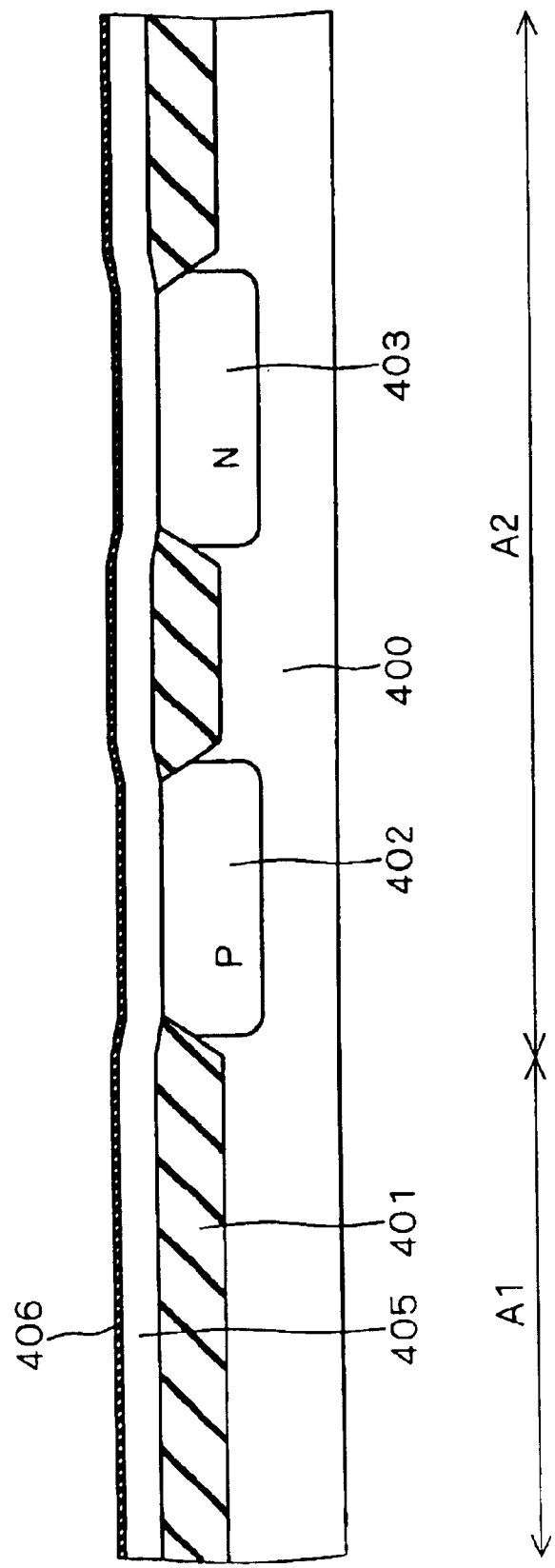

Then, as shown in FIG. 42, a lower-layer electrode-use polysilicon layer 405 made of doped polysilicon is deposited on the entire surface through a CVD method or the like, and a nitride film 406, serving as a single-layer dielectric film, is formed on lower-layer electrode-use polysilicon layer 405. Here, lower-layer electrode-use polysilicon layer 405 may be doped by ion injection or amorphous silicon may be formed in place of doped silicon.

Figure 43:
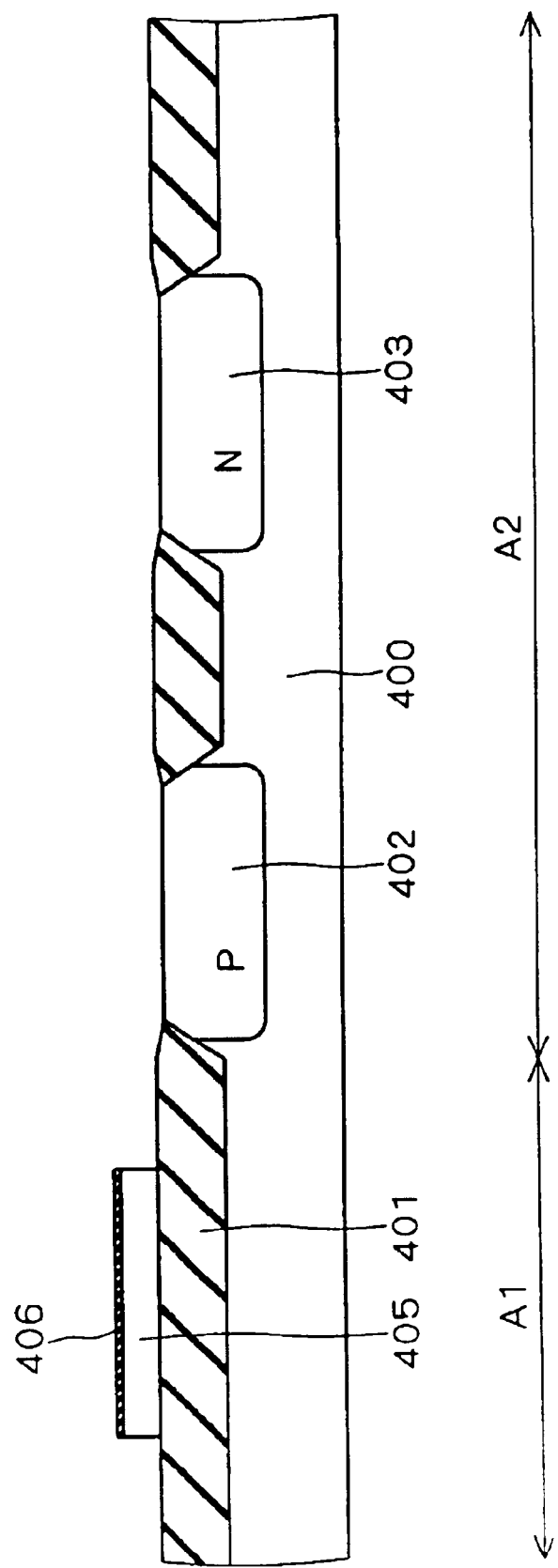

Next, as shown in FIG. 43, by selectively etching lower-layer electrode-use polysilicon layer 405 and nitride film 406 using a lower-layer electrode-use mask, not shown, lower-layer electrode-use polysilicon layer 405 and nitride film 406 are selectively allowed to remain on only capacitor formation area A1. Consequently, lower-layer electrode-use polysilicon layer 405 and nitride film 406 are formed as the same plane pattern. Lower-layer electrode-use polysilicon layer 405 and nitride film 406, thus patterned, are respectively allowed to form a lower-layer electrode and a dielectric film of capacitor C4.

Figure 44:
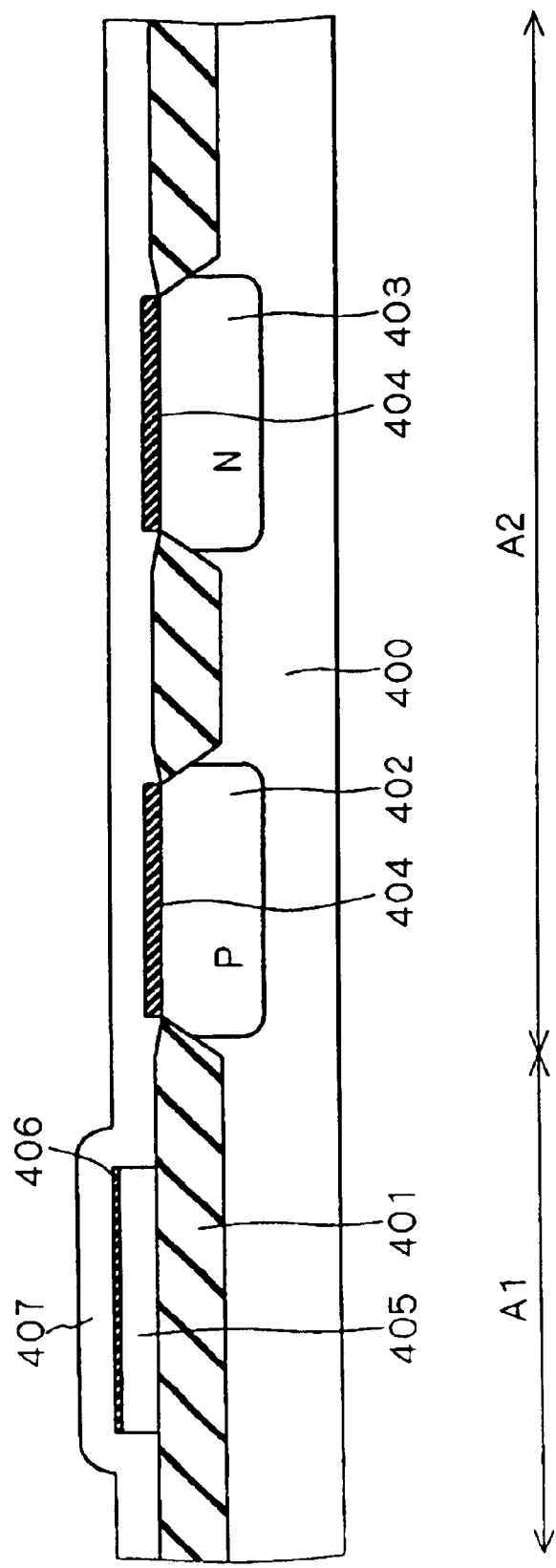

Successively, as shown in FIG. 44, after gate oxide films 404 have been respectively formed on P-well region 402 and N-well region 403, upper-layer electrode-use polysilicon layer 407 made of doped polysilicon is deposited on the entire surface by a CVD method or the like. Here, upper-layer electrode-use polysilicon layer 407 may be doped through ion injection, or amorphous silicon may be formed in place of doped silicon.

Figure 45:
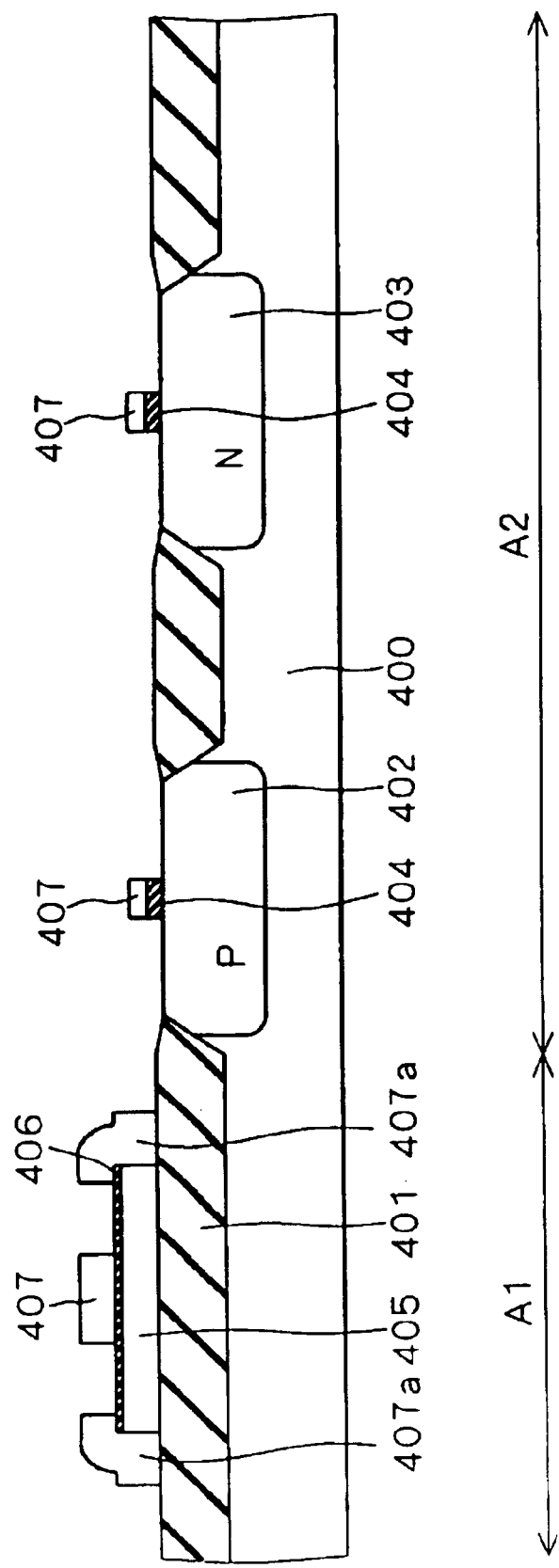

Then, as shown in FIG. 45, upper-layer electrode-use polysilicon layer 407 is patterned on one portion of nitride film 406 of capacitor formation area A1, by selectively etching upper-layer electrode-use polysilicon layer 407 and gate oxide film 404 (only CMOS formation area A2) using a mask used for commonly forming upper-layer electrode and gate electrode, not shown, and gate oxide film 404 and upper-layer electrode-use polysilicon layer 407 of CMOS formation area A2 are patterned.

Consequently, it becomes possible to simultaneously form the upper-layer electrode of capacitor C4 derived from upper-layer electrode-use polysilicon layer 407 and gate electrodes of NMOS transistor Q41 and PMOS transistor Q42 derived from upper-layer electrode-use polysilicon layer 407.

Next, as shown in FIG. 45, one portion of upper-layer electrode-use polysilicon layer 407 is allowed to remain from the side face of lower-layer electrode-use polysilicon layer 405 to the edge of nitride film 406 as an assisting layer 407a. The existence of this assisting layer 407a makes it possible to effectively suppress the generation of residues of upper-layer electrode-use polysilicon layer 407 that are caused by a step difference between the upper-layer electrode-use polysilicon layer 407 and lower-layer electrode-use polysilicon layer 405, and tend to be generated on the peripheral area of lower-layer electrode-use polysilicon layer 405.

Figure 46:
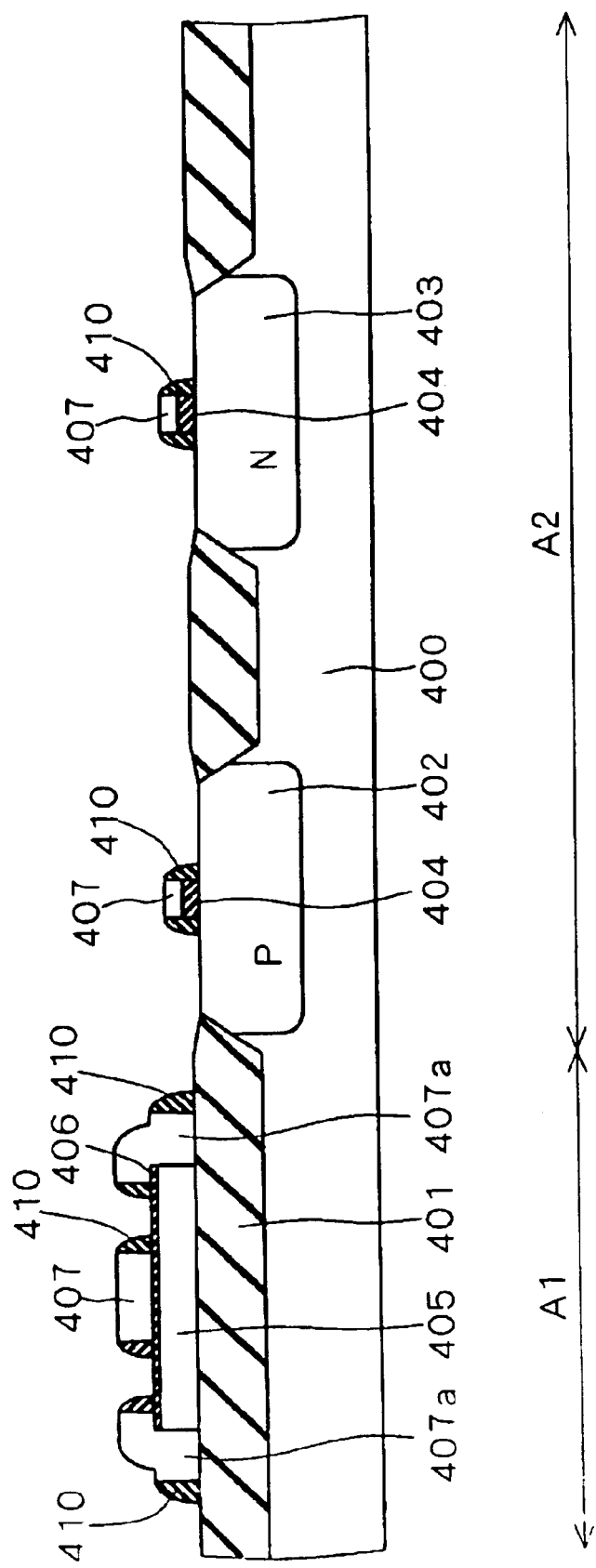

Next, as shown in FIG. 46, after frame-forming TEOS oxide film 410 has been deposited over the entire surface, the entire surface is subjected to an etch back process so that frame-forming TEOS oxide film 410 is allowed to remain as side walls on side faces of lower-layer electrode-use polysilicon layer 405 and upper-layer electrode-use polysilicon layer 407 (assisting layer 407a) of capacitor formation area A1 and side faces of gate oxide film 404 and upper-layer electrode-use polysilicon layer 407 of CMOS formation area A2. Here, prior to the formation of side walls, a diffusion region for source-drain regions may be formed.

Figure 47:
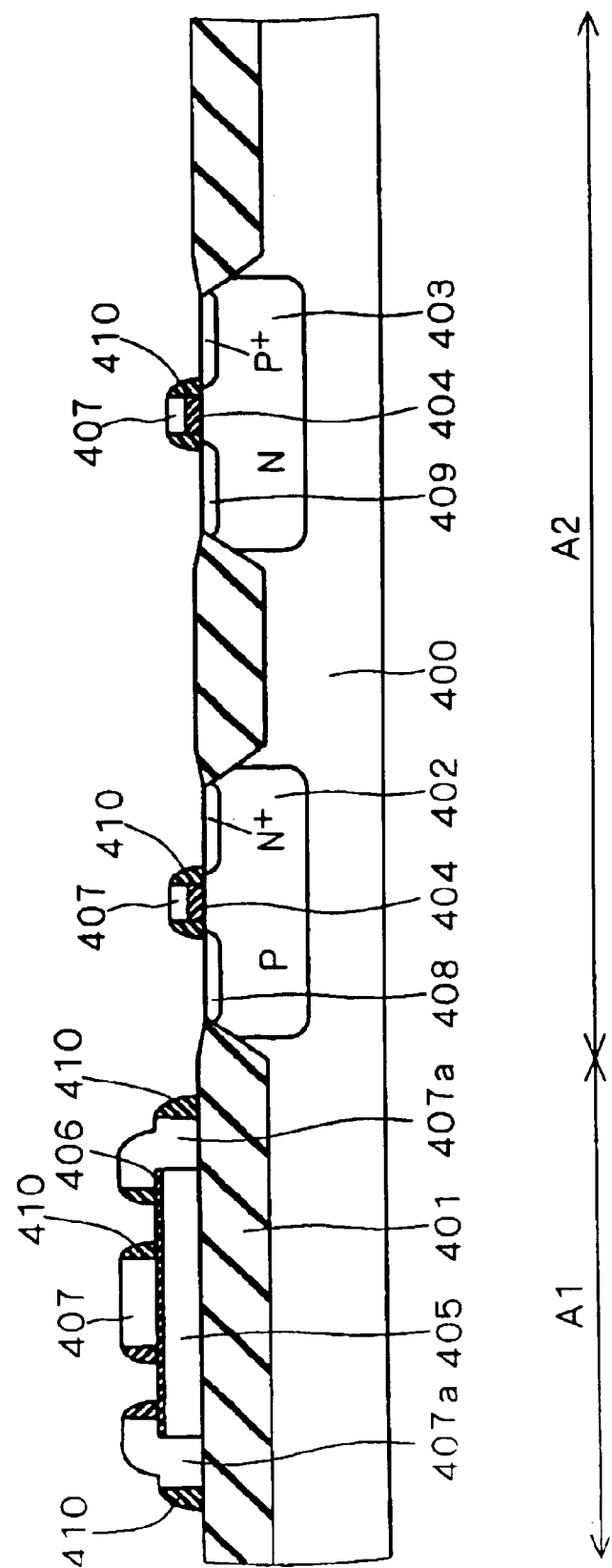

Successively, as shown in FIG. 47, in respective P-well region 402 and N-well region 403, impurities of N-type and P-type are injected therein by using upper-layer electrode-use polysilicon layer 407 and frame-forming TEOS oxide film 410 formed on its side as masks so that $N^+$ source-drain regions 408 and $P^+$ source-drain region 409 are respectively formed within the surfaces of P-well region 402 and N-well region 403.

Figure 48:
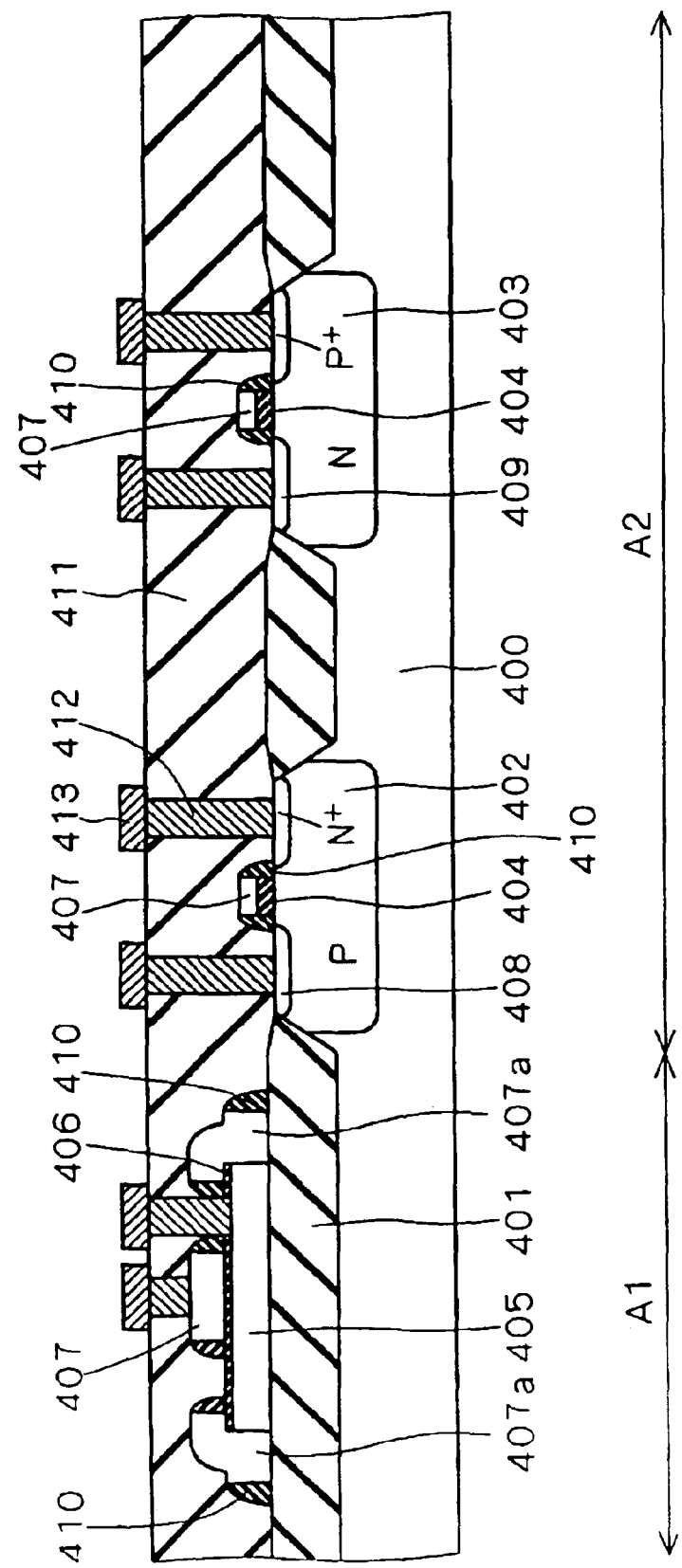

As shown in FIG. 48, a contact interlayer insulating film 411 is formed on the entire surface, and after contact holes have been formed on one portion of upper-layer electrode-use polysilicon layer 407 and lower-layer electrode-use polysilicon layer 405 of capacitor formation area A1 and one portion of $N^+$ source-drain regions 408 and $P^+$ source-drain regions 409 of CMOS formation area A2, these holes are sealed with tungsten plugs 412, and aluminum wiring 413 is formed on contact interlayer insulating film 411 in a manner so as to electrically connect to tungsten plugs 412; thus, it is possible to obtain a semiconductor device 4 shown in FIG. 39. Here, a contact hole that also penetrates nitride film 406 is formed on one portion of lower-layer electrode-use polysilicon layer 405.

In this manner, when compared with normal CMOS processes, semiconductor device 4 of the fourth embodiment makes it possible to fabricate capacitor C4 in a CMOS structure by adding only the lower-layer electrode-use mask for providing the lower-layer electrode structure shown in FIG. 43 thereto.

Moreover, in the same manner as semiconductor devices of the first to third embodiments, semiconductor device 4 of the fourth embodiment, the application of nitride film 406 as a dielectric film makes it possible to increase a capacitance value per unit area, and consequently to provide a structure that is free from voltage dependency.

As described above, semiconductor device 4 of the fourth embodiment makes it possible to provide a CMOS structure which increases a capacitance value per unit area while reducing the manufacturing costs to the minimum required, and is free from voltage dependency.

Moreover, polysilicon, which is free from degradation in the characteristics such as deformation even when processed at a high temperature of not less than 500° C., is used as the composition material of upper-layer electrode-use first polysilicon layer 407; therefore, even when upper-layer electrode-use polysilicon layer 407 is used as one portion of the gate electrodes of NMOS transistor Q41 and PMOS transistor Q42, it is possible to maintain superior electrical properties in MOS transistors Q41, Q42.

Moreover, in semiconductor device 4 of the fourth embodiment, since assisting layer 407a made of the same composition material as upper-layer electrode-use polysilicon layer 407 of capacitor formation area A1 is allowed to remain from the side face of lower-layer electrode-use polysilicon layer 405 to edge of nitride film 406, it is possible to effectively suppress the generation of residues of upper-layer electrode-use polysilicon layer 407 caused by step difference between upper-layer electrode-use polysilicon layer 407 and lower-layer electrode-use polysilicon layer 405.

In the fourth embodiment, although nitride film 406 is used as the dielectric film, any material may be used, as long as it is a dielectric material having a dielectric constant higher than that of the oxide film.

Moreover, a dielectric film having a laminated structure such as a double layer structure of $SiO_2/SiN$ or a triple layer structure of $SiO_2/SiN/SiO_2$ may be formed. When the dielectric film is formed in a laminated structure, it becomes possible to obtain improved reliability such as longer service life of the capacitor.

<Fifth Embodiment>

Figure 49:
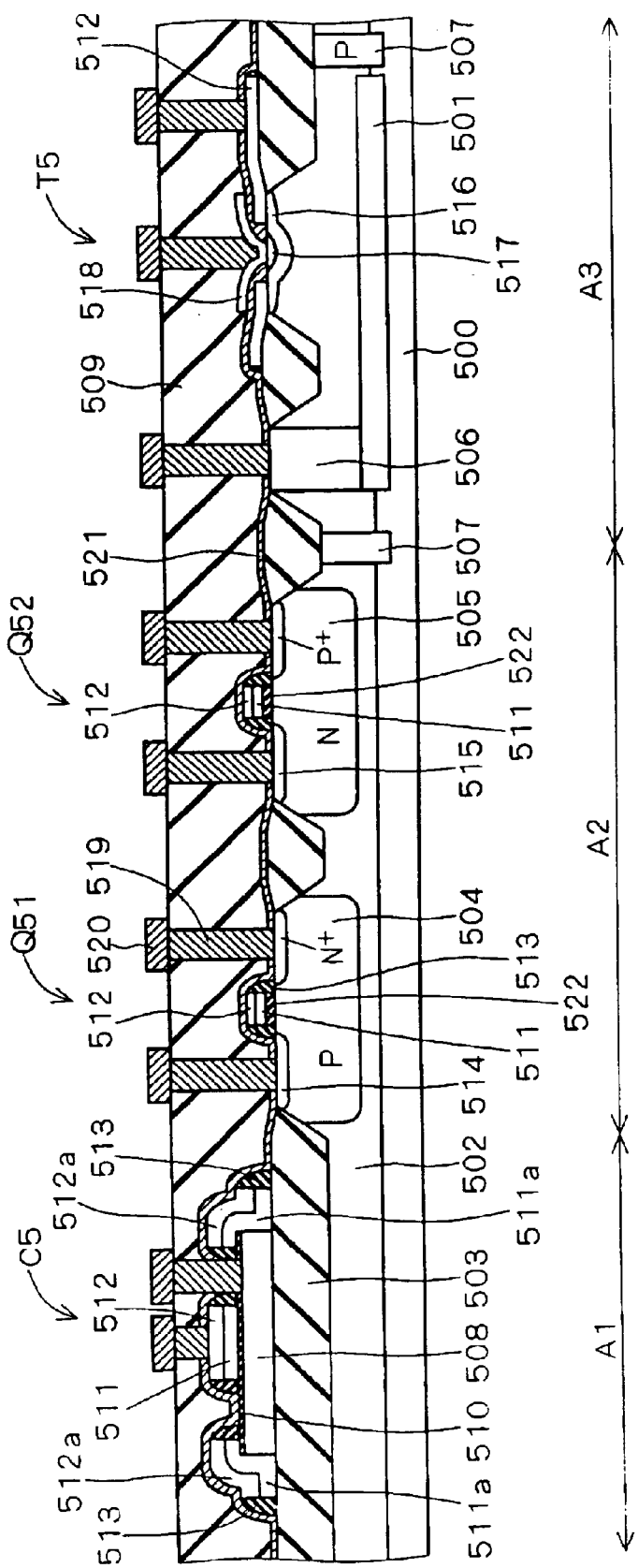
FIG. 49 is a cross-sectional view that shows a structure of a semiconductor device in accordance with a fifth embodiment of the present invention.

FIG. 49 is a cross-sectional view showing a structure of a semiconductor device 5 having a BiCMOS structure which is provided with a capacitor that is the fifth embodiment of the present invention.

As shown in this Figure, in a semiconductor device 5, a capacitor C5 is fabricated in a capacitor formation area A1, an NMOS transistor Q51 and a PMOS transistor Q52 are fabricated in a CMOS formation area A2 in an N-type epitaxial layer 502 formed on a silicon substrate 500, and a bipolar transistor T5 is fabricated in a bipolar transistor formation area A3.

NMOS transistor Q51 and PMOS transistor Q52 are element-separated by a LOCOS oxide film 503 formed on an upper layer portion of N-type epitaxial layer 502, and capacitor C5, which is formed on LOCOS oxide film 503, is element-separated from MOS transistors Q51, Q52 on CMOS formation area A2, and PMOS transistor Q52 and bipolar transistor T5 are element-separated from each other by LOCOS oxide film 503 and a P-type separation-well region 507 located below this.

In capacitor formation area A1, capacitor C5 is constituted by a lower-layer electrode-use polysilicon layer 508 (lower layer electrode), a nitride film 510 (dielectric film) and an upper-layer electrode-use first polysilicon layer 511 as well as an upper-layer electrode-use second polysilicon layer 512 (upper layer electrode). In this case, lower-layer electrode-use polysilicon layer 508 and nitride film 510 are formed as the same plane pattern.

Moreover, assisting layers 511a, 512a, formed by the same composition material as upper-layer electrode-use first polysilicon layer 511 and upper-layer electrode-use second polysilicon layer 512, are formed from the side face of lower-layer electrode-use polysilicon layer 508 to the end portion of nitride film 510 so as to remove generated residues. Moreover, a frame-forming TEOS oxide film 513 is formed on lower-layer electrode-use polysilicon layer 508 as well as side faces of lower-layer electrode-use first polysilicon layer 511 and upper-layer electrode-use second polysilicon layer 512.

In CMOS formation area A2, NMOS transistor Q51 is formed on a P-well region 504, and PMOS transistor Q52 is formed on an N-well region 505.

An $N^+$ source-drain region 514 is selectively formed within the surface of P-well region 504, and gate oxide film 522 and upper-layer electrode-use first polysilicon layer 511 as well as upper-layer electrode-use second layer 512 are formed on the surface of a P-well region 504 between $N^+$ source-drain regions 514. Therefore, an NMOS transistor Q51, constituted by P-well region 504, N⁺ source-drain regions 514 and gate oxide film 522, is formed with upper-layer electrode-use first polysilicon layer 511 and upper-layer electrode-use second polysilicon layer 512 serving as gate electrodes.

Here, P⁺ source-drain regions 515 are selectively formed within the surface of N-well region 505, and gate oxide film 522 and upper-layer electrode-use first polysilicon layer 511 as well as upper-layer electrode-use second polysilicon layer 512 are formed on the surface of N-well region 505 between P⁺ source-drain regions 515. Therefore, a PMOS transistor Q52, constituted by N-well region 505, P⁺ source-drain regions 515 and gate oxide film 522, is formed with upper-layer electrode-use first polysilicon layer 511 and upper-layer electrode-use second polysilicon layer 512 serving as gate electrodes.

In bipolar transistor formation area A3, a floating collector region 501 is formed in a manner so as to be embedded in an interface between silicon substrate 500 and N-type epitaxial layer 502, and a collector wall 506 is formed from one portion of floating collector region 501 to the surface of N-type epitaxial layer 502.

Here, a P-type base diffusion layer 516 is formed on an upper layer portion of N-type epitaxial layer 502 within a bipolar transistor formation area A3, and an emitter diffusion layer 517 is formed within the surface of the center portion of base diffusion layer 516.

Moreover, upper-layer electrode-use second polysilicon layer 512 is formed as a base electrode in contact with one portion of the surface of base diffusion layer 516, and a polysilicon emitter electrode 518 is formed in a manner so as to contact one portion of the surface of emitter diffusion layer 517. Here, upper-layer electrode-use second polysilicon layer 512 and polysilicon emitter electrode 518 are insulated from each other with TEOS oxide film 521 being formed in between.

In this manner, in bipolar transistor formation area A3, a bipolar transistor T5 is constituted by collector wall 506, base diffusion layer 516, emitter diffusion layer 517, upper-layer electrode-use second polysilicon layer 512 (base electrode) and polysilicon emitter electrode 518.

A contact interlayer-insulating film 509 is formed in a manner so as to cover the entire surface of N-type epitaxial layer 502 including a capacitor C5, NMOS transistor Q51, PMOS transistor Q52 and bipolar transistor T5.

Here, a tungsten plug 519 is formed in a penetrating manner through contact interlayer insulating film 509 so as to electrically connect to one portion of the surface of upper-layer electrode-use first polysilicon layer 511 of capacitor C5, one portion of the surface of N⁺ source-drain regions 514, one portion of the surface of P⁺ source-drain regions 515, one portion of upper-layer electrode-use second polysilicon layer 512 of bipolar transistor formation area A3, one portion of the surface of collector wall 506, and one portion of polysilicon emitter electrode 518.

Moreover, a tungsten plug 519 is formed in a penetrating manner through contact interlayer insulating film 509 and nitride film 510 so as to electrically connect to one portion of the surface of lower-layer electrode-use polysilicon layer 508 of capacitor C5. Furthermore, aluminum wiring 520 is formed in a manner so as to electrically connect to tungsten plug 519 on contact interlayer insulating film 509.

FIGS. 50 to 62 are cross-sectional views showing a manufacturing method of semiconductor device 5 in accordance with the fifth embodiment. Referring to these Figures, the following description will discuss the manufacturing method of the fifth embodiment.

Figure 50:
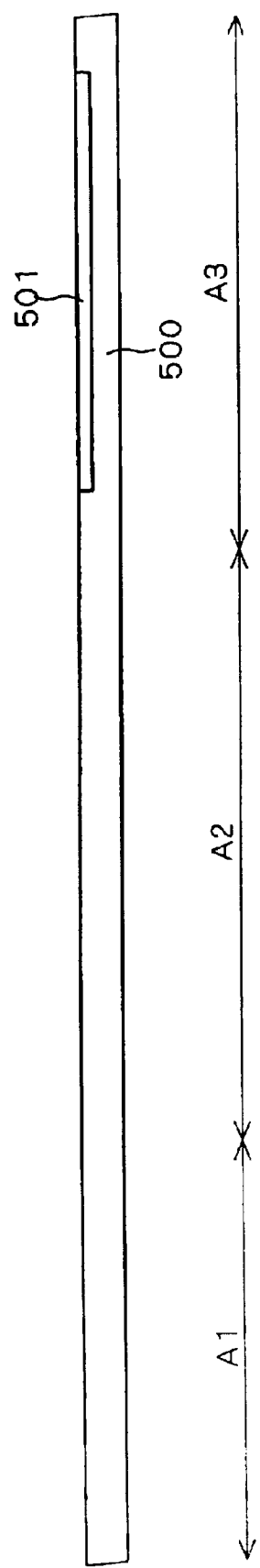
FIGS. 50 to 62 are cross-sectional views that show the manufacturing method of the semiconductor device in accordance with the fifth embodiment.

First, as shown in FIG. 50, antimony (Sb) is injected into a silicon substrate 500 to form an N-type floating collector region 501.

Figure 51:
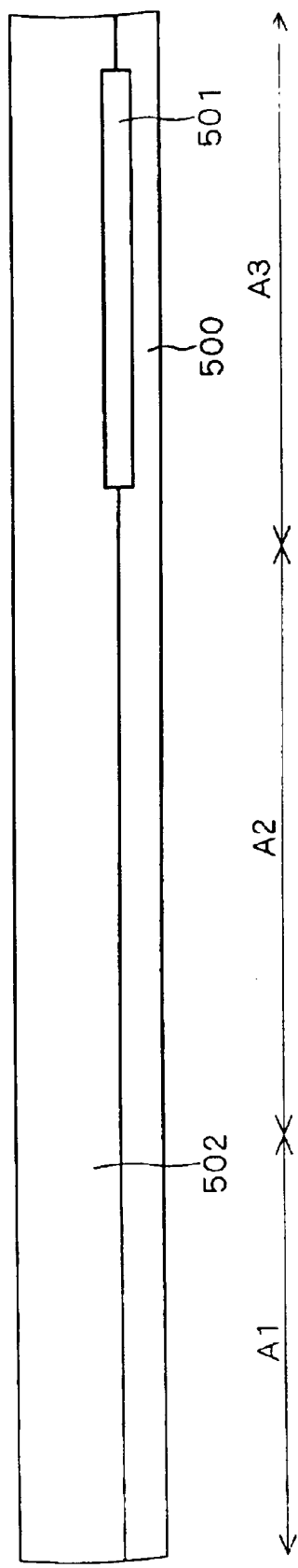

Next, as shown in FIG. 51, an N-type epitaxial layer 502 is formed on silicon substrate 500 including a floating collector region 501 by using an epitaxial growth method. At this time, since N-type impurities of floating collector region 501 are diffused so that one portion of floating collector region 501 is formed also inside N-type epitaxial layer 502.

Figure 52:
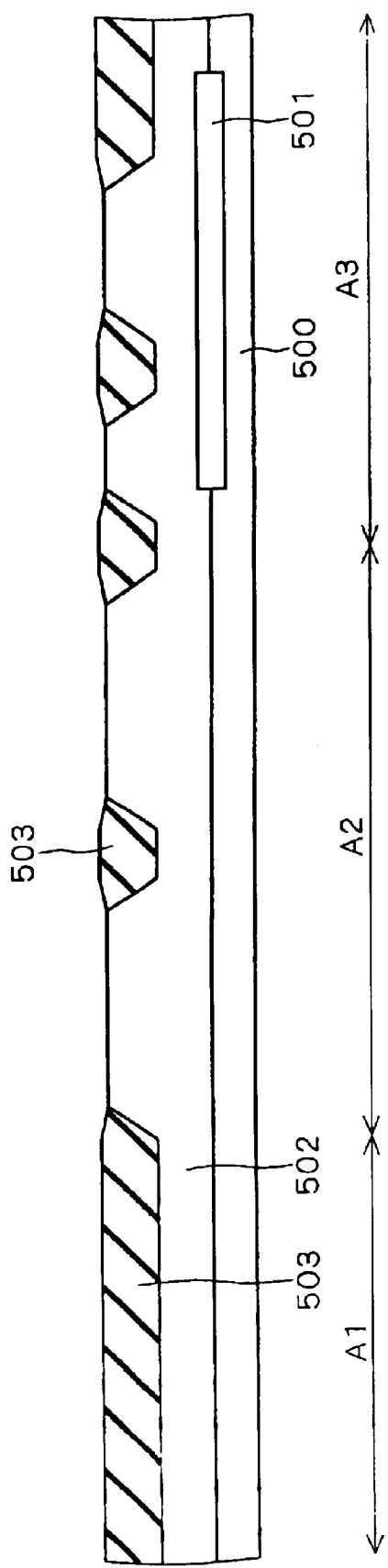

Then, as shown in FIG. 52, LOCOS oxide film 503 is selectively formed on an upper-layer portion of N-type epitaxial layer 502.

Figure 53:
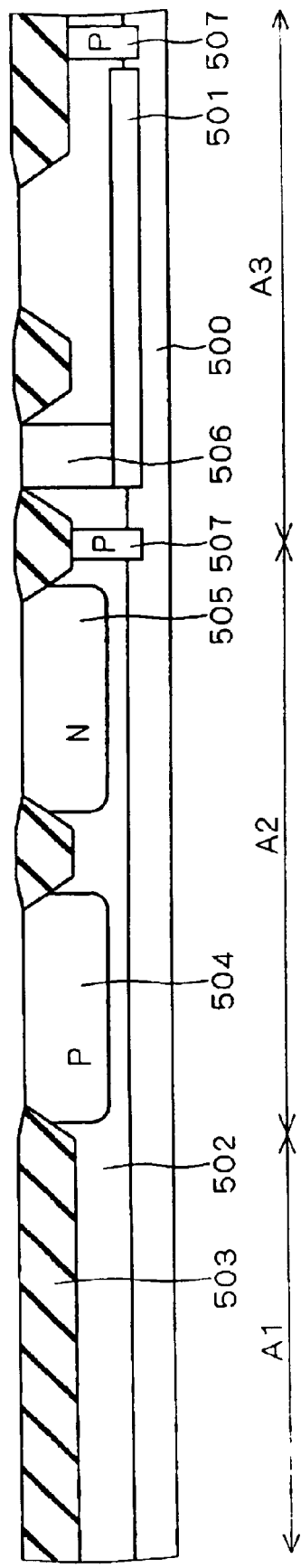

Next, as shown in FIG. 53, P-well region 504 and N-well region 505 are selectively formed on the upper-layer portion of CMOS formation area A2 in N-type epitaxial layer 502.

Moreover, as shown in FIG. 53, a P-type separation well region 507 is formed under LOCOS oxide film 503 in an area close to the border of CMOS formation area A2 and bipolar transistor formation area A3 through ion injection penetrating LOCOS oxide film 503 so that a collector wall 506 extending from the surface of N-type epitaxial layer 502 to floating collector region 501 is formed.

Figure 54:
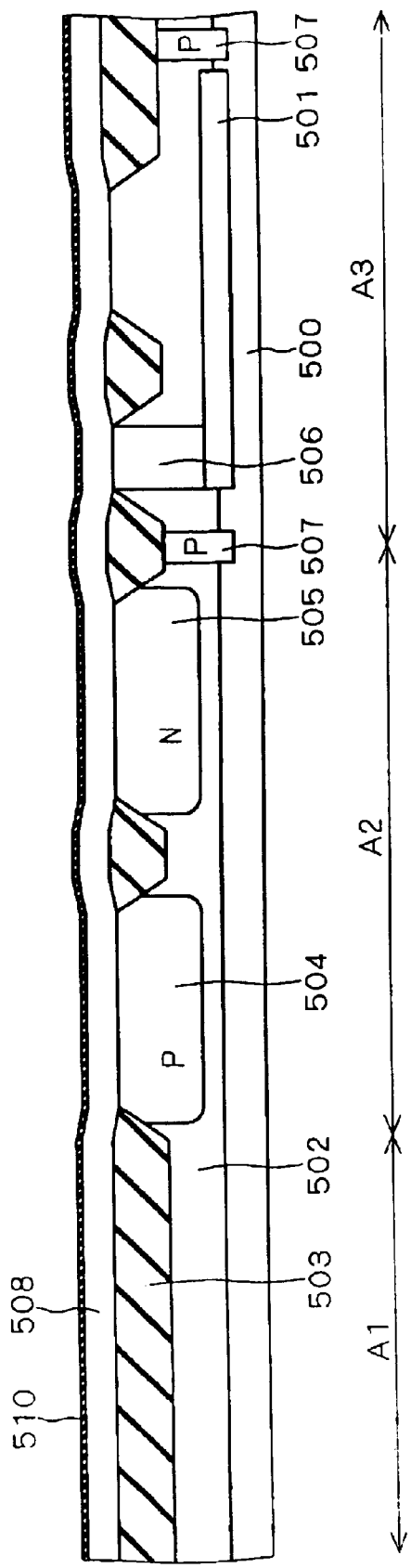

Then, as shown in FIG. 54, a lower-layer electrode-use polysilicon layer 508 having doped polysilicon is deposited on the entire surface through a CVD method or the like, and a nitride film 510, serving as a single-layer dielectric film, is formed on lower-layer electrode-use polysilicon layer 508. Here, lower-layer electrode-use polysilicon layer 508 may be doped by ion injection or amorphous silicon may be formed in place of doped silicon.

Figure 55:
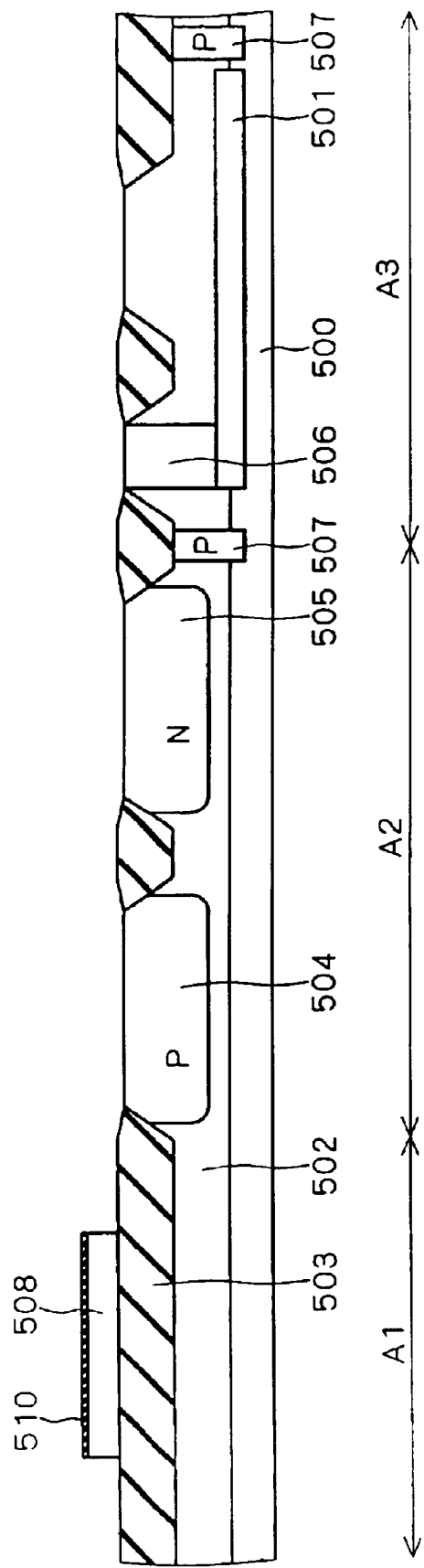

Next, as shown in FIG. 55, by selectively etching lower-layer electrode-use polysilicon layer 508 and nitride film 510 using a lower-layer electrode-use mask, not shown, lower-layer electrode-use polysilicon layer 508 and nitride film 510 are selectively allowed to remain on only capacitor formation area A1. Consequently, lower-layer electrode-use polysilicon layer 508 and nitride film 510 are formed as the same plane pattern. Lower-layer electrode-use polysilicon layer 508 and nitride film 510, thus patterned, are respectively allowed to form a lower-layer electrode and a dielectric film of capacitor C5.

Figure 56:
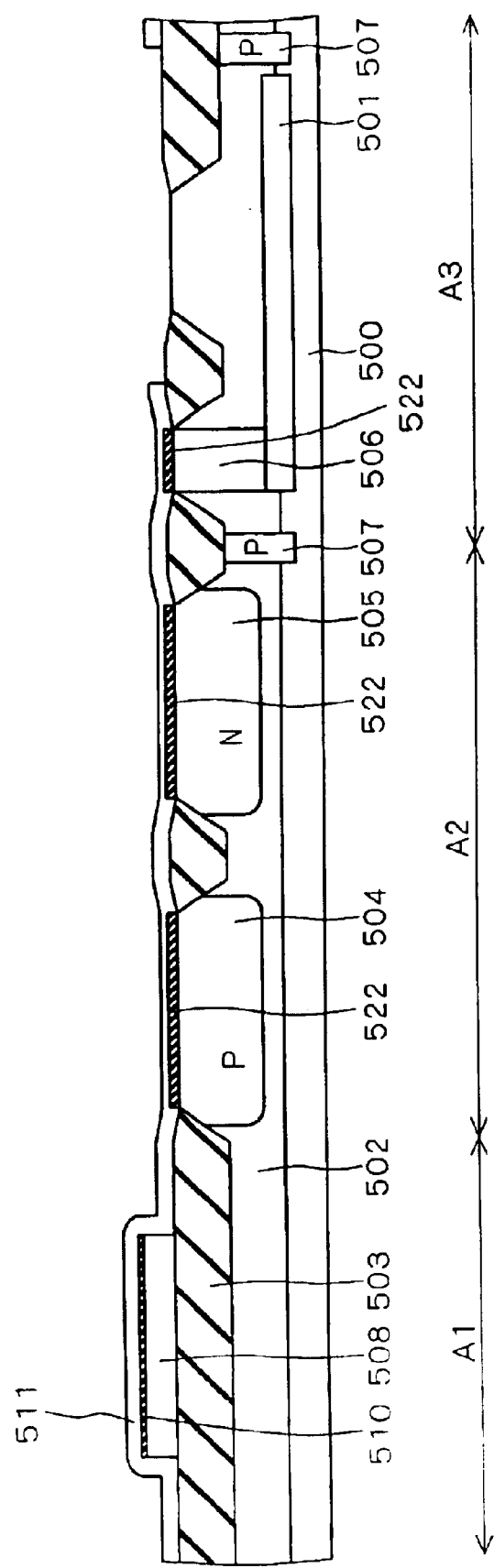

Successively, as shown in FIG. 56, after gate oxide films 522 have been respectively formed on P-well region 504, N-well region 505 and collector wall 506, upper-layer electrode-use first polysilicon layer 511 having doped polysilicon is deposited on the entire surface by a CVD method or the like, and upper-layer electrode-use first polysilicon layer 511 and gate oxide film 522 are etched and removed from most of areas including the surface of N-type epitaxial layer 502 within bipolar transistor formation area A3. Here, upper-layer electrode-use first polysilicon layer 511 may be doped through ion injection or amorphous silicon may be formed in place of doped silicon.

Figure 57:
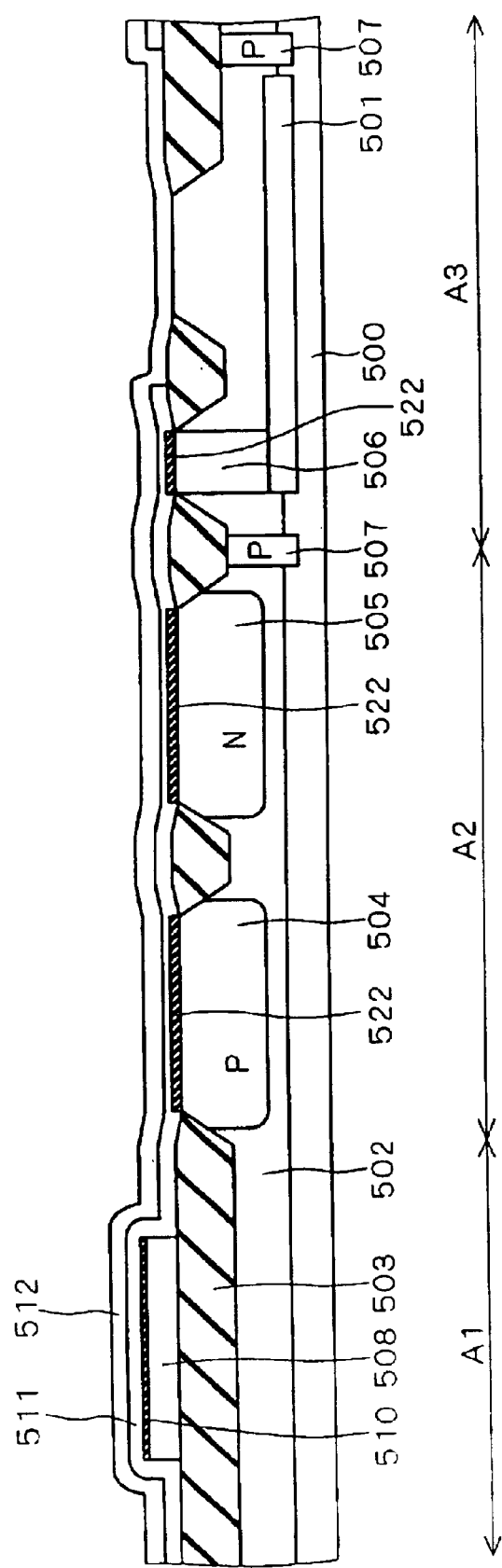

Moreover, as shown in FIG. 57, upper-layer electrode-use second polysilicon layer 512 made of non-doped polysilicon is deposited on the entire surface. Here, amorphous silicon may be formed in place of non-doped polysilicon.

Figure 58:
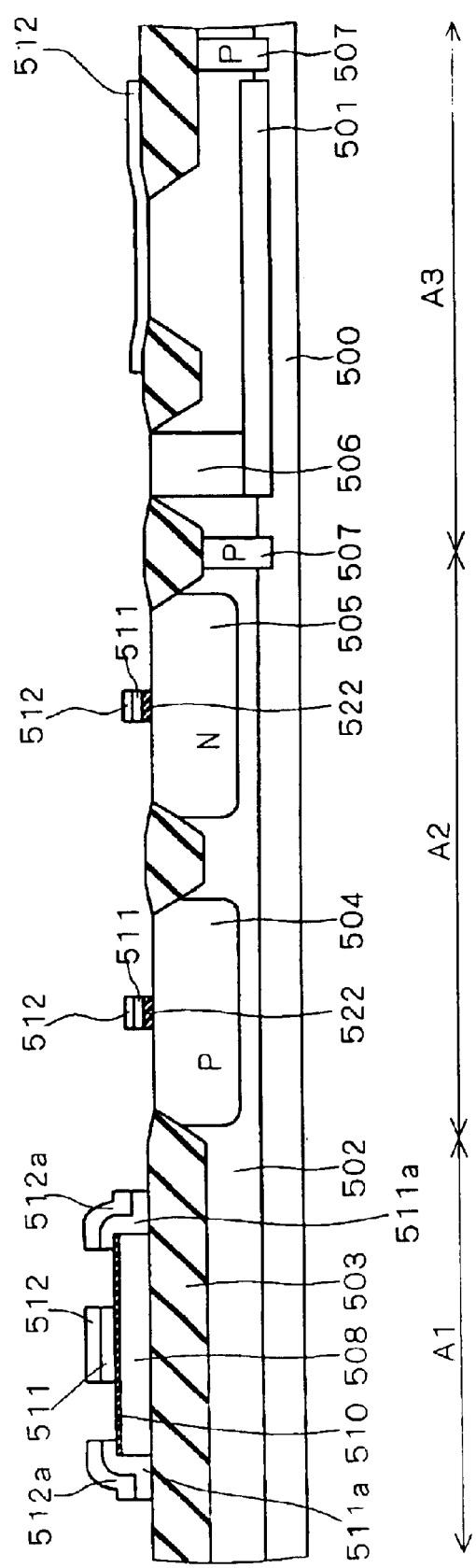

Then, as shown in FIG. 58, upper-layer electrode-use first polysilicon layer 511 (only in capacitor formation area A1 and CMOS formation area A2) and upper-layer electrode-use second polysilicon layer 512 as well as gate oxide film 522 (only in CMOS formation area A2 and bipolar transistor formation area A3) are selectively etched by using an upper-layer electrode, not shown, and a mask used for commonly forming gate electrode and base electrode.

Then, upper-layer electrode-use first polysilicon layer 511 and upper-layer electrode-use second polysilicon layer 512 are patterned on one portion of nitride film 510 of capacitor formation area A1, gate oxide film 522 as well as upper-layer electrode-use first polysilicon layer 511 and upper-layer electrode-use second polysilicon layer 512 of CMOS formation area A2 are patterned, and upper-layer electrode-use second polysilicon layer 512 of bipolar transistor formation area A3 is patterned.

Consequently, it becomes possible to simultaneously form the upper-layer electrode of capacitor C5 derived from upper-layer electrode-use first polysilicon layer 511 and gate electrodes of NMOS transistor Q51 and PMOS transistor Q52 derived from upper-layer electrode-use first polysilicon layer 511 and upper-layer electrode-use second polysilicon layer 512.

Moreover, as shown in FIG. 58, one portion of upper-layer electrode-use first polysilicon layer 511 and upper-layer electrode-use second polysilicon layer 512 are allowed to remain as assisting layers 511a, 512a from the side face of lower-layer electrode-use polysilicon layer 508 to the end portion of nitride film 510. The existence of these assisting layers 512a makes it possible to effectively suppress the generation of residues of upper-layer electrode-use first polysilicon layer 511 and upper-layer electrode-use second polysilicon layer 512 that are caused by a step difference between the upper-layer electrode-use first polysilicon layer 511 as well as upper-layer electrode-use second polysilicon layer 512 and lower-layer electrode-use polysilicon layer 508.

Figure 59:
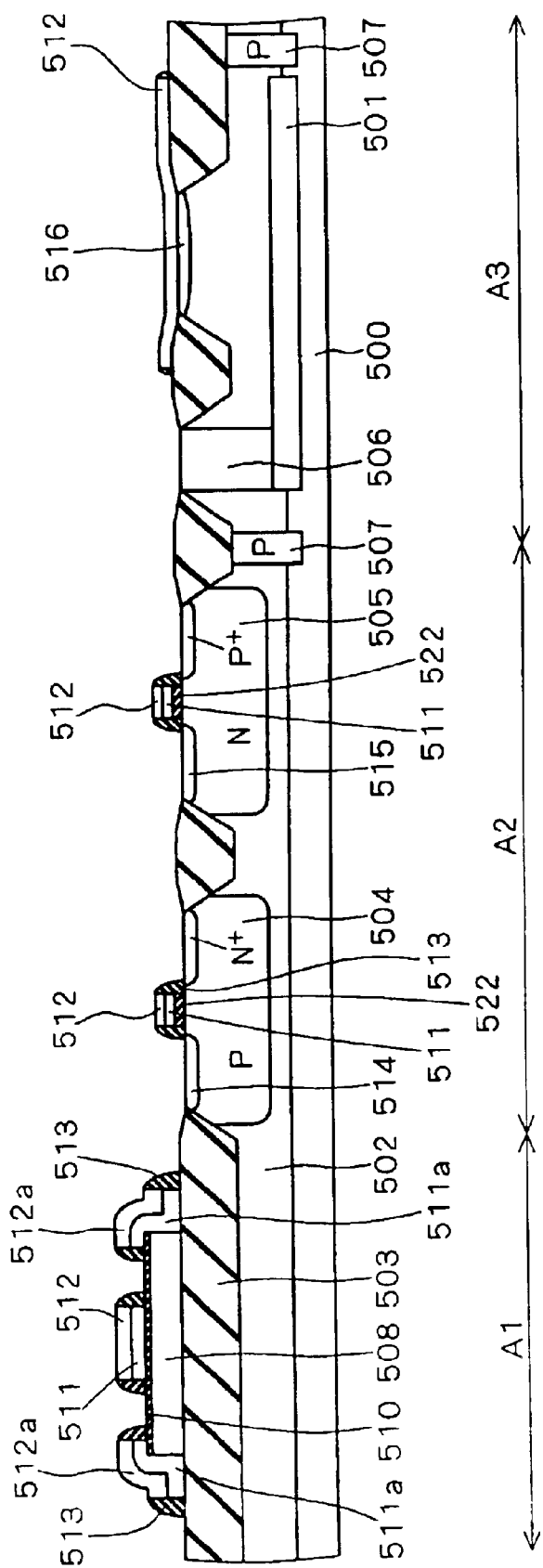

Next, as shown in FIG. 59, after having deposited frame-forming TEOS oxide film 513 over the entire surface, the entire surface is subjected to an etch back process so that frame-forming TEOS oxide film 513 is allowed to remain as side walls respectively on lower-layer electrode-use polysilicon layer 508 and the side faces of upper-layer electrode-use first polysilicon layer 511(assisting layer 511a) and upper-layer electrode-use second polysilicon layer 512 (assisting layer 512a) of capacitor formation area A1, on gate oxide film 522 and the side faces of upper-layer electrode-use first polysilicon layer 511 and upper-layer electrode-use second polysilicon layer 512 of CMOS formation area A2, and on the side faces of upper-layer electrode-use second polysilicon layer 512 of bipolar transistor formation area A3.

Moreover, as shown in FIG. 59, with respect to P-well region 504 and N-well region 505, impurities of N-type and P-type are injected therein by using frame-forming TEOS oxide films 513 formed on upper-electrode-use first polysilicon layer 511 and the side faces thereof as masks so that N+ source-drain regions 514 and P+ source-drain regions 515 are respectively formed within the surface of P-well region 504 and N-well region 505.

As shown in FIG. 59, in bipolar transistor formation area A3, a diffusion process is carried out by using upper-layer electrode-use second polysilicon layer 512 as a diffusion source so that a base diffusion layer 516 is formed in the surface of N-type epitaxial layer 502. Here, base diffusion layer 516 may be formed by injecting ions of P-type into the surface of N-type epitaxial layer 502 through upper-layer electrode-use second polysilicon layer 512.

Figure 60:
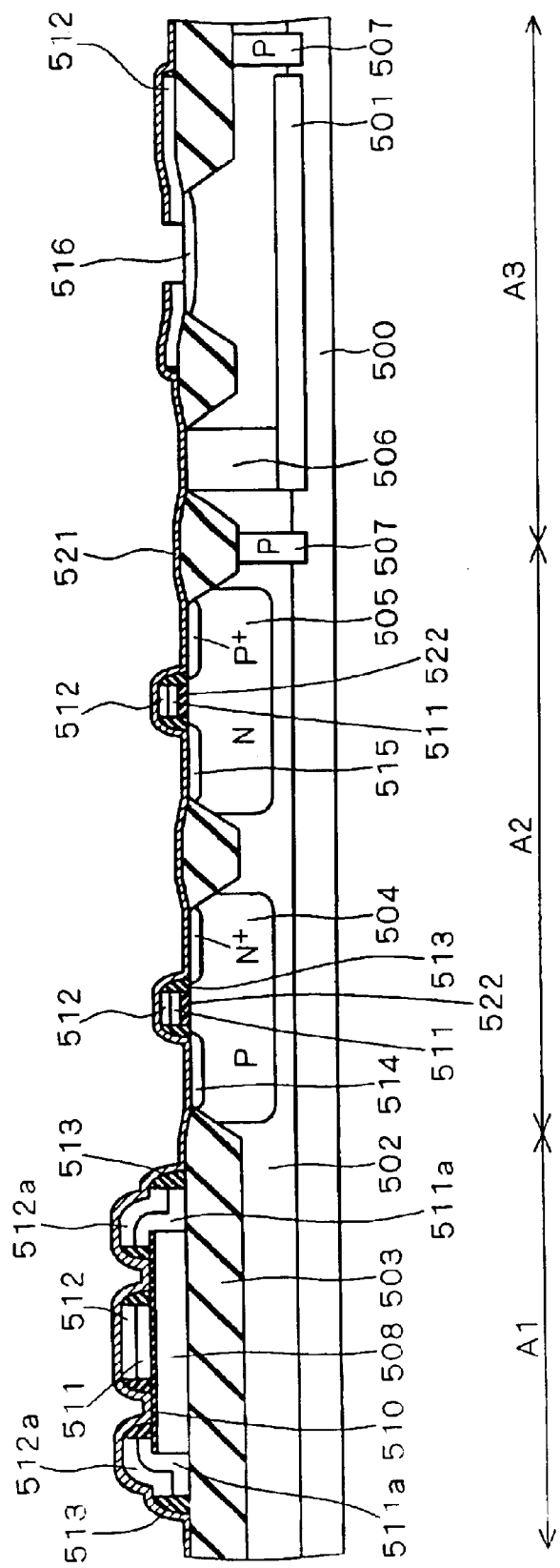

Next, as shown in FIG. 60, after TEOS oxide film 521 has been deposited over the entire surface, the TEOS oxide film 521 and upper-layer electrode-use second polysilicon layer 512, located on the center portion of base diffusion layer 516 of bipolar transistor formation area A3, are selectively removed. The residual upper-layer electrode-use second polysilicon layer 512 forms a base electrode.

Figure 61:
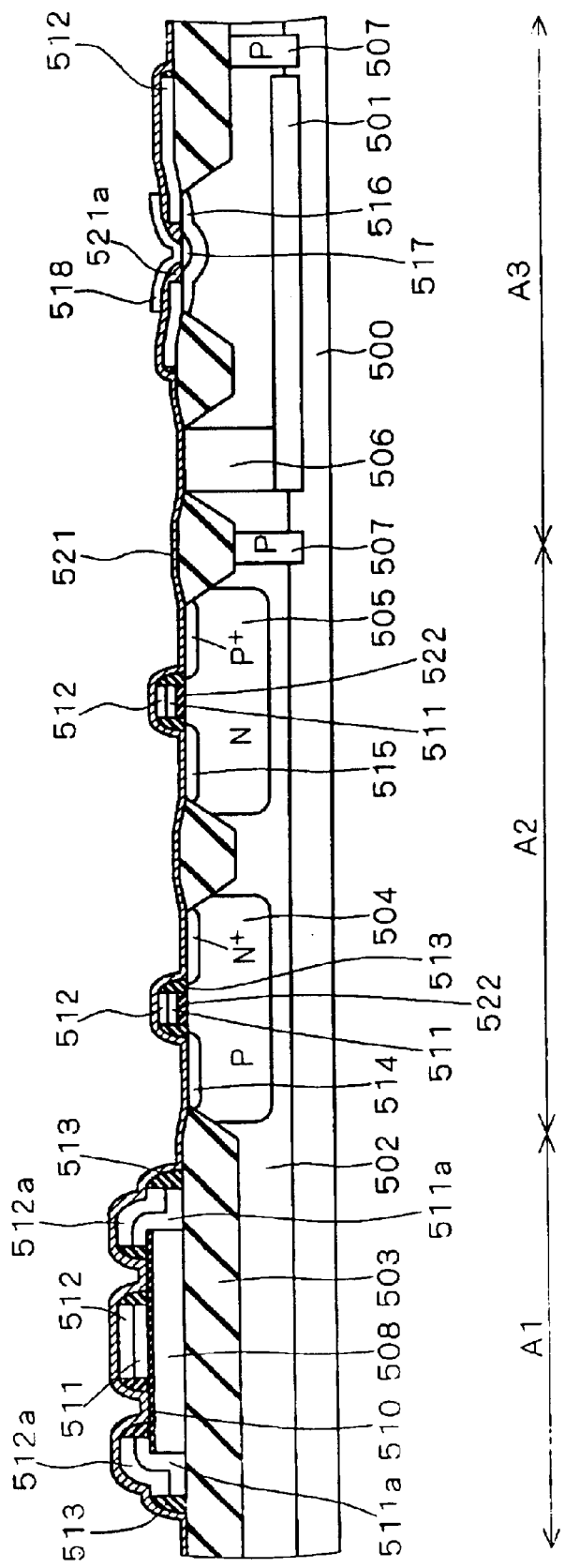

Successively, as shown in FIG. 61, a polysilicon emitter electrode 518 having doped N-type impurities is formed on the surface of base diffusion layer 516 in bipolar transistor formation area A3. In this case, prior to the formation of polysilicon emitter electrode 518, an insulating film 521a, such as a TEOS oxide film, is formed so that an insulating property between polysilicon emitter electrode 518 and upper-layer electrode-use second polysilicon layer 512 is maintained. Moreover, a diffusion process, which uses polysilicon emitter electrode 518 as a diffusion source, is carried out so that emitter diffusion layer 517 is formed on the surface of base diffusion layer 516 right under polysilicon emitter electrode 518. At this time, base diffusion layer 516 is also diffused.

Figure 62:
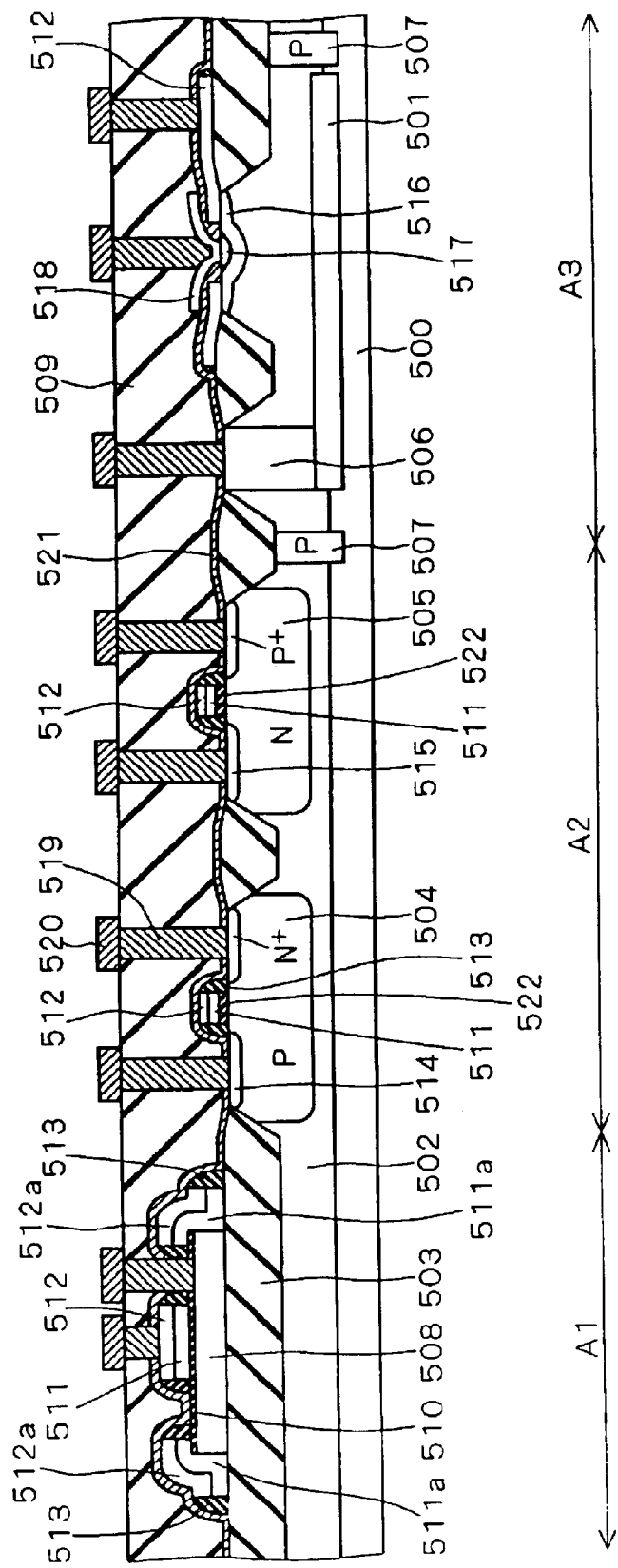

As shown in FIG. 62, contact interlayer insulating film 509 is formed on the entire surface, and after contact holes have been formed on one portion of upper-layer electrode-use second polysilicon layer 512 and lower-layer electrode-use polysilicon layer 508 of capacitor formation area A1, one portion of N+ source-drain regions 514 and P+ source-drain regions 515 of CMOS formation area A2, one portion of upper-layer electrode-use second polysilicon layer 512 of bipolar transistor formation area A3, one portion of collector wall 506 and one portion of polysilicon emitter electrode 518, these holes are sealed with tungsten plugs 519, and aluminum wiring 513 is formed on contact interlayer insulating film 509 in a manner so as to electrically connect to tungsten plugs 519; thus, it is possible to obtain a semiconductor device 5 shown in FIG. 49. Here, a contact hole that also penetrates nitride film 510 is formed on one portion of lower-layer electrode-use polysilicon layer 508.

In this manner, when compared with normal BiCMOS processes, semiconductor device 5 of the fifth embodiment makes it possible to fabricate capacitor C5 in a BiCMOS structure by adding only the lower-layer electrode-use mask for providing the lower-layer electrode structure shown in FIG. 55 thereto.

Moreover, in the same manner as semiconductor devices of the first to fourth embodiments, semiconductor device 5 of the fifth embodiment, the application of nitride film 510 as a dielectric film makes it possible to increase a capacitance value per unit area, and consequently to provide a structure that is free from voltage dependency.

As described above, semiconductor device 5 of the fifth embodiment makes it possible to provide a BiCMOS structure which increases a capacitance value per unit area while reducing the manufacturing costs to the minimum required, and is free from voltage dependency.

Moreover, polysilicon, which is free from degradation in the characteristics such as deformation even when processed at a high temperature of not less than 500° C., is used as the composition material of upper-layer electrode-use first polysilicon layer 511 and upper-layer electrode-use second polysilicon 512; therefore, even when upper-layer electrode-use first polysilicon layer 511 and upper-layer electrode-use second polysilicon 512 are used as gate electrodes of NMOS transistor Q51 and PMOS transistor Q52, it is possible to maintain superior electrical properties in MOS transistors Q51, Q52. In the same manner, when upper-layer electrode-use second polysilicon layer 512 is used as the base electrode of bipolar transistor T5, it is possible to maintain superior electrical properties in bipolar transistor T5.

In semiconductor device 5 of the fifth embodiment, since assisting layers 511a made of the same composition material as upper-layer electrode-use first polysilicon layer 511 and upper-layer electrode-use second polysilicon layer 512 are allowed to remain from the side face of lower-layer electrode-use polysilicon layer 508 to edge of nitride film 510, it is possible to effectively suppress the generation of residues of upper-layer electrode-use first polysilicon layer 511 and upper-layer electrode-use second polysilicon layer 512 caused by a step difference between upper-layer electrode-use first polysilicon layer 511 as well as upper-layer electrode-use second polysilicon layer 512 and lower-layer electrode-use polysilicon layer 508, in the same manner as the fourth embodiment.

Here, in the fifth embodiment, although nitride film 510 is used as the dielectric film, any material may be used, as long as it is a dielectric material having a dielectric constant higher than that of the oxide film.

Moreover, a dielectric film having a laminated structure such as a double layer structure of $SiO_2/SiN$ or a triple layer structure of $SiO_2/SiN/SiO_2$ may be formed. When the dielectric film is formed in a laminated structure, it becomes possible to obtain improved reliability such as longer service life of the capacitor.

<Sixth Embodiment>

Figure 63:
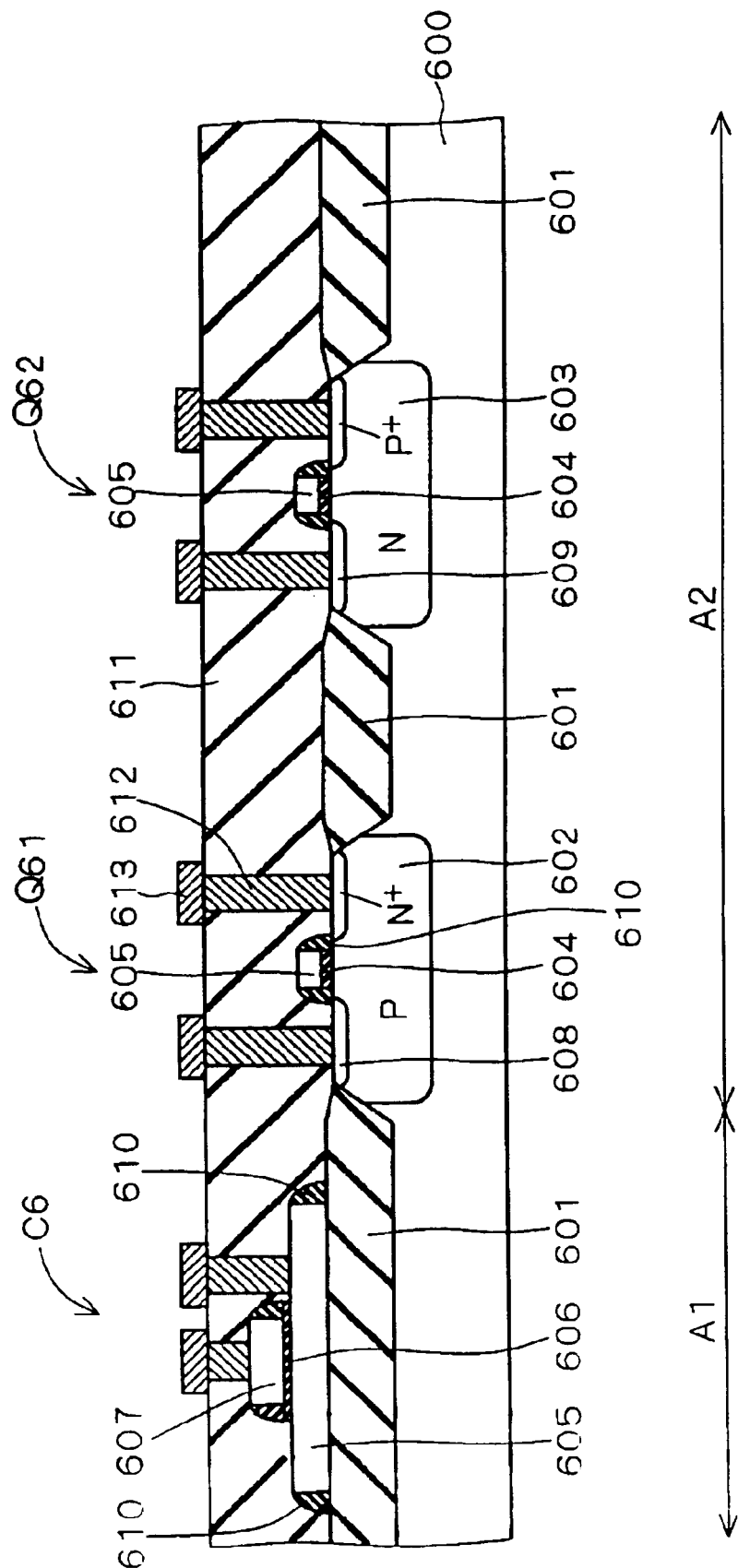
FIG. 63 is a cross-sectional view that shows a structure of a semiconductor device in accordance with a sixth embodiment of the present invention.

FIG. 63 is a cross-sectional view showing a structure of a semiconductor device 6 of a CMOS structure having a capacitor that is the sixth embodiment of the present invention.

As shown in this Figure, in a semiconductor device 6, a capacitor C6 is fabricated in a capacitor formation area A1, and an NMOS transistor Q61 and a PMOS transistor Q62 are fabricated in a CMOS formation area A2 on a silicon substrate 600.

NMOS transistor Q61 and PMOS transistor Q62 are element-separated by a LOCOS oxide film 601 formed on an upper layer portion of a silicon substrate 600, and capacitor C6, which is formed on LOCOS oxide film 601, is element-separated from MOS transistors Q61, Q62 on CMOS formation area A2.

In capacitor formation area A1, capacitor C6 is constituted by a lower-layer electrode-use polysilicon layer 605 (lower layer electrode), a nitride film 606 (dielectric film) and an upper-layer electrode-use polysilicon layer 607 (upper layer electrode) that are formed on LOCOS oxide film 601. In this case, upper layer electrode-use polysilicon layer 607 and nitride film 606 are formed as the same plane pattern.

Moreover, a frame-forming TEOS oxide film 610 is formed on the side faces of lower-layer electrode-use polysilicon layer 605 and upper-layer electrode-use polysilicon layer 607.

In CMOS formation area A2, NMOS transistor Q61 is formed on a P-well region 602, and PMOS transistor Q62 is formed on an N-well region 603.

An $N^+$ source-drain region 608 is selectively formed within the surface of P-well region 602, and gate oxide film 604 and upper-layer electrode-use polysilicon layer 607 are formed on the surface of a P-well region 602 between $N^+$ source-drain regions 608. Therefore, NMOS transistor Q61, constituted by P-well region 602, $N^+$ source-drain regions 608 and gate oxide film 604, is formed with upper-layer electrode-use polysilicon layer 607 serving as a gate electrode.

Here, $P^+$ source-drain regions 609 are selectively formed within the surface of N-well region 603, and gate oxide film 604 and upper-layer electrode-use polysilicon layer 607 are formed on the surface of N-well region 603 between $P^+$ source-drain regions 609. Therefore, PMOS transistor Q62, constituted by N-well region 603, $P^+$ source-drain regions 609 and gate oxide film 604, is formed with upper-layer electrode-use polysilicon layer 607 serving as a gate electrode.

A contact interlayer-insulating film 611 is formed in a manner so as to cover the entire surface of silicon substrate 600 including capacitor C6, NMOS transistor Q61, PMOS transistor Q62.

Here, a tungsten plug 612 is formed in a penetrating manner through contact interlayer insulating film 611 so as to electrically connect to one portion of the surface of upper-layer electrode-use polysilicon layer 607 and lower-layer electrode-use polysilicon layer 605 of capacitor C6, one portion of the surface of $N^+$ source-drain regions 408, one portion of the surface of $N^+$ source-drain regions 608 and one portion of the surface of $P^+$ source-drain regions 609.

Moreover, aluminum wiring 613 is formed in a manner so as to electrically connect to tungsten plug 612 on contact interlayer insulating film 611.

FIGS. 64 to 71 are cross-sectional views showing a manufacturing method of semiconductor device 6 in accordance with the sixth embodiment. Referring to these Figures, the following description will discuss the manufacturing method of the sixth embodiment.

Figure 64:
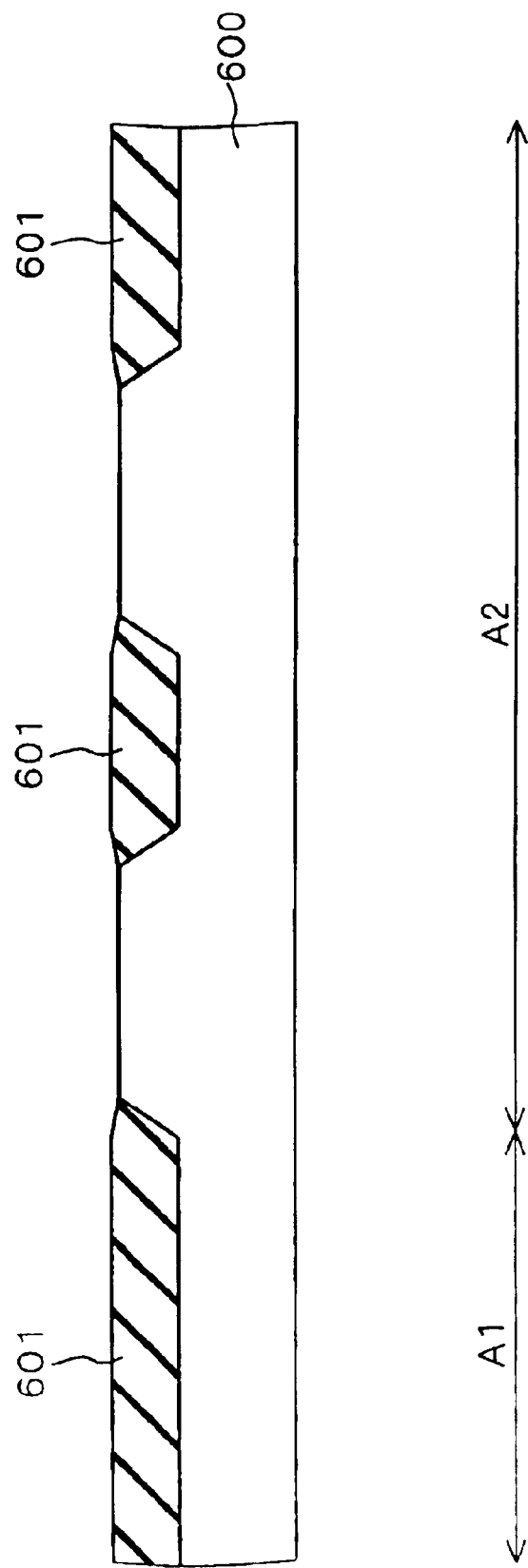
FIGS. 64 to 71 are cross-sectional views that show the manufacturing method of the semiconductor device in accordance with the sixth embodiment.

First, as shown in FIG. 64, a LOCOS oxide film 601 is selectively formed on the upper-layer portion of a silicon substrate 600.

Figure 65:
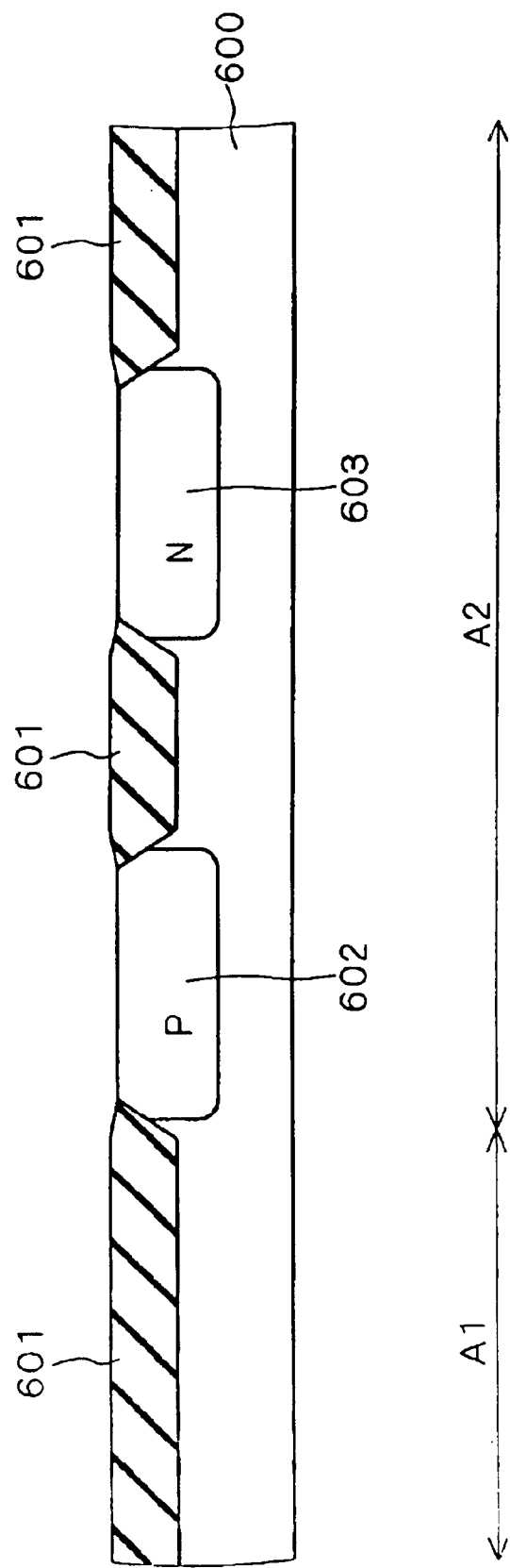

Next, as shown in FIG. 65, P-well region 602 and N-well region 603 are selectively formed on the upper-layer portion of CMOS formation area A2 in a silicon substrate 600.

Figure 66:
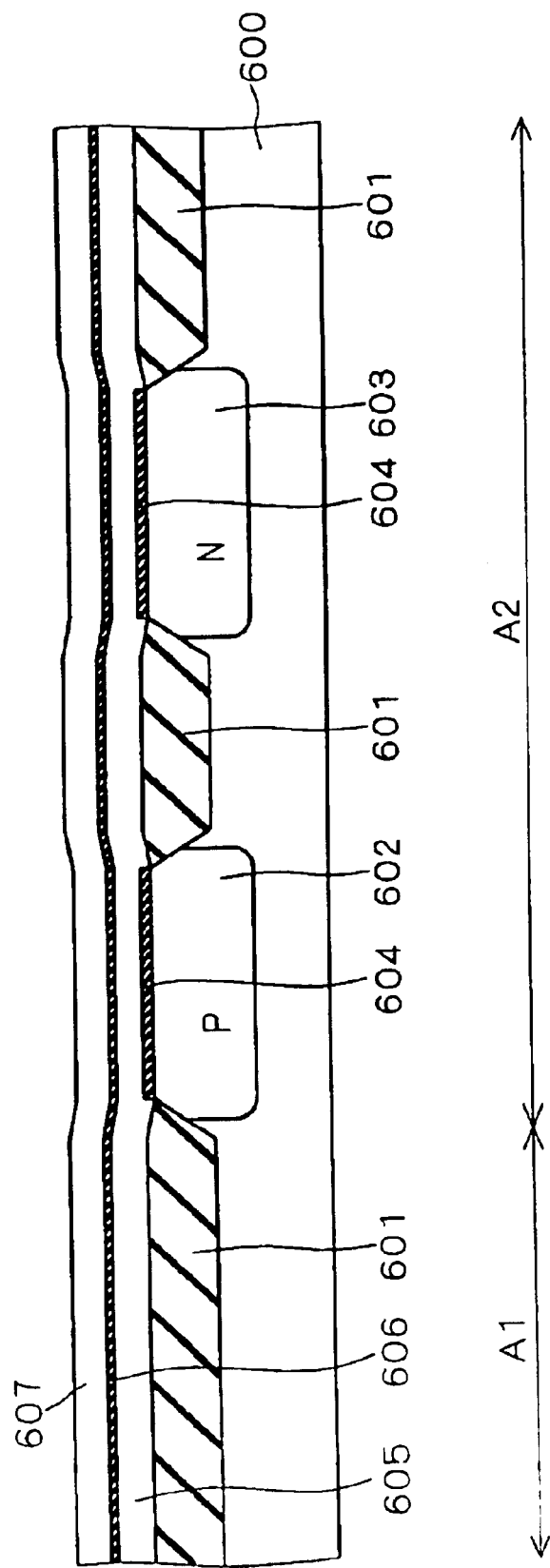

Then, as shown in FIG. 66, after gate oxide films 604 have been formed respectively on P-well region 602 and N-well region 603, a lower-layer electrode-use polysilicon layer 605 made of doped polysilicon is deposited on the entire surface through a CVD method or the like, and a nitride film 606, serving as a single-layer dielectric film, is formed on lower-layer electrode-use polysilicon layer 605.

Moreover, as shown in FIG. 66, an upper-layer electrode-use polysilicon layer 607 having doped polysilicon is deposited on the entire surface through a CVD method or the like. Here, lower-layer electrode-use polysilicon layer 605 and upper-layer electrode-use polysilicon layer 607 may be doped by ion injection, or amorphous silicon may be formed in place of doped silicon.

Figure 67:
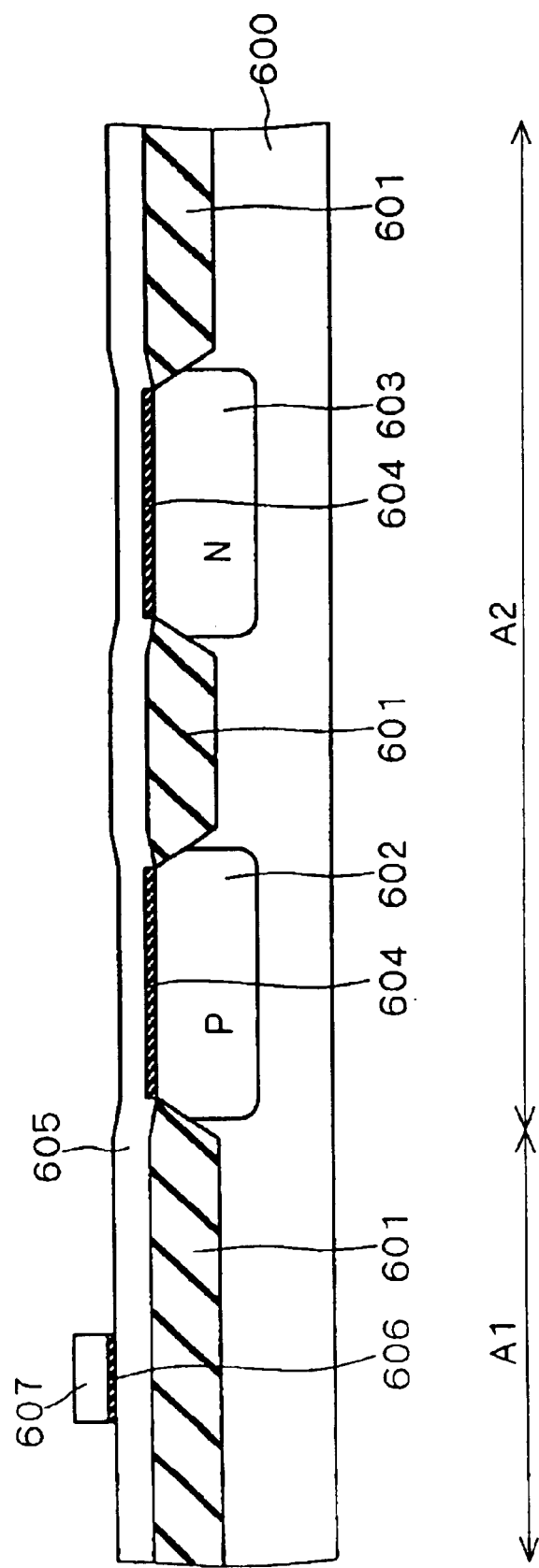

Next, as shown in FIG. 67, by selectively etching upper-layer electrode-use polysilicon layer 607 and nitride film 606 using a upper-layer electrode-use mask, not shown, upper-layer electrode-use polysilicon layer 607 and nitride film 606 are selectively allowed to remain on only capacitor formation area A1. Consequently, upper-layer electrode-use polysilicon layer 607 and nitride film 606 are formed as the same plane pattern. Upper-layer electrode-use polysilicon layer 607 and nitride film 606, thus patterned, are respectively allowed to form an upper-layer electrode and a dielectric film of capacitor C6.

Figure 68:
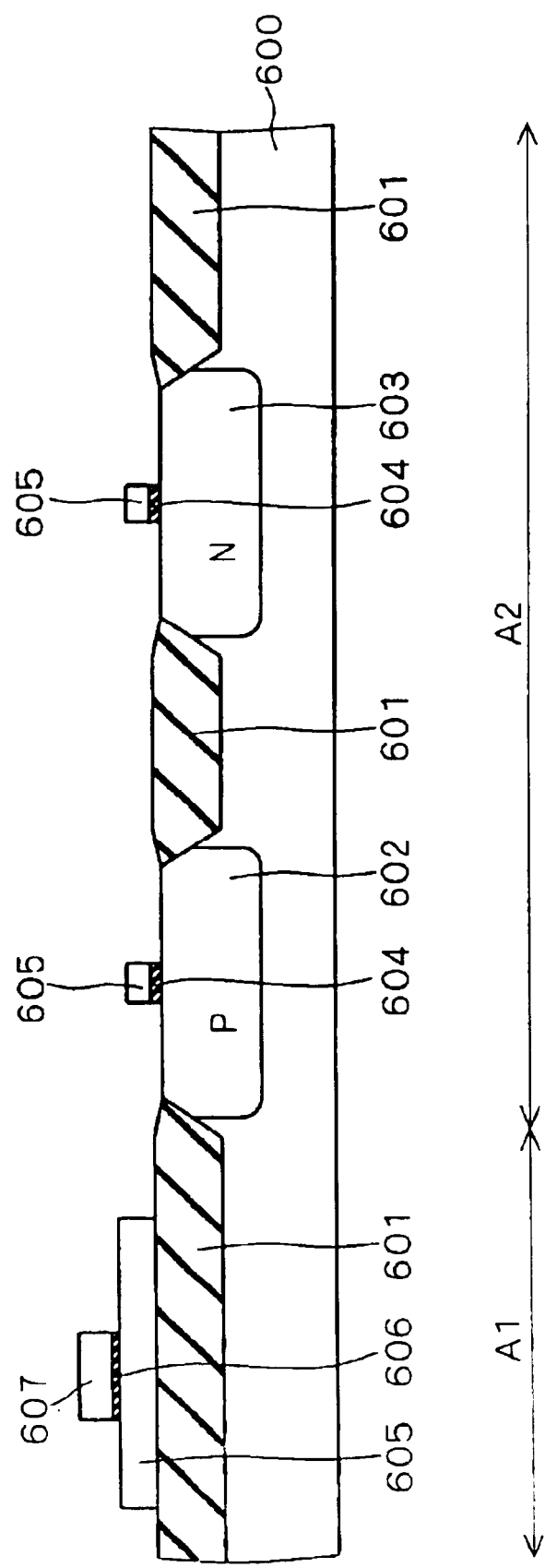

Then, as shown in FIG. 68, lower-layer electrode-use polysilicon layer 605 and gate oxide film 604 (in only CMOS formation area A2) are selectively etched by using a mask commonly used for forming a lower-layer electrode and a gate electrode, lower-layer electrode-used polysilicon layer 605 is patterned on one portion of LOCOS oxide film 601 of capacitor formation area A1, and gate oxide film 604 and lower-layer electrode-use polysilicon layer 605 of CMOS formation area A2 are patterned.

Consequently, it becomes possible to simultaneously form the lower-layer electrode of capacitor C6 derived from lower-layer electrode-use polysilicon layer 605 and gate electrodes of NMOS transistor Q61 and PMOS transistor Q62 derived from lower-layer electrode-use polysilicon layer 605.

Figure 69:
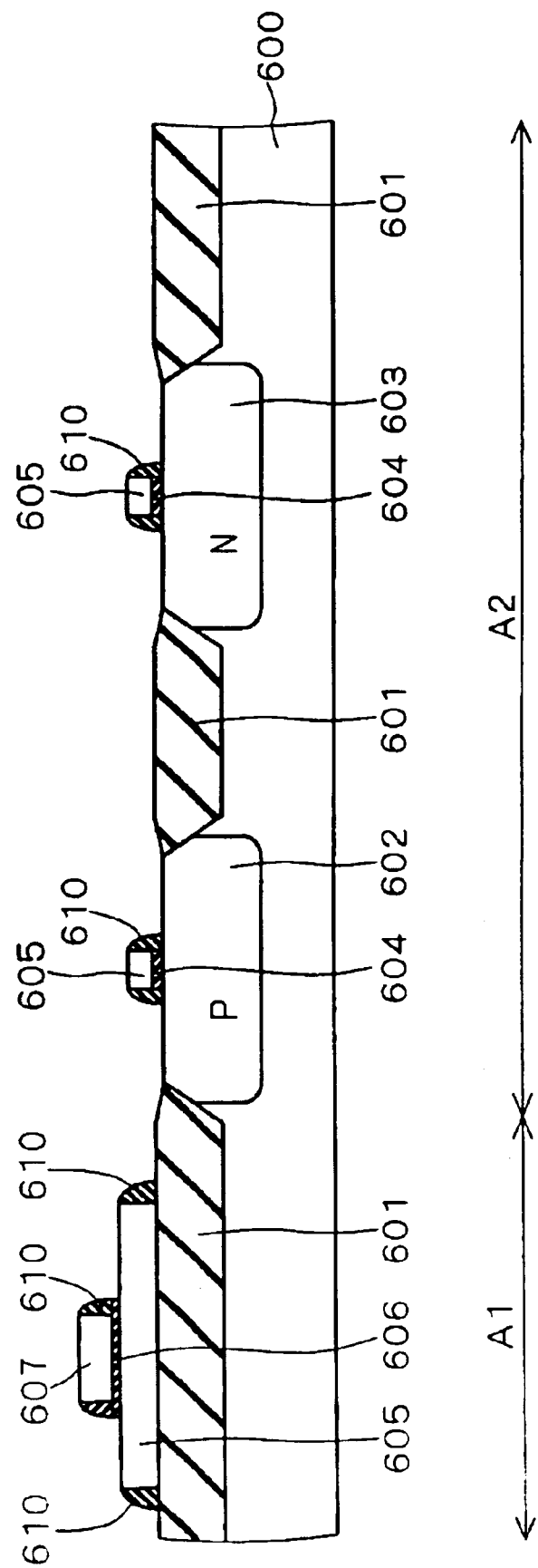

Next, as shown in FIG. 69, after having deposited frame-forming TEOS oxide film 610 over the entire surface, the entire surface is subjected to an etch back process so that a frame-forming TEOS oxide film 610 is allowed to remain as side walls on the side faces of lower-layer electrode-use polysilicon layer 605 and upper-layer electrode-use polysilicon layer 607 of capacitor formation area A1 and the side faces of gate oxide film 604 and lower-layer electrode-use polysilicon layer 605 of CMOS formation area A2. Here, prior to the formation of side walls, a diffusion region used for source-drain regions may be formed.

Figure 70:
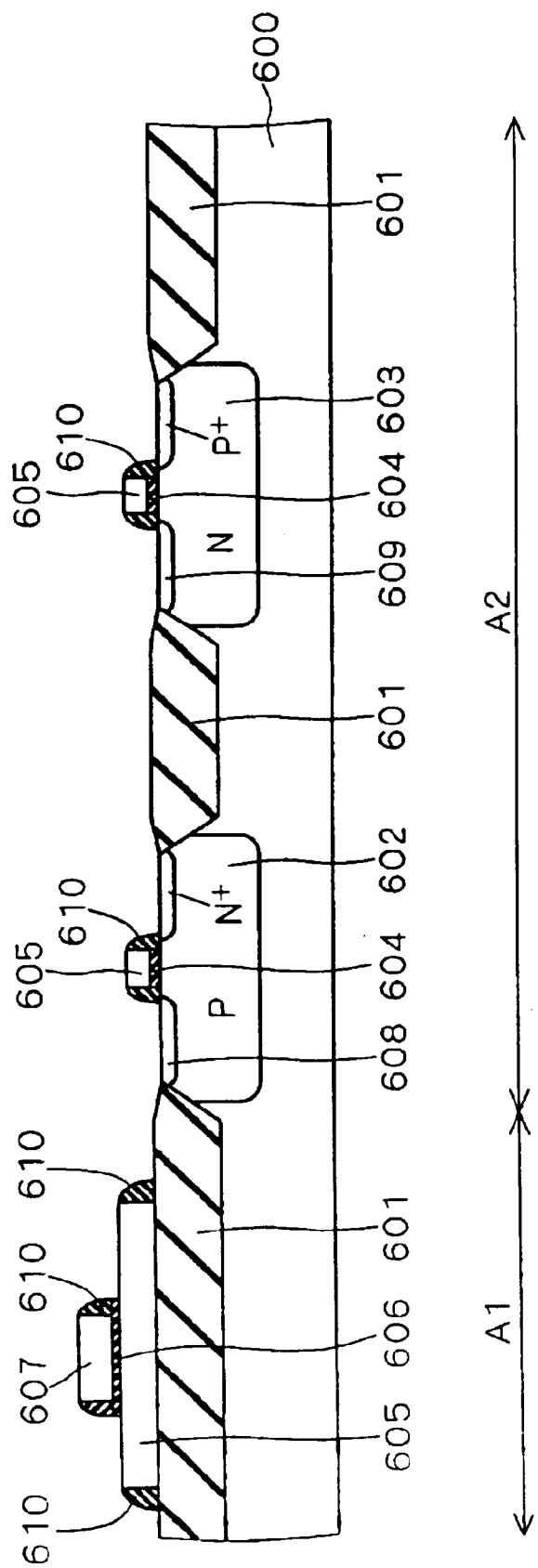

Successively as shown in FIG. 70, impurities of N-type and P-type are injected to the respective P-well region 602 and N-well region 603 by using lower-layer electrode-use polysilicon layer 605 and frame-forming TEOS oxide film 610 formed on the side face thereof as masks so that $N^+$ source-drain regions 608 and $P^+$ source-drain region 609 are respectively formed within the surfaces of P-well region 602 and N-well region 603.

Figure 71:
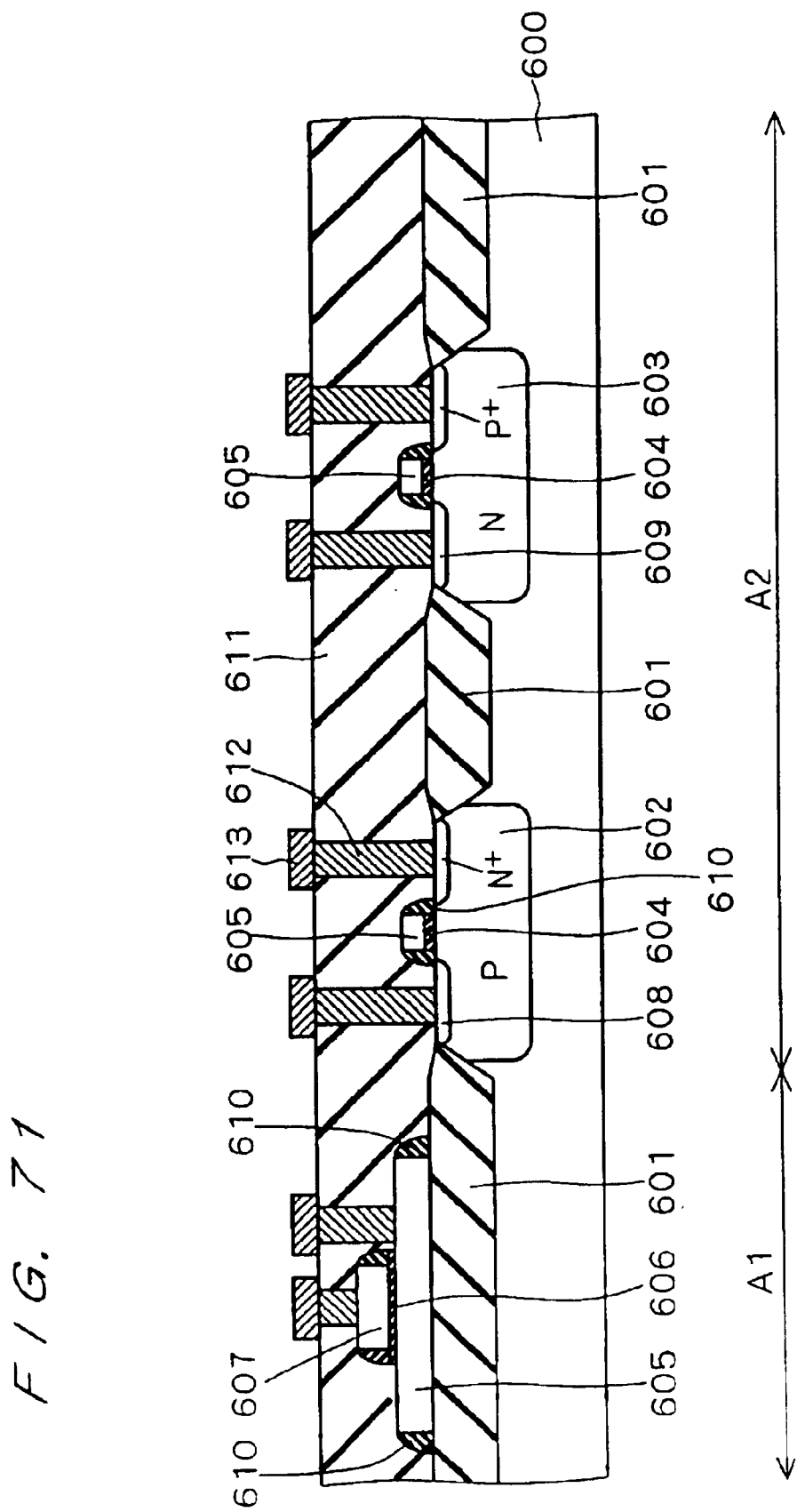

As shown in FIG. 71, contact interlayer insulating film 611 is formed on the entire surface thereof, and after contact holes have been opened on one portion of upper-layer electrode-use polysilicon layer 607 and lower-layer electrode-use polysilicon 605 of capacitor formation area A1 as well as on one portion of $N^+$ source-drain regions 608 and $P^+$ source-drain regions 609 of CMOS formation area A2, tungsten plugs 612 are embedded in these holes, and aluminum wiring 613 is formed on contact interlayer insulating film 611 in a manner so as to electrically connect to tungsten plugs 612; thus, a semiconductor device 6, shown in FIG. 63, is obtained.

In this manner, in comparison with normal CMOS processes, semiconductor device 6 of the sixth embodiment makes it possible to fabricate capacitor C6 in a CMOS structure by adding only the upper layer electrode-use mask for providing the upper-layer electrode structure shown in FIG. 67 thereto.

Moreover, in the same manner as the first to fifth embodiments, in semiconductor device 6 of the sixth embodiment, since nitride film 606 was used as the dielectric film, it is possible to increase the capacitance value per unit area, and also to provide a structure that is free from voltage dependency.

As described above, semiconductor device 6 of the sixth embodiment makes it possible to provide a CMOS structure which increases a capacitance value per unit area while reducing the manufacturing costs to the minimum required, and is free from voltage dependency.

Here, in the sixth embodiment, although nitride film 606 is used as the dielectric film, any material may be used, as long as it is a dielectric material having a dielectric constant higher than that of the oxide film.

Moreover, a dielectric film having a laminated structure such as a double layer structure of $SiO_2/SiN$ or a triple layer structure of $SiO_2/SiN/SiO_2$ may be formed. When the dielectric film is formed in a laminated structure, it becomes possible to obtain improved reliability such as longer service life of the capacitor.

<Seventh Embodiment>

Figure 72:
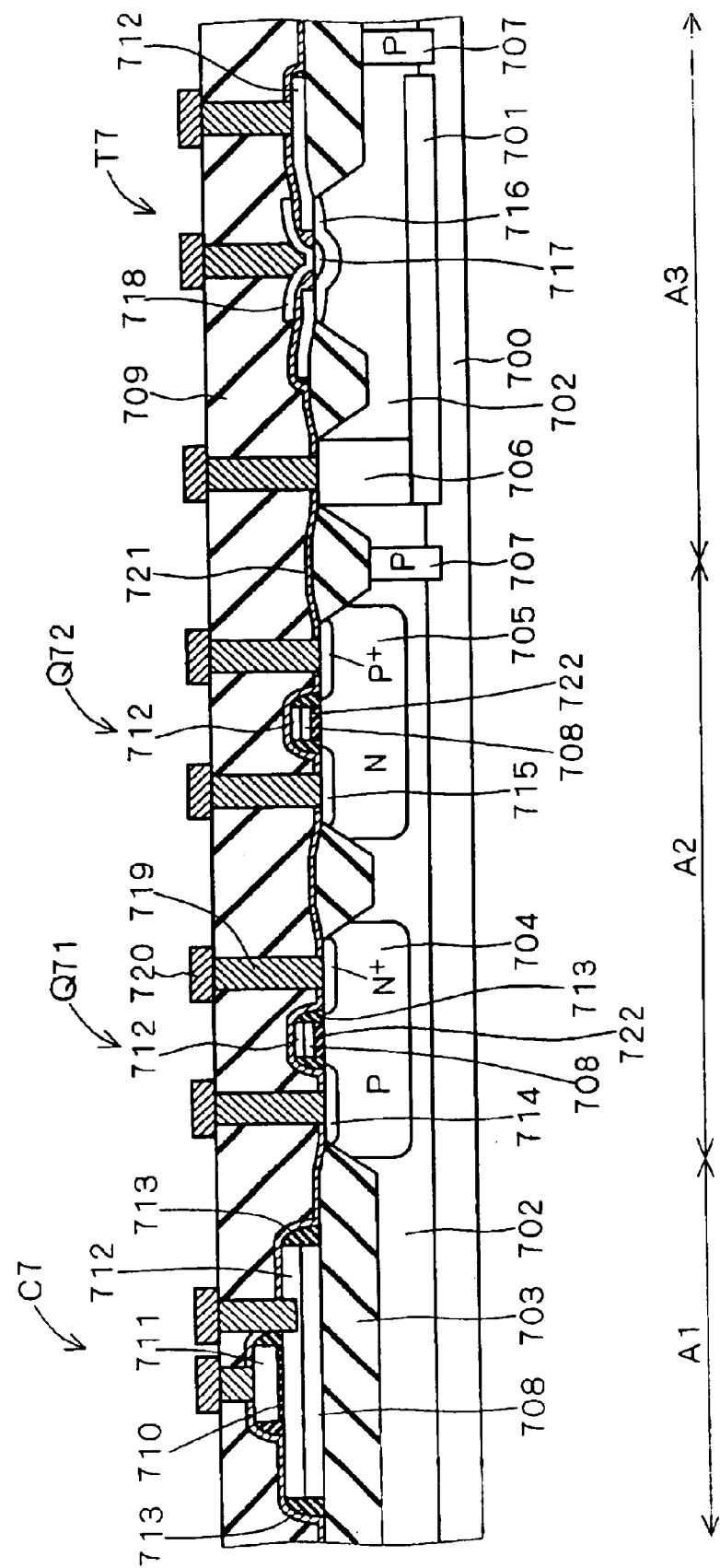
FIG. 72 is a cross-sectional view that shows a structure of a semiconductor device in accordance with a seventh embodiment of the present invention.

FIG. 72 is a cross-sectional view showing a structure of a semiconductor device 7 of a BiCMOS structure having a capacitor that is the seventh embodiment of the present invention.

As shown in this Figure, in a semiconductor device 7, a capacitor C7 is fabricated in a capacitor formation area A1, an NMOS transistor Q71 and a PMOS transistor Q72 are fabricated in a CMOS formation area A2 of an N-type epitaxial layer 702 formed on a silicon substrate 700, and a bipolar transistor T7 is fabricated in a bipolar transistor formation area A3.

NMOS transistor Q71 and PMOS transistor Q72 are element-separated by a LOCOS oxide film 703 formed on an upper layer portion of N-type epitaxial layer 702, and capacitor C7, which is formed on LOCOS oxide film 703, is element-separated from MOS transistors Q71, Q72 on CMOS formation area A2, and PMOS transistor Q72 and bipolar transistor T7 are element-separated from each other by LOCOS oxide film 703 and a P-type separation-well region 707 located below this.

In capacitor formation area A1, capacitor C7 is constituted by a lower-layer electrode-use first polysilicon layer 708 and a lower-layer electrode-use second polysilicon layer 712 (lower layer electrode) formed on LOCOS oxide film 703, a nitride film 710 (dielectric film) and an upper-layer electrode-use polysilicon layer 711 (upper layer electrode). In this case, upper-layer electrode-use polysilicon layer 711 and nitride film 710 are formed as the same plane pattern. Moreover, a frame-forming TEOS oxide film 713 is formed on side faces of lower-layer electrode-use first polysilicon layer 708 and lower-layer electrode-use second polysilicon layer 712 as well as upper-layer electrode-use polysilicon layer 711.

In CMOS formation area A2, NMOS transistor Q71 is formed on a P-well region 704, and PMOS transistor Q72 is formed on an N-well region 705.

An $N^+$ source-drain region 714 is selectively formed within the surface of P-well region 704, and gate oxide film 722 as well as lower-layer electrode-use first polysilicon layer 708 and lower-layer electrode-use second polysilicon layer 712 are formed on the surface of P-well region 704 between $N^+$ source-drain regions 714. Therefore, NMOS transistor Q71, constituted by P-well region 704, $N^+$ source-drain regions 714 and gate oxide film 722, is formed with lower-layer electrode-use first polysilicon layer 708 and lower-layer electrode-use second polysilicon layer 712 serving as a gate electrode.

Here, $P^+$ source-drain regions 715 are selectively formed within the surface of N-well region 705, and a gate oxide film 722 as well as lower-layer electrode-use first polysilicon layer 708 and lower-layer electrode-use second polysilicon layer 712 are formed on the surface of N-well region 705 between $P^+$ source-drain regions 715. Therefore, PMOS transistor Q72, constituted by N-well region 705, $P^+$ source-drain regions 715 and gate oxide film 722, is formed with lower-layer electrode-use first polysilicon layer 708 and lower-layer electrode-use second polysilicon layer 712 serving as a gate electrode.

In bipolar transistor formation area A3, a floating collector region 701 is formed in a manner so as to be embedded in an interface between silicon substrate 700 and N-type epitaxial layer 702, and a collector wall 706 is formed from one portion of floating collector region 701 to the surface of N-type epitaxial layer 702.

Here, a P-type base diffusion layer 716 is formed on an upper layer portion of N-type epitaxial layer 702 within a bipolar transistor formation area A3, and an emitter diffusion layer 717 is formed within the surface of the center portion of base diffusion layer 716.

Moreover, lower-layer electrode-use second polysilicon layer 712 is formed as a base electrode in contact with one portion of the surface of base diffusion layer 716, and a polysilicon emitter electrode 718 is formed in a manner so as to contact one portion of the surface of emitter diffusion layer 717. Here, lower-layer electrode-use second polysilicon layer 712 and polysilicon emitter electrode 718 are insulated from each other with TEOS oxide film 721 being formed in between.

In this manner, in bipolar transistor formation area A3, a bipolar transistor T7 is constituted by collector wall 706, base diffusion layer 716, emitter diffusion layer 717, lower-layer electrode-use second polysilicon layer 712 (base electrode) and polysilicon emitter electrode 718.

A contact interlayer-insulating film 709 is formed in a manner so as to cover the entire surface of N-type epitaxial layer 702 including a capacitor C7, NMOS transistor Q71, PMOS transistor Q72 and bipolar transistor T7.

Here, a tungsten plug 719 is formed in a penetrating manner through contact interlayer insulating film 709 so as to electrically connect to one portion of the surface of upper-layer electrode-use polysilicon layer 711 of capacitor C7, one portion of the surface of $N^+$ source-drain regions 714, one portion of the surface of $P^+$ source-drain regions 715, one portion of upper-layer electrode-use polysilicon layer 711 of bipolar transistor formation area A3, one portion of the surface of collector wall 706, and one portion of polysilicon emitter electrode 718.

Moreover, tungsten plug 719 is formed in a manner so as to penetrate contact interlayer insulating film 709 and TEOS oxide film 721 so as to electrically connect to one portion of the surface of lower-layer electrode-use second polysilicon layer 712 of capacitor C7. Furthermore, aluminum wiring 720 is formed in a manner so as to electrically connect to tungsten plug 719 on contact interlayer insulating film 709.

FIGS. 73 to 84 are cross-sectional views showing a manufacturing method of semiconductor device 7 in accordance with the seventh embodiment. Referring to these Figures, the following description will discuss the manufacturing method of the seventh embodiment.

Figure 73:
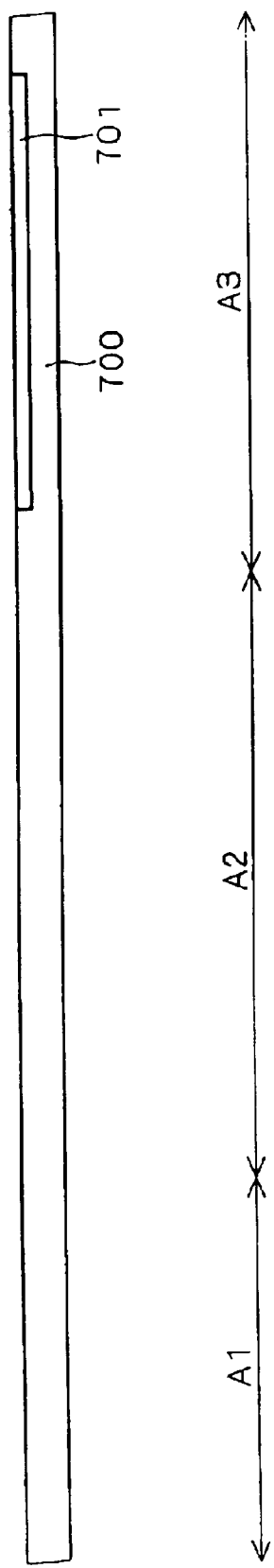
FIGS. 73 to 84 are cross-sectional views that show the manufacturing method of the semiconductor device in accordance with the seventh embodiment.

First, as shown in FIG. 73, antimony (Sb) is injected into a silicon substrate 700 to form an N-type floating collector region 701.

Figure 74:
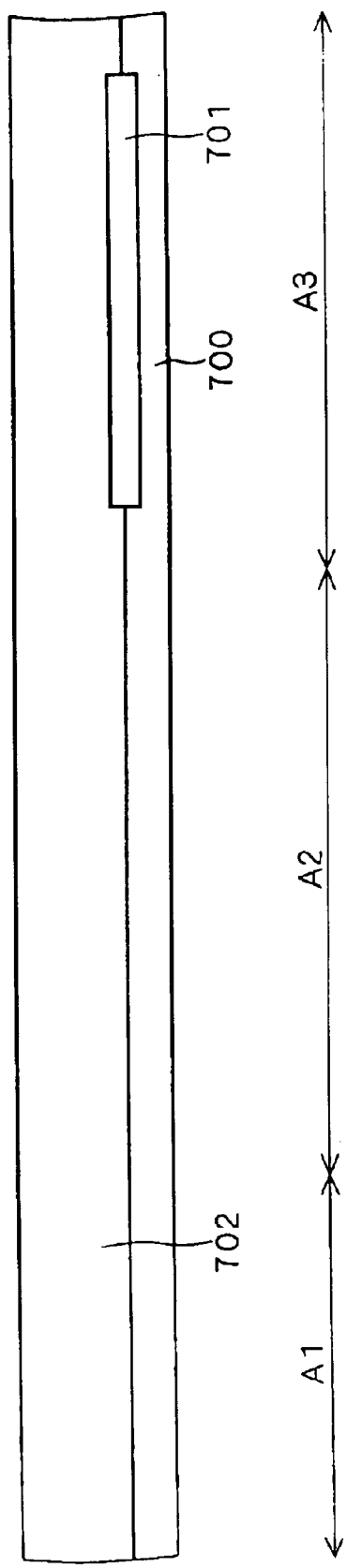

Next, as shown in FIG. 74, an N-type epitaxial layer 702 is formed on silicon substrate 700 including floating collector region 701 by using an epitaxial growth method. At this time, since N-type impurities of floating collector region 701 are diffused so that one portion of floating collector region 701 is formed also inside N-type epitaxial layer 702.

Figure 75:
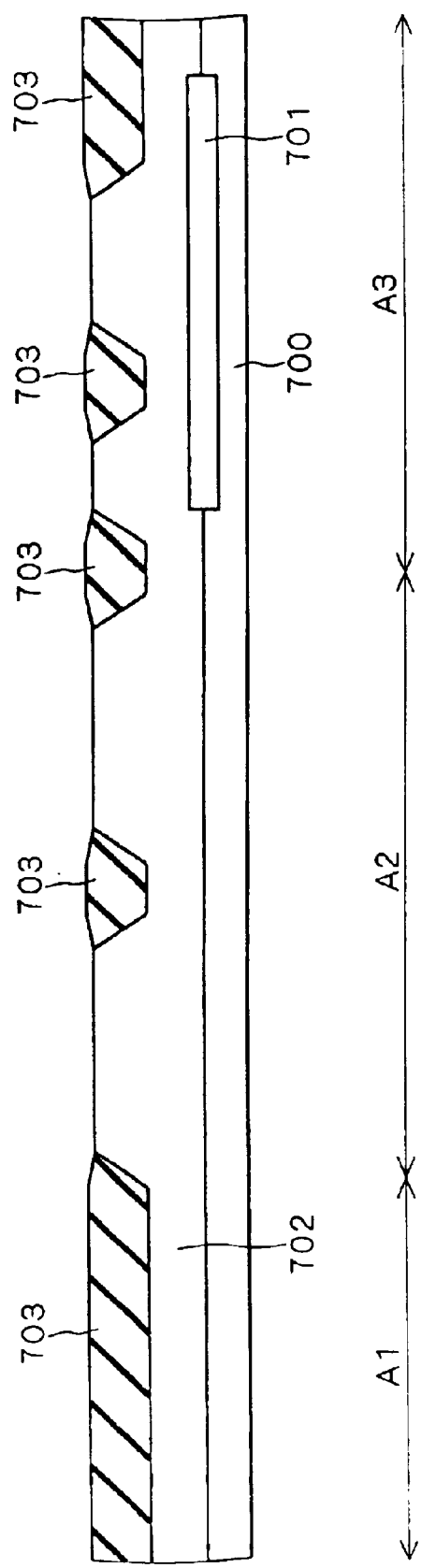

Then, as shown in FIG. 75, LOCOS oxide film 703 is selectively formed on an upper-layer portion of N-type epitaxial layer 702.

Figure 76:
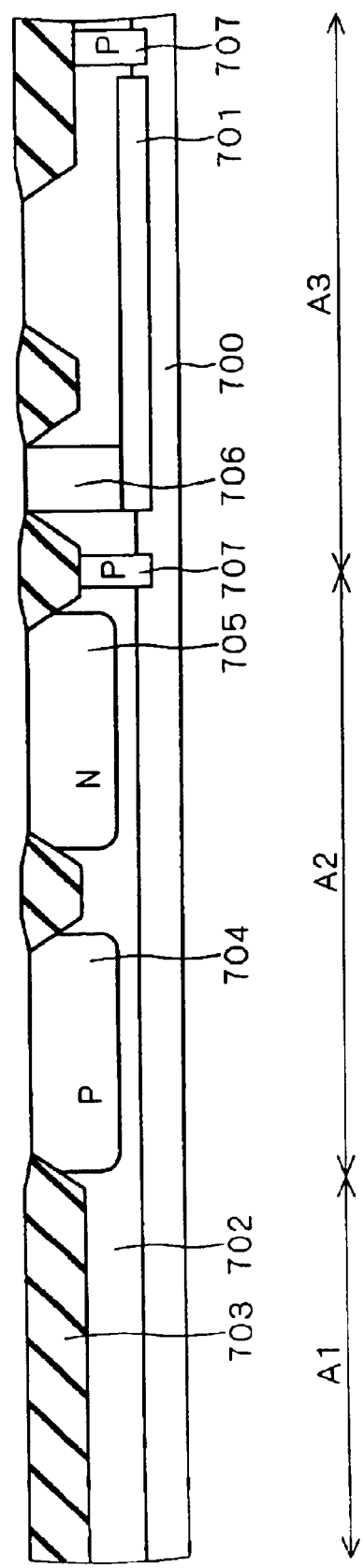

Next, as shown in FIG. 76, P-well region 704 and N-well region 705 are selectively formed on the upper-layer portion of CMOS formation area A2 in N-type epitaxial layer 702.

Moreover, as shown in FIG. 76, a P-type separation well region 707 is formed under LOCOS oxide film 703 in an area close to the border of CMOS formation area A2 and bipolar transistor formation area A3 through ion injection penetrating LOCOS oxide film 703 so that a collector wall 706 extending from the surface of N-type epitaxial layer 702 to floating collector region 701 is formed.

Figure 77:
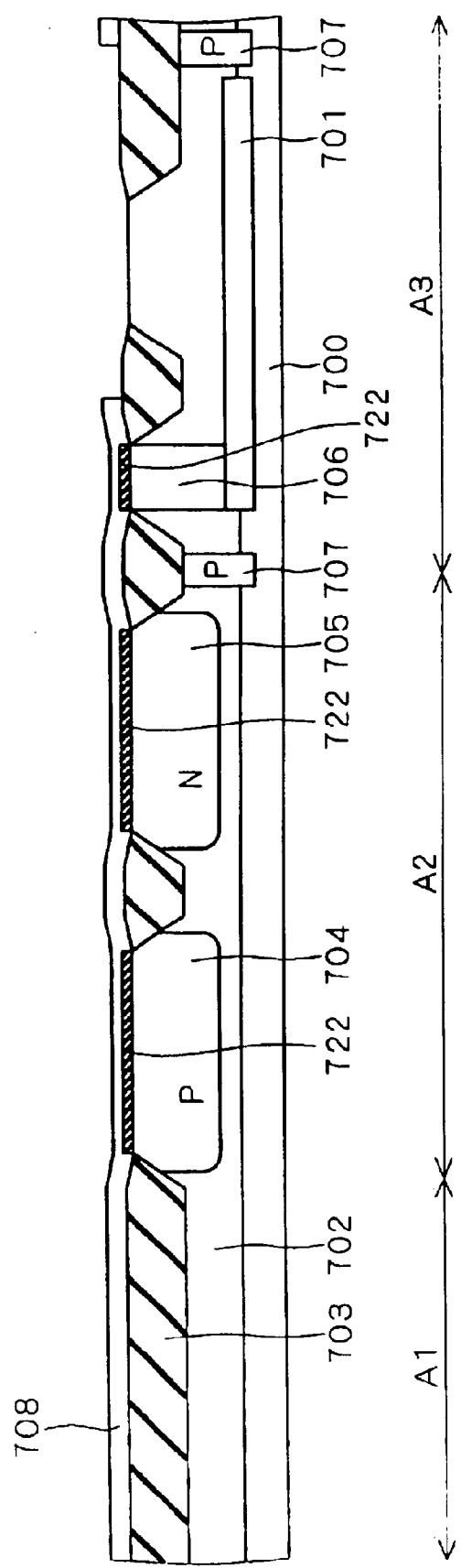

Then, as shown in FIG. 77, after gate oxide films 722 have been respectively formed on P-well region 704, N-well region 705 and collector wall 706, a lower-layer electrode-use first polysilicon layer 708 having doped polysilicon is deposited on the entire surface through a CVD method or the like, and upper-layer electrode-use polysilicon layer 711 and gate oxide film 722 are etched and removed from most of areas including the surface of N-type epitaxial layer 702 of bipolar transistor formation area A3. Here, lower-layer electrode-use polysilicon layer 708 may be doped by ion injection or amorphous silicon may be formed in place of doped silicon.

Figure 78:
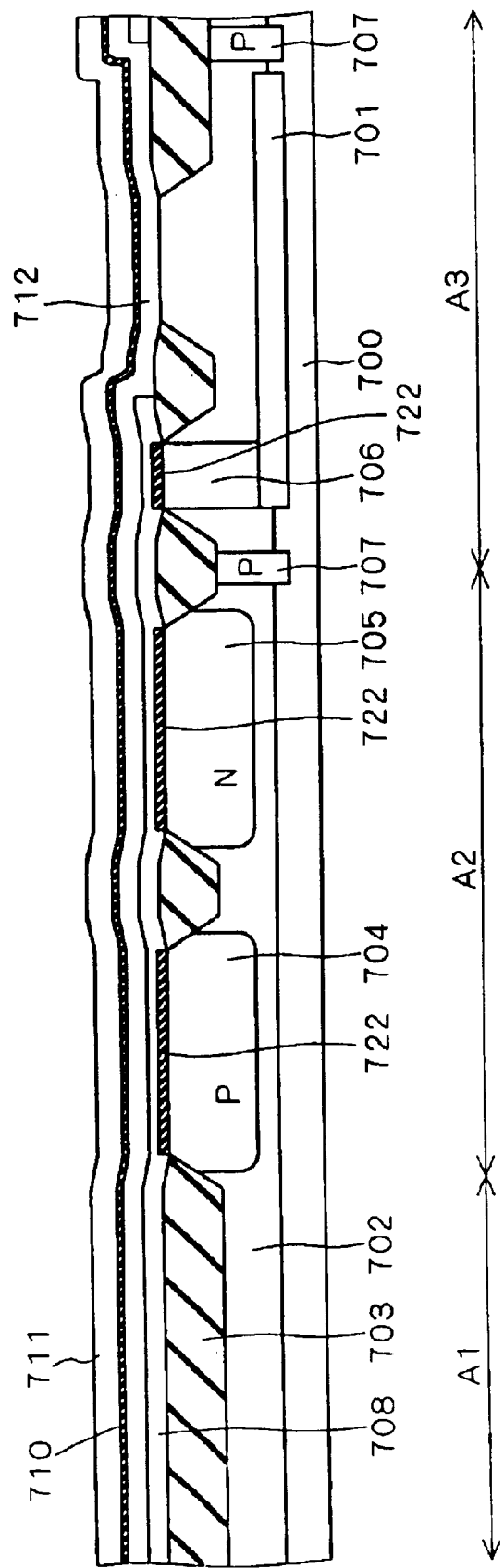

Next, as shown in FIG. 78, after lower-layer electrode-use second polysilicon layer 712, made from non-doped polysilicon, has been deposited on the entire surface, a nitride film 710 serving as a single-layer dielectric film is formed on lower-layer electrode-use first polysilicon layer 708, and upper-layer electrode-use polysilicon layer 711, made from doped silicon, is formed on nitride film 710 through a CVD method or the like.

Here, amorphous silicon may be formed in place of non-doped polysilicon used for lower-layer electrode-use second polysilicon layer 712. Moreover, upper-layer electrode-use polysilicon layer 711 may be formed by doping through an ion injection, or amorphous silicon may be formed in place of doped polysilicon.

Figure 79:
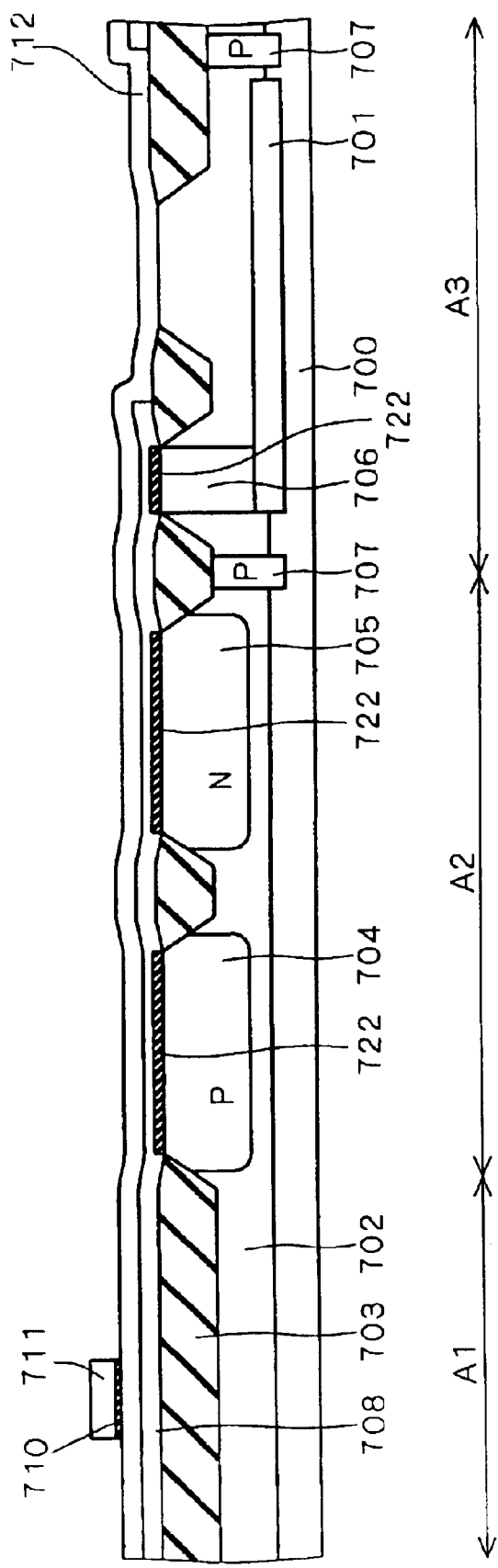

Next, as shown in FIG. 79, by selectively etching upper-layer electrode-use polysilicon layer 711 and nitride film 710 using an upper-layer electrode-use mask, not shown, upper-layer electrode-use polysilicon layer 711 and nitride film 710 are selectively allowed to remain only on capacitor formation area A1. Consequently, upper-layer electrode-use polysilicon layer 711 and nitride film 710 are formed as the same plane pattern. Upper-layer electrode-use polysilicon layer 711 and nitride film 710, thus patterned, are respectively allowed to form an upper-layer electrode and a dielectric film of capacitor C7.

Figure 80:
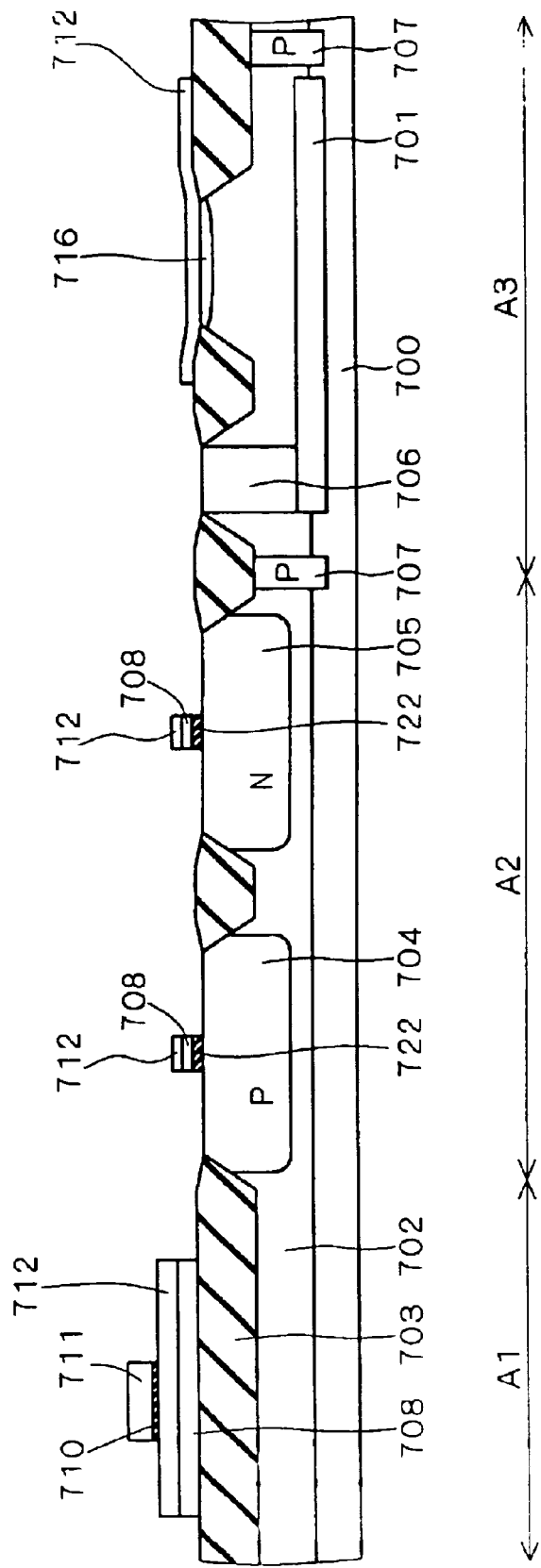

Then, as shown in FIG. 80, lower-layer electrode-use first polysilicon layer 708 (only in capacitor formation area A1 and CMOS formation area A2) and lower-layer electrode-use second polysilicon layer 712 as well as gate oxide film 722 (only in CMOS formation area A2 and bipolar transistor formation area A3) are selectively etched by using a lower-layer electrode, not shown, and a mask used for commonly forming gate electrode and base electrode.

Thus, lower-layer electrode-use first polysilicon layer 708 and lower-layer electrode-use second polysilicon layer 712 are patterned on one portion of LOCOS oxide film 703 of capacitor formation area A1, gate oxide film 722 of CMOS formation area A2 as well as lower-layer electrode-use first polysilicon layer 708 and lower-layer electrode-use second polysilicon layer 712 are patterned, and lower-layer electrode-use second polysilicon layer 712 of bipolar transistor formation area A3 is patterned.

Consequently, it becomes possible to simultaneously form the lower-layer electrode of capacitor C7 derived from lower-layer electrode-use first polysilicon layer 708 and lower-layer electrode-use second polysilicon layer 712, and gate electrodes of NMOS transistor Q71 and PMOS transistor Q72 derived from lower-layer electrode-use first polysilicon layer 708 and lower-layer electrode-use second polysilicon layer 712.

Figure 81:
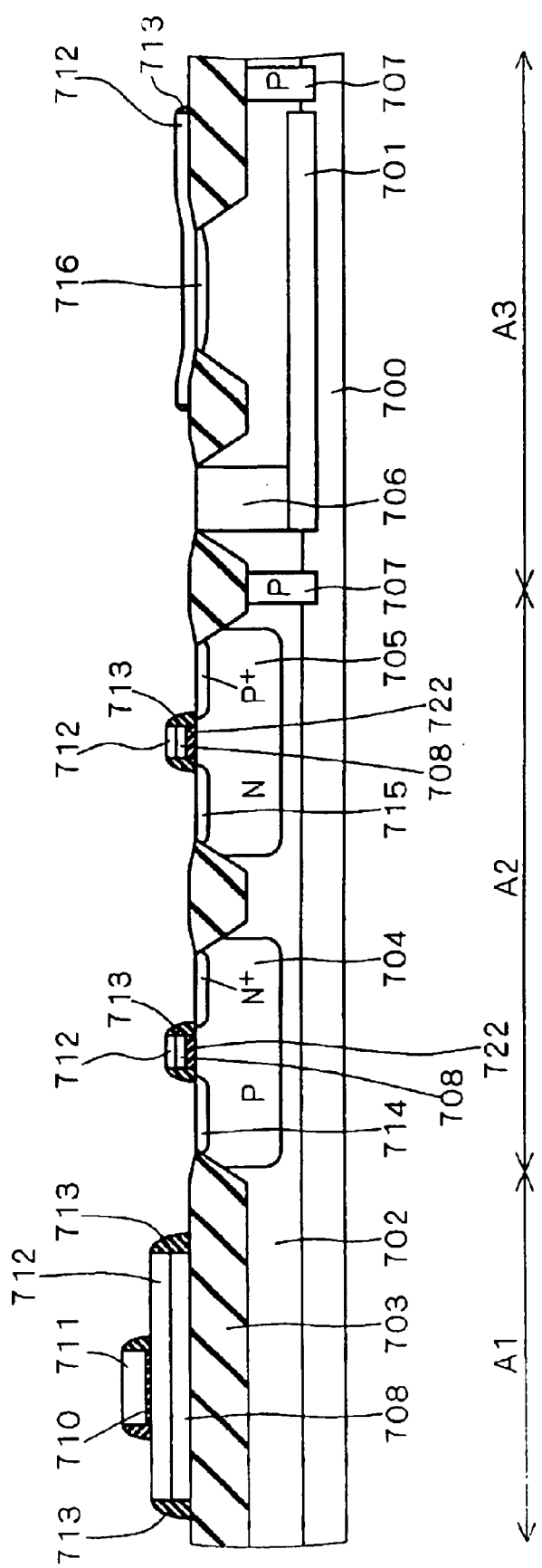

Next, as shown in FIG. 81, after having deposited frame-forming TEOS oxide film 713 over the entire surface, the entire surface is subjected to an etch back process so that frame-forming TEOS oxide film 713 is allowed to remain as side walls on the side faces of lower-layer electrode-use first polysilicon layer 708, lower-layer electrode-use second polysilicon layer 712 and upper-layer electrode polysilicon layer 711 of capacitor formation area A1, the side faces of gate oxide film 722 as well as lower-layer electrode-use first polysilicon layer 708 and lower-layer electrode-use second polysilicon layer 712 of CMOS formation area A2, and the side faces of lower-layer electrode-use second polysilicon layer 712 of bipolar transistor formation area A3.

Moreover, as shown in FIG. 81, with respect to the respective P-well region 704 and N-well region 705, impurities of N-type and P-type are injected therein by using frame-forming TEOS oxide films 713 formed on upper-electrode-use polysilicon layer 711 and the side faces thereof as masks so that $N^+$ source-drain regions 714 and $P^+$ source-drain regions 715 are respectively formed within the surface of P-well region 704 and N-well region 705.

As shown in FIG. 81, in bipolar transistor formation area A3, a diffusion process is carried out by using upper-layer electrode-use polysilicon layer 711 as a diffusion source so that base diffusion layer 716 is formed within the surface of N-type epitaxial layer 702. Here, base diffusion layer 716 may be formed by injecting P-type impurities into the surface of N-type epitaxial layer 702 through upper-layer electrode-use polysilicon layer 711.

Figure 82:
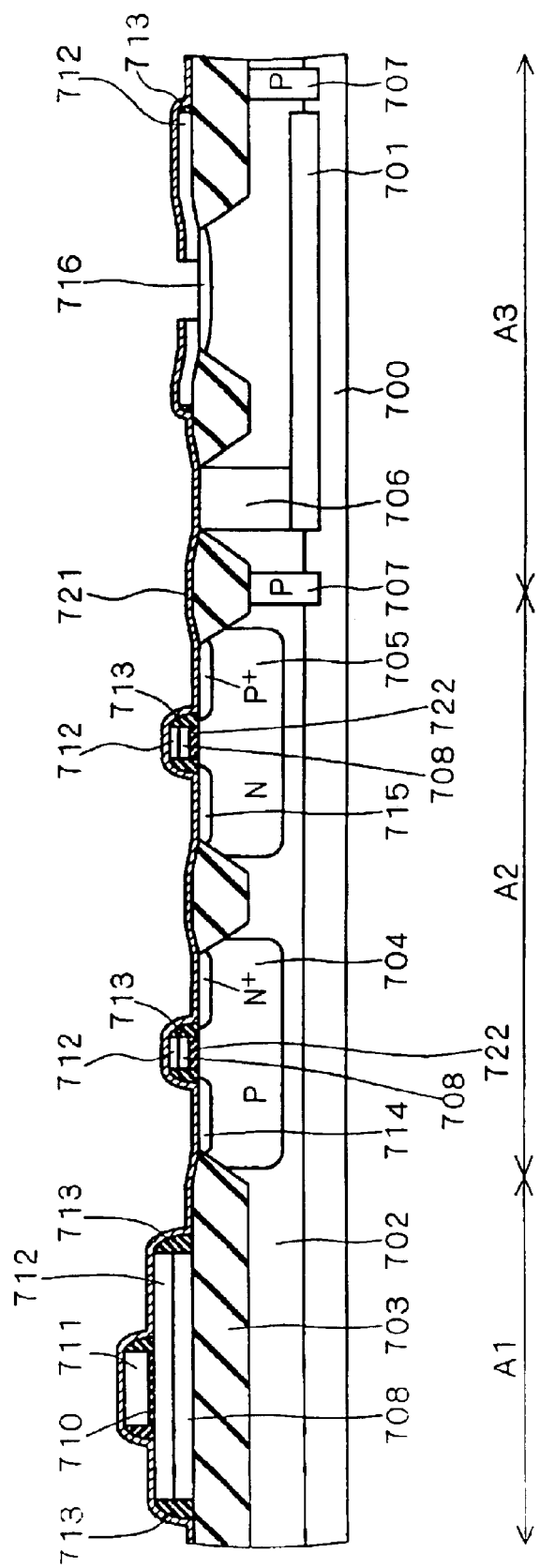

Next, as shown in FIG. 82, after TEOS oxide film 721 has been deposited over the entire surface, the TEOS oxide film 721 and lower-layer electrode-use second polysilicon layer 712, located on the center portion of base diffusion layer 716 of bipolar transistor formation area A3, are selectively removed. The residual upper-layer electrode-use second polysilicon layer 712 forms a base electrode.

Figure 83:
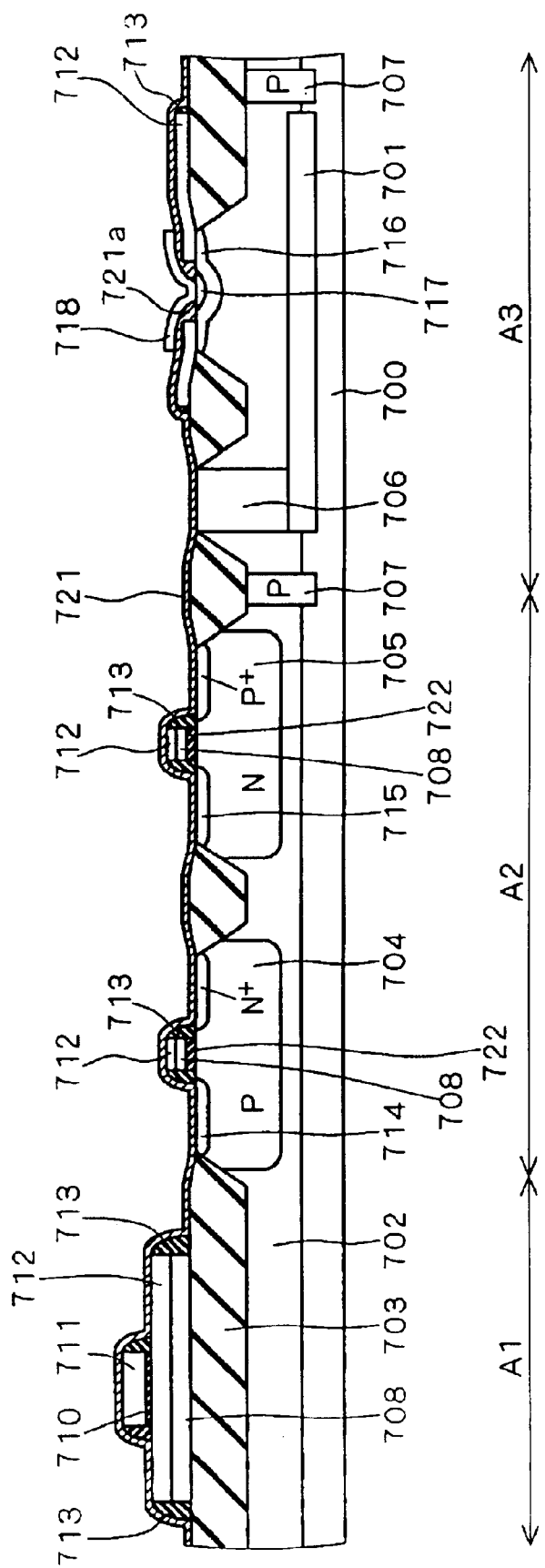

Successively, as shown in FIG. 83, a polysilicon emitter electrode 718 having doped N-type impurities is formed on the surface of base diffusion layer 716 in bipolar transistor formation area A3. In this case, prior to the formation of polysilicon emitter electrode 718, an insulating film 321a, such as a TEOS oxide film, is formed so that an insulating property between polysilicon emitter electrode 718 and lower-layer electrode-use second polysilicon layer 712 is maintained. Moreover, a diffusion process, which uses polysilicon emitter electrode 718 as a diffusion source, is carried out so that emitter diffusion layer 717 is formed on the surface of base diffusion layer 716 right under polysilicon emitter electrode 718. At this time, base diffusion layer 716 is also diffused.

Figure 84:
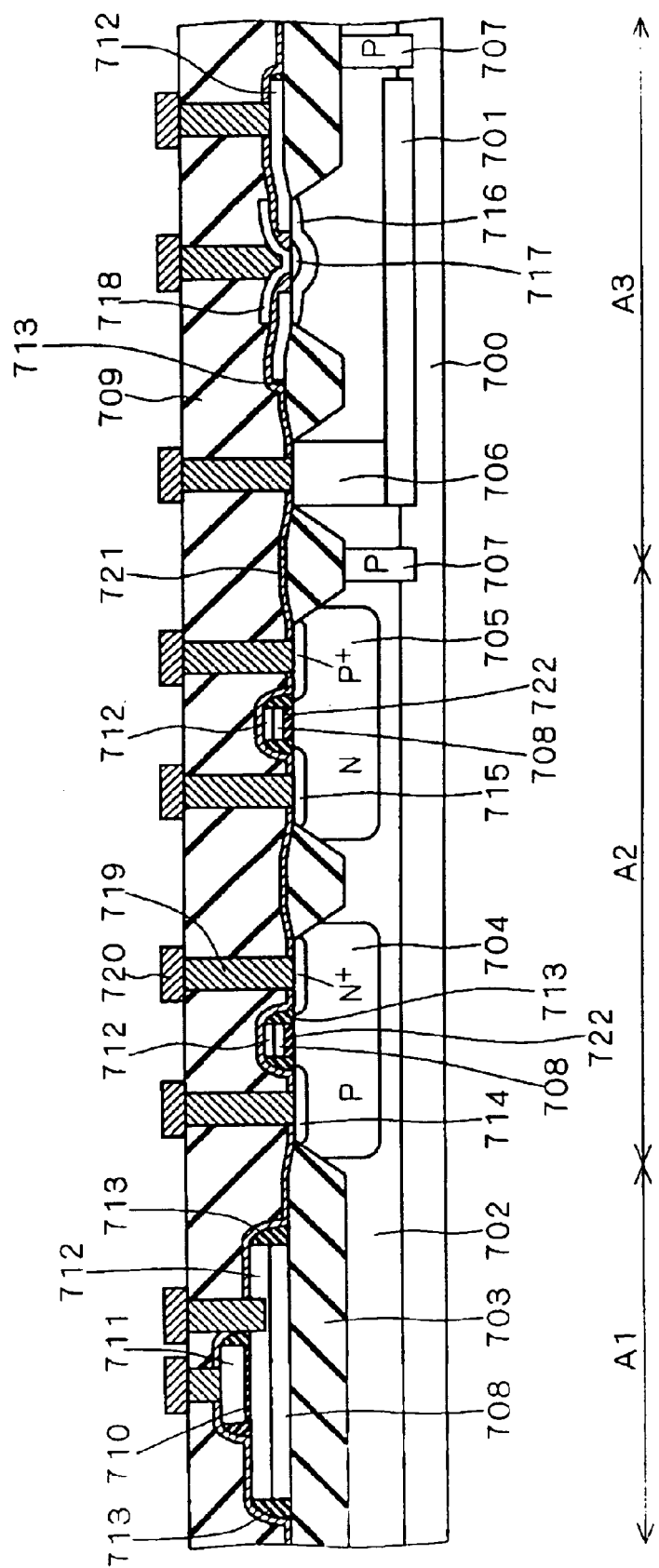

As shown in FIG. 84, contact interlayer insulating film 709 is formed on the entire surface, and after contact holes have been formed on one portion of upper-layer electrode-use polysilicon layer 711 and lower-layer electrode-use second polysilicon layer 712 of capacitor formation area A1, one portion of N$^+$ source-drain regions 714 and P$^+$ source-drain regions 715 of CMOS formation area A2, one portion of lower-layer electrode-use second polysilicon layer 712 of bipolar transistor formation area A3, one portion of collector wall 706 and one portion of polysilicon emitter electrode 718, these holes are sealed with tungsten plugs 719, and aluminum wiring 720 is formed on contact interlayer insulating film 709 in a manner so as to electrically connect to tungsten plugs 719; thus, it is possible to obtain a semiconductor device 7 shown in FIG. 72. Here, on one portion of lower-layer electrode-use second polysilicon layer 712, a contact hole that also penetrates TEOS oxide film 721 is formed.

In this manner, when compared with normal BiCMOS processes, the semiconductor device 7 of the seventh embodiment makes it possible to fabricate capacitor C7 in a BiCMOS structure by adding only the upper-layer electrode-use mask for providing the upper-layer electrode structure shown in FIG. 31 thereto.

Moreover, in the same manner as those of the first to sixth embodiments, the semiconductor device 7 of the seventh embodiment, the application of nitride film 710 as a dielectric film makes it possible to increase a capacitance value per unit area, and consequently to provide a structure that is free from voltage dependency.

As described above, semiconductor device 7 of the seventh embodiment makes it possible to provide a BiCMOS structure which increases a capacitance value per unit area while reducing the manufacturing costs to the minimum required, and is free from voltage dependency.

Moreover, in semiconductor device 7 of the seventh embodiment, the upper layer electrode of capacitor C7 can consist of the upper-layer electrode-use polysilicon layer 711 formed in a single layer structure; therefore, it becomes possible to keep step difference between the upper-layer electrode and the lower-layer electrode comparatively smaller, and consequently to make the upper-layer electrode less susceptible to the generation of residues.

In the seventh embodiment, although nitride film 710 is used as the dielectric film, any material may be used, as long as it is a dielectric material having a dielectric constant higher than that of the oxide film.

Moreover, a dielectric film having a laminated structure such as a double layer structure of $SiO_2/SiN$ or a triple layer structure of $SiO_2/SiN/SiO_2$ may be formed. When the dielectric film is formed in a laminated structure, it becomes possible to obtain improved reliability such as longer service life of the capacitor.

While the invention has been described in detail, the foregoing description is in all aspects illustrative and not restrictive. It is understood that numerous other modifications and variations can be devised without departing from the scope of the invention.

What is claimed is:

1. A manufacturing method of a semiconductor device including a capacitor and insulating gate-type transistors formed in a predetermined base substrate, comprising the steps of:

(a) preparing said predetermined base substrate having a first area for forming said capacitor and a second area for forming an insulating gate type transistor;

(b) successively depositing a lower-layer electrode-use conductive layer and a dielectric-use insulating film on said predetermined base substrate;

(c) patterning said lower-layer electrode-use conductive layer and said dielectric-use insulating film to form a lower-layer electrode and a dielectric film of said capacitor by using a lower-layer electrode-use mask;

(d) after said step (c), forming an upper-layer electrode-use conductive layer on said predetermined substrate including said first and second areas;

(e) performing a patterning process on said upper-layer electrode-use conductive layer by using an upper-layer electrode-use mask to form an upper-layer electrode of said capacitor in said first area and a gate electrode of said insulating gate type transistor in said second area, wherein said semiconductor device further includes a bipolar transistor formed in said predetermined base substrate, said predetermined base substrate further has a third area for forming a bipolar transistor, said step (d) includes a step of forming said upper-layer electrode-use conductive layer on said predetermined substrate including said first through third areas, and said step (e) further includes a step of performing a patterning process on said upper-layer electrode-use conductive layer by using said upper-layer electrode-use mask to further form said upper-layer electrode-use conductive layer on said third area as a base electrode of said bipolar transistor.

2. The manufacturing method of the semiconductor device according to claim 1, wherein said upper-layer electrode-use conductive layer includes a laminated structure of an upper-layer electrode-use first conductive layer and an upper-layer electrode-use second conductive layer, said step (d) includes the steps of:

(d-1) forming said upper-layer electrode-use first conductive layer on said predetermined substrate including said first to third areas, after step (c); and (d-2) forming said upper-layer electrode-use second conductive layer on said predetermined substrate including said first to third areas, said step (e) includes the steps of:

(e-1), prior to step (d-2) after said step (d-1), removing said upper-layer electrode-use first conductive layer in said third area; and (e-2), after said step (d-2), performing said patterning process on said upper-layer electrode-use first and second conductive layers by using said upper-layer electrode-use mask, and after said step (e), said upper-layer electrode of said capacitor and said gate electrode of said insulating gate-type transistor consist essentially of said upper-layer electrode-use first and second conductive layers, respectively, while said base electrode of said bipolar transistor consists essentially of said upper-layer electrode-use second conductive layer.

3. The manufacturing method of a semiconductor device according to claim 1, wherein said upper-layer electrode-use conductive layer includes a conductive layer formed in a single-layer structure, said manufacturing method further comprising the step of:

(f) prior to said step (d) after said step (c), selectively forming a gate electrode-use conductive layer only in said second area, wherein said step (e) further includes a step of performing a patterning process on said gate-electrode-use conductive layer and said upper-layer electrode-use conductive layer by fusing said upper-layer electrode-use mask, and after performing said step (e), said upper-layer electrode of said capacitor and said base electrode of said bipolar transistor consist essentially of said upper-layer electrode-use conductive layer, respectively, and said gate electrode of said insulating gate-type transistor consists essentially of said upper-layer electrode-use second conductive layer and said gate electrode-use conductive layer.

4. The manufacturing method of the semiconductor device according to claim 1, wherein said patterning process of the step (e) further includes a step of:

(e-3) forming said upper-layer electrode-use conductive layer as an assisting layer from a side face of said lower layer electrode of said capacitor to a portion on said dielectric film in said first area, by using said upper-layer electrode-use mask.

5. The manufacturing method of the semiconductor device according to claim 1, wherein said dielectric film-use insulating film has a dielectric constant higher than that of oxide film.

6. The manufacturing method of the semiconductor device according to claim 1, wherein said dielectric film-use insulating layer has a laminated structure.

7. A manufacturing method of a semiconductor device including a capacitor and insulating gate-type transistors formed in a predetermined base substrate, comprising the steps of:

(a) preparing said predetermined base substrate having a first area for forming said capacitor and a second area for forming an insulating gate type transistor;

(b) successively depositing a lower-layer electrode-use conductive layer and a dielectric-use insulating film on said predetermined base substrate;

(c) patterning said lower-layer electrode-use conductive layer and said dielectric-use insulating film to form a lower-layer electrode and a dielectric film of said capacitor by using a lower-layer electrode-use mask;

(d) after said step (c), forming an upper-layer electrode-use conductive layer on said predetermined substrate including said first and second areas; and (e) performing a patterning process on said upper-layer electrode-use conductive layer by using an upper-layer electrode-use mask to form an upper-layer electrode of said capacitor in said first area and a gate electrode of said insulating gate type transistor in said second area;

said semiconductor device further includes a bipolar transistor formed in said predetermined base substrate, said predetermined base substrate further has a third area for forming a bipolar transistor, said step (d) includes a step of forming said upper-layer electrode-use conductive layer on said predetermined substrate including said first through third areas, and said step (e) further includes a step of performing a patterning process on said upper-layer electrode-use conductive layer by using said upper-layer electrode-use mask to further form said upper-layer electrode-use conductive layer on said third area as a base electrode of said bipolar transistor.

* * * * *